US012704816B2

(12) United States Patent
Tsuji et al.

(10) Patent No.: US 12,704,816 B2
(45) Date of Patent: Aug. 11, 2026

(54) PHYSICAL PACKAGE FOR OPTICAL LATTICE CLOCK

(71) Applicants: JEOL Ltd., Tokyo (JP); RIKEN, Saitama (JP)

(72) Inventors: Shigenori Tsuji, Tokyo (JP); Masao Takamoto, Saitama (JP); Hidetoshi Katori, Saitama (JP)

(73) Assignees: JEOL Ltd., Tokyo (JP); RIKEN, Saitama (JP)

( * ) Notice: Subject to any disclaimer, the term of this patent is extended or adjusted under 35 U.S.C. 154(b) by 537 days.

(21) Appl. No.: 17/915,797

(22) PCT Filed: Mar. 30, 2021

(86) PCT No.: PCT/JP2021/013476

§ 371 (c)(1),
(2) Date: Sep. 29, 2022

(87) PCT Pub. No.: WO2021/200909

PCT Pub. Date: Oct. 7, 2021

(65) Prior Publication Data

US 2023/0229115 A1 Jul. 20, 2023

(30) Foreign Application Priority Data

Mar. 31, 2020 (JP) ................................ 2020-065317

(51) Int. Cl.
*G04F 5/14* (2006.01)
*G02F 1/09* (2006.01)
(Continued)

(52) U.S. Cl.
CPC .................. *G04F 5/14* (2013.01); *G02F 1/09* (2013.01); *H01J 37/16* (2013.01); *H01S 1/06* (2013.01); *H01J 2237/18* (2013.01)

(58) Field of Classification Search
None
See application file for complete search history.

(56) References Cited

U.S. PATENT DOCUMENTS 5,343,151 A 8/1994 Cory et al.
5,661,401 A 8/1997 Ishikawa et al.
(Continued)

FOREIGN PATENT DOCUMENTS

CN 1991558 A 7/2007
CN 102356330 A 2/2012
(Continued)

OTHER PUBLICATIONS

Lyndsie Laura Smith, A Transportable Strontium Optical Lattice Clock Towards Space, Aug. 2016 (Year: 2016).*
(Continued)

*Primary Examiner* — David E Smith
*Assistant Examiner* — Alina Kaliszewski
(74) *Attorney, Agent, or Firm* — The Webb Law Firm

(57) ABSTRACT

A physical package is provided with: a MOT device; an optical chamber which constitutes an optical lattice formation portion; and a vacuum chamber which surrounds these components and has a substantially cylindrical shape. The MOT device is arranged along the beam axis of an atomic beam and traps an atom cluster. The optical lattice formation portion uses optical lattice light that enters therein to form an optical lattice in a cavity, confines the atom cluster trapped by the MOT device in the optical lattice, and transfers, along the X-axis which is a movement axis perpendicular to the beam axis, the atom cluster to a clock transition space which facilitates clock transition. The central axis of the cylinder of the main body of the vacuum chamber passes through the clock transition space, and is set to be substantially parallel with the beam axis.

5 Claims, 39 Drawing Sheets

(51) Int. Cl.
*H01J 37/16* (2006.01)
*H01S 1/06* (2006.01)

(56) References Cited

U.S. PATENT DOCUMENTS

| | | | | |
|---|---|---|---|---|
| 6,303,928 | B1 * | 10/2001 | Buell | B82Y 15/00 250/251 |
| 6,570,459 | B1 * | 5/2003 | Nathanson | G04F 5/14 331/94.1 |
| 7,379,486 | B2 * | 5/2008 | Lust | G04F 5/145 372/71 |
| 7,468,637 | B2 * | 12/2008 | Braun | G04F 5/14 331/3 |
| 7,965,147 | B2 * | 6/2011 | Strabley | G04F 5/14 250/251 |
| 8,079,763 | B2 | 12/2011 | Benabid | |
| 9,553,597 | B2 | 1/2017 | Katori | |
| 9,964,609 | B2 | 5/2018 | Ichihara et al. | |
| 10,983,177 | B2 | 4/2021 | Jimenez-Martinez et al. | |
| 2007/0145348 | A1 | 6/2007 | Ichimura et al. | |
| 2009/0009165 | A1 | 1/2009 | Ichimura et al. | |
| 2010/0315173 | A1 | 12/2010 | Le Prado et al. | |
| 2012/0098541 | A1 | 4/2012 | Konijn et al. | |
| 2013/0271145 | A1 | 10/2013 | Hwang et al. | |
| 2013/0320231 | A1 * | 12/2013 | Schober | G02B 27/00 250/428 |
| 2015/0022816 | A1 * | 1/2015 | Schober | G01N 21/59 29/592.1 |
| 2015/0194972 | A1 * | 7/2015 | Katori | H01S 3/06791 331/94.1 |
| 2016/0061913 | A1 | 3/2016 | Kobayashi et al. | |
| 2016/0116553 | A1 | 4/2016 | Kim et al. | |
| 2018/0011449 | A1 | 1/2018 | Katori | |
| 2019/0227496 | A1 | 7/2019 | Katori et al. | |
| 2020/0116623 | A1 * | 4/2020 | Cooper-Roy | G01N 21/6404 |
| 2021/0232101 | A1 * | 7/2021 | Dupont-Nivet | G21K 1/006 |
| 2022/0330869 | A1 | 10/2022 | Yu et al. | |
| 2023/0185247 | A1 * | 6/2023 | Chang | H03L 7/26 331/94.1 |

FOREIGN PATENT DOCUMENTS

| | | | | | |
|---|---|---|---|---|---|
| CN | 104134511 | A | | 11/2014 | |
| CN | 106772134 | A | | 5/2017 | |
| CN | 106803476 | A | | 6/2017 | |
| CN | 104819712 | B | | 3/2018 | |
| CN | 108333909 | A | * | 7/2018 | G04F 5/14 |
| CN | 109243751 | A | | 1/2019 | |
| CN | 110148484 | A | * | 8/2019 | G21K 1/30 |
| CN | 110888175 | A | | 3/2020 | |
| EP | 2409170 | B1 | | 8/2019 | |
| JP | 3083475 | B2 | | 6/2000 | |
| JP | 6206973 | B2 | | 10/2017 | |
| JP | 2018510494 | A | | 4/2018 | |
| JP | 2019129166 | A | | 8/2019 | |
| RU | 2716825 | C1 | | 3/2020 | |

OTHER PUBLICATIONS

English machine translation for CN-108333909-A (Year: 2018).*
English machine translation for CN-110148484-A (Year: 2019).*
International Preliminary Report on Patentability (PCT-IB326) issued in PCT/JP2021/013475 on Oct. 13, 2022.
International Preliminary Report on Patentability (PCT-IB338) issued in PCT/JP2021/013475 on Oct. 13, 2022.
Fang et al., "In situ triaxial magnetic field compensation for the spin-exchange-relaxation-free atomic magnetometer", Review of Scientific Instruments, 2012, vol. 83: 103104.
International Preliminary Report on Patentability (PCT-IB326) issued in PCT/JP2021/013473 on Oct. 13, 2022.
International Preliminary Report on Patentability (PCT-IB338) issued in PCT/JP2021/013473 on Oct. 13, 2022.
International Preliminary Report on Patentability (PCT-IB326) issued in PCT/JP2021/013474 on Oct. 13, 2022.
International Preliminary Report on Patentability (PCT-IB338) issued in PCT/JP2021/013474 on Oct. 13, 2022.
International Preliminary Report on Patentability (PCT-IB326) issued in PCT/JP2021/013476 on Oct. 13, 2022.
International Preliminary Report on Patentability (PCT-IB338) issued in PCT/JP2021/013476 on Oct. 13, 2022.
Office Action issued in RU2022126344/28 on Aug. 20, 2024.
Office Action issued in RU2022126345/28 on Aug. 20, 2024.
Office Action issued in RU2022126348/28 on Aug. 20, 2024.
Extended European Search Report issued in EP21780468.1 on Mar. 13, 2024.
Extended European Search Report issued in EP21778910.6 on Mar. 12, 2024.
Extended European Search Report issued in EP21779888.3 on Mar. 26, 2024.
Extended European Search Report issued in EP21778956.9 on Mar. 14, 2024.
Middelmann et al., Long-range transport of ultracold atoms in a far-detuned one-dimensional optical lattice, New Journal of Physics, vol. 14, 2012, pp. 1-13.
Schrader et al., An optical conveyor belt for single neutral atoms, Arxiv,org, Cornell University Library, Jul. 5, 2001, pp. 1-8.
Bloom et al., An optical lattice clock with accuracy and stability at the 10-71-18 level, Nature, vol. 506, Feb. 6, 2014, pp. 71-77.
Lyndsie Laura Smith, A Transportable Strontium Optical Lattice Clock Towards Space, XP93137355, retrieved from the Internet: https://etheses.bham.ac.uk/id/eprint/7132/1/Smith16Phd.pdf, Aug. 2016, pp. 1-207.
Vogt et al., A transportable optical lattice clock, Journal of Physics: Conference Series vol. 723, No. 012020, 2016, pp. 1-8.
Koller et al., Transportable Optical Lattice Clock with 7x10-17 Uncertainty, Physical Review Letters, vol. 118, No. 073601, 2017, pp. 1-6.
Bowden et al., A pyramid MOT with integrated optical cavities as a cold atom platform for an optical lattice clock, Scientific Reports, Aug. 18, 2019, vol. 9, No. 11704, pp. 1-9.
Origlia et al., Towards an optical clock for space: Compact, high-performance optical clock based on bosonic atoms, Physical Review A, vol. 98, No. 053443, 2018, pp. 1-11.
Poli et al., Propsect for a company strontium optical lattice clock, Proceedings of SPIE, vol. 6673, No. 66730F, 2007, pp. 1-11.
Office Action issued in CN202180026928.5 on May 30, 2025.
Office Action issued in CN202180026909.2 (corresponds to related U.S. Appl. No. 17/915,745) on Dec. 19, 2025.
Office Action issued in CN202180026928.5 (corresponds to related U.S. Appl. No. 17/915,720) on Dec. 22, 2025.
Office Action issued in CN202180026909.2 on Jul. 11, 2025.
Bonetto et al., Saddle Coils for Uniform Static Magnetic Field Generation in NMR Experiments, Concepts in Magnetic Resonance Part B (Magnetic Resonance Engineering) vol. 29B(1), 2006, pp. 9-19.
Office Action issued in CN202180026928.5 on Apr. 16, 2026.

* cited by examiner

PHYSICAL PACKAGE FOR OPTICAL LATTICE CLOCK

CROSS-REFERENCE TO RELATED APPLICATIONS

This application is the United States national phase of International Application No. PCT/JP2021/013476 filed Mar. 30, 2021, and claims priority to Japanese Patent Application No. 2020-065317 filed Mar. 31, 2020, the disclosures of which are hereby incorporated by reference in their entirety.

BACKGROUND OF THE INVENTION

Field of the Invention

The present invention relates to a physics package for an optical lattice clock.

Description of Related Art

Optical lattice clocks are atomic clocks proposed by KATORI Hidetoshi, who is one of the inventors of the present application. An optical lattice clock confines an atom population in an optical lattice formed by laser light, and measures the resonant frequency in a visible light range. Accordingly, an optical lattice clock can achieve 18-digit accuracy measurement, which greatly surpasses the accuracies of current cesium clocks. Optical lattice clocks have been eagerly researched and developed not only by the group including the inventors but also by various groups inside and outside of Japan, and have been developed as next-generation atomic clocks.

The latest technology of optical lattice clocks is described in the following Patent Documents 1 to 3, for example. Patent Document 1 describes that a one-dimensional moving optical lattice is formed in an optical waveguide having a hollow pathway. Patent Document 2 describes an aspect of setting an effective magic frequency. Patent Document 3 describes radiation shielding that reduces adverse effects of blackbody radiation emitted from surrounding walls.

The optical lattice clock measures time with high accuracy. Accordingly, the optical lattice clock can detect an elevation difference of 1 cm on the Earth based on the general relativistic effect due to the gravity, as a deviation in temporal progress. Accordingly, making the optical lattice clock transportable and usable in a field outside of a laboratory would enable applicability to new geodetic technologies, such as underground resource exploration, and detection of underground cavities and magma chambers. Optical lattice clocks are mass-produced, and installed at many locations, and temporal variation in gravitational potential is continuously monitored, which enables applications that include detection of diastrophism, and spatial mapping of the gravitational field. Thus, optical lattice clocks are expected to contribute to society as a new fundamental technology beyond the bounds of highly accurate time measurement.

The following Non Patent Documents 1 to 5 describe attempts to make optical lattice clocks transportable. For example, Non Patent Document 4 describes a physics package of an optical lattice clock stored in a frame having a length of 99 cm, a width of 60 cm, and a height of 45 cm. In the physics package, an atomic oven, a Zeeman slower, and a vacuum chamber are arranged sequentially in the length direction. Outside of the vacuum chamber there are arranged a pair of square magnetic field correction coils measuring about 30 to 40 cm on a side, for each of three axes that are in the length direction, the width direction, and the height direction. For the sake of clock transition spectroscopy of atoms in a zero magnetic field, the magnetic field correction coils are used to compensate the magnetic field distribution in an area around the atoms during spectrometry.

CITATION LIST

Patent Literature

Patent Document 1: JP 6206973 B
Patent Document 2: JP 2018-510494 A
Patent Document 3: JP 2019-129166 A

Non Patent Literature

Non Patent Document 3: Stefan Vogt et al. "A Transportable Optical Lattice Clock" Journal of Physics: Conference Series 723 012020, 2016
Non Patent Document 4: S. B. Koller et al. "Transportable Optical Lattice Clock with 7×10-17 Uncertainty" Physical review letters 118 073601, 2017
Non Patent Document 5: William Bowden et al. "A Pyramid MOT with Integrated Optical Cavities as a Cold Atom Platform for an Optical Lattice Clock" Scientific Reports 9 11704, 2019
Non Patent Document 6: S. Origlia et al. "Towards an Optical Clock for Space: Compact, High-Performance Optical Lattice Clock Based on Bosonic Atoms" Physical Review A 98, 053443, 2018
Non Patent Document 7: N. Poli et al. "Prospect for a Compact Strontium Optical Lattice Clock" Proceedings of SPIE 6673, 2007

The optical lattice clocks described in the aforementioned Non Patent Documents 3 to 7 leave room for improved miniaturization and transportability, facilitated transportation, installation, and the like, and improved utilization.

For the conventional optical lattice clock, miniaturization or transportability of the physics package has been advanced by facilitating miniaturization of devices or components based on the structure of a large-scale optical lattice clock used in a laboratory. Accordingly, in the physics package, many axes, such as of an atom beam, laser light, and magnetic fields, are arranged in a complicated manner in a space for capturing atoms or a clock transition space for prompting atoms to cause clock transition. It is thus difficult to integrate required devices or components.

SUMMARY OF THE INVENTION

A purpose of the present invention is to achieve a physics package of an optical lattice clock that has a structure enabling miniaturization or transportability.

A physics package for an optical lattice clock according to the present invention includes: a MOT (Magneto-Optical Trap) device that is arranged along a beam axis of an atom beam, and captures an atom population; an optical lattice formation portion that forms an optical lattice using incident optical lattice light, confines the atom population captured by the MOT device in the optical lattice, and moves the atom population to a clock transition space for prompting clock transition along a movement axis perpendicular to the beam axis; and a vacuum chamber that includes a substantially prism-shaped main body that encloses the MOT device and the optical lattice formation portion, wherein a central axis of the vacuum chamber passes through the clock transition space, and is configured substantially parallel with the beam axis.

According to an aspect of the present invention, the vacuum chamber includes a protruding portion that protrudes from the main body along the beam axis, the physics package further includes a slower that decelerates the atom population, on an upstream side of the MOT device on the beam axis, and the slower is arranged astride the main body and the protruding portion.

According to an aspect of the present invention, in the MOT device, MOT light is emitted in both directions of each of three axes that include the beam axis and two axes that are perpendicular to the beam axis and are different from the movement axis.

According to an aspect of the present invention, at the slower, deceleration light is emitted upstream along the beam axis, and the main body includes: a pair of first vacuum-resistant optical windows that allow passage of the MOT light and the deceleration light along the beam axis; and a pair of second vacuum-resistant optical windows that allow passage of the MOT light along the two axes.

An aspect of the present invention further includes a vacuum pump cartridge that vacuumizes the vacuum chamber, wherein the vacuum pump cartridge is arranged in the main body so as to be lined up with the slower but is decentered in a direction different from a direction of the slower.

According to an aspect of the present invention, the substantially prism-shaped main body is formed to have a substantially quadrilateral prism shape, a substantially hexagonal prism shape, a substantially octagonal prism shape, or a substantially cylindrical shape.

According to the present invention, the physics package is formed to have a structure enabling integration of components and the like, which can make the physics package miniaturized or transportable.

DESCRIPTION OF THE INVENTION

(1) Schematic Configuration of Physics Package

Figure 1:
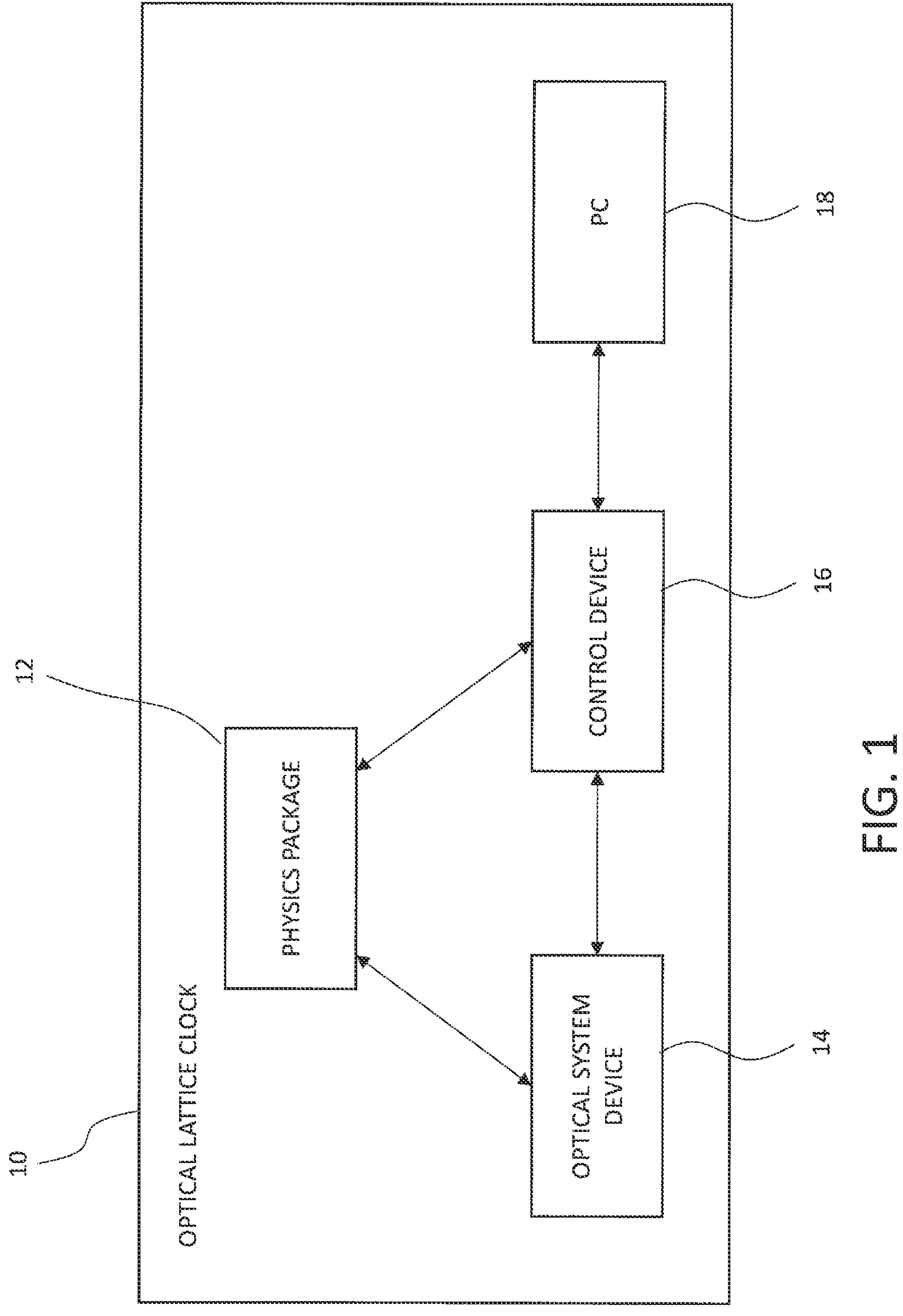
FIG. 1 schematically shows the overall configuration of an optical lattice clock according to an embodiment.

FIG. 1 schematically shows an overall configuration of an optical lattice clock 10. The optical lattice clock includes a physics package 12, an optical system device 14, a control device 16, and a PC (Personal Computer) 18, which are combined with each other.

As described in detailed next, the physics package 12 is a device that captures an atom population, confines them in an optical lattice, and causes clock transitions. The optical system device 14 is a device that includes optical devices, such as a laser emission device, a laser receiver device, and a laser spectrometer. The optical system device 14 not only emits a laser and transmits the laser to the physics package 12, but also performs processes of receiving light emitted by clock transitions of the atom population in the physics package 12, converting it into an electric signal, and dividing the signal into frequency bands. The control device 16 is a device that controls the physics package 12 and the optical system device 14. The control device 16 is a computer that is dedicated to the optical lattice clock 10, and is operated by software controlling computer hardware including processors and memories. For example, the control device 16 performs not only operation control of the physics package 12 and operation control of the optical system device 14, but also analysis processes, such as frequency analysis of clock transition obtained by measurement. The physics package 12, the optical system device 14, and the control device 16 mutually, closely cooperate with each other and form the optical lattice clock 10.

The PC 18 is a general-purpose computer, and is operated by software controlling computer hardware including processors and memories. An application program for controlling the optical lattice clock 10 is installed in the PC 18. The PC 18 is connected to the control device 16, and not only controls the control device 16, but also entirely controls the optical lattice clock 10, which includes the physics package 12 and the optical system device 14. The PC 18 serves as a UI (User Interface) of the optical lattice clock 10. A user can activate the optical lattice clock 10, and perform time measurement and verification of results, through the PC 18. In this embodiment, description is given mainly on the physics package 12. Note that the physics package 12 and included components required to control this package are sometimes collectively called a physics package system. The components required for control are included in the control device 16 or the PC 18 in some cases, and are included in the physics package 12 itself.

Figure 2:
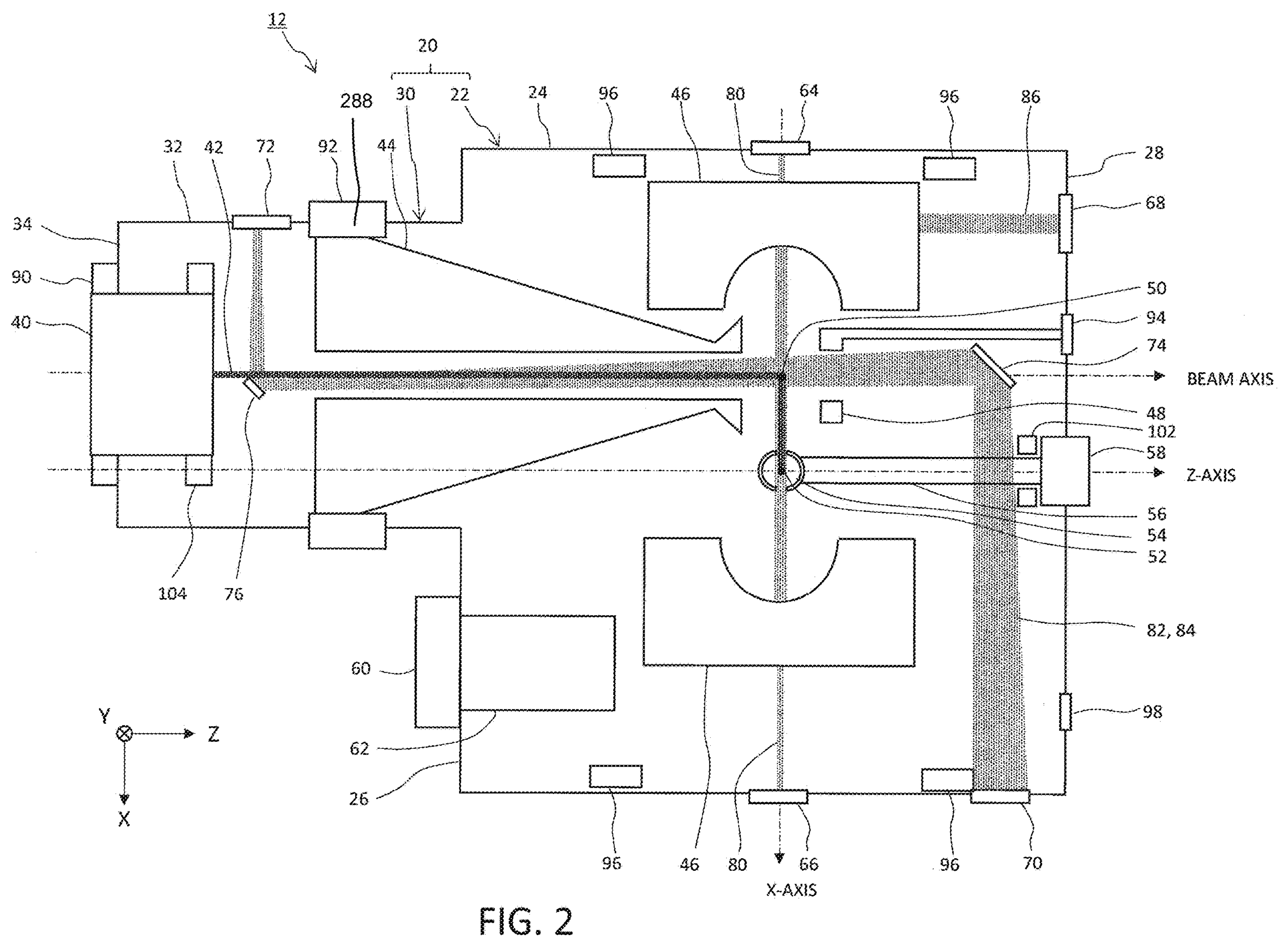
FIG. 2 shows a schematic configuration of a physics package of the optical lattice clock.
Figure 3:
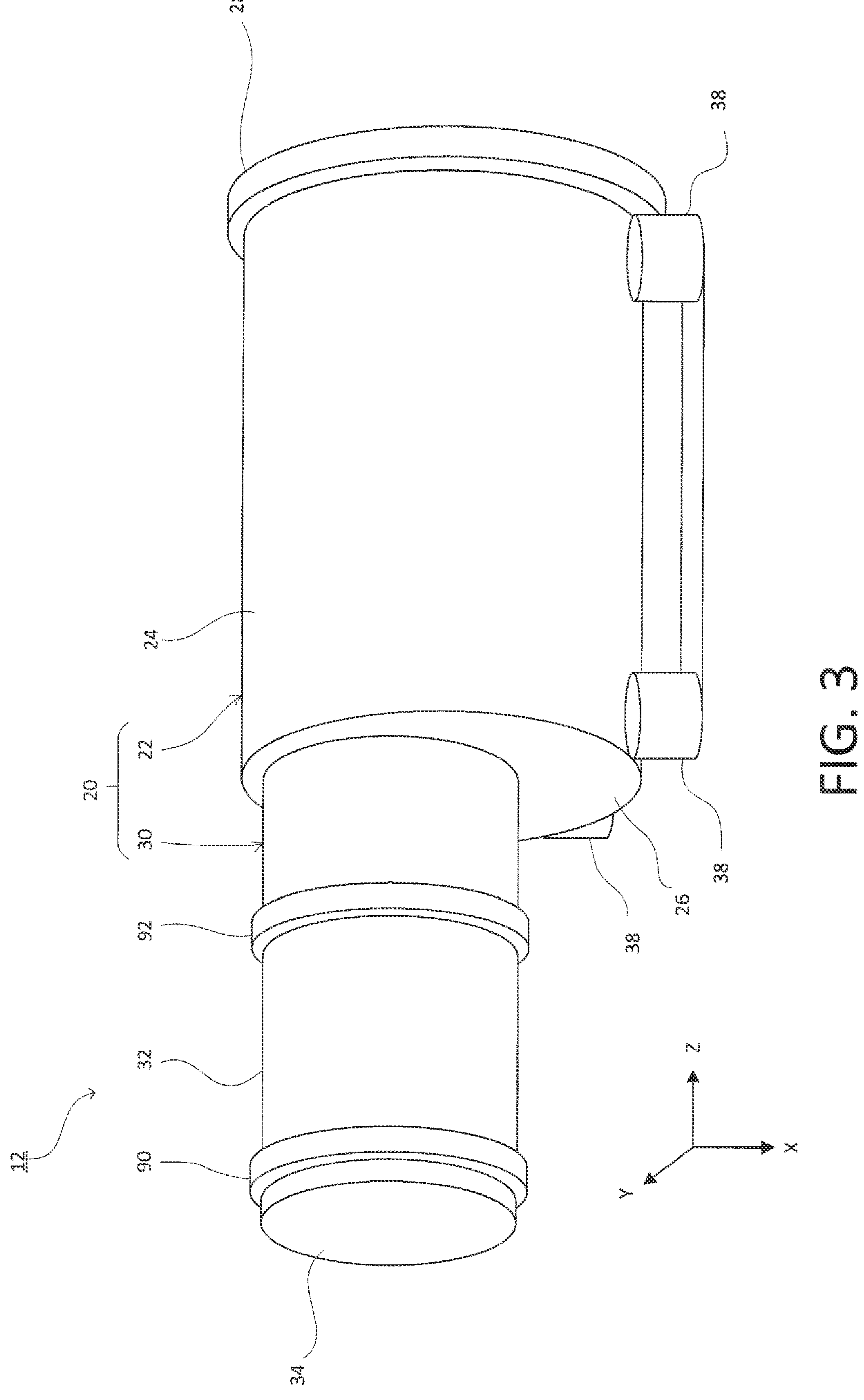
FIG. 3 schematically shows the appearance of the physics package.
Figure 4:
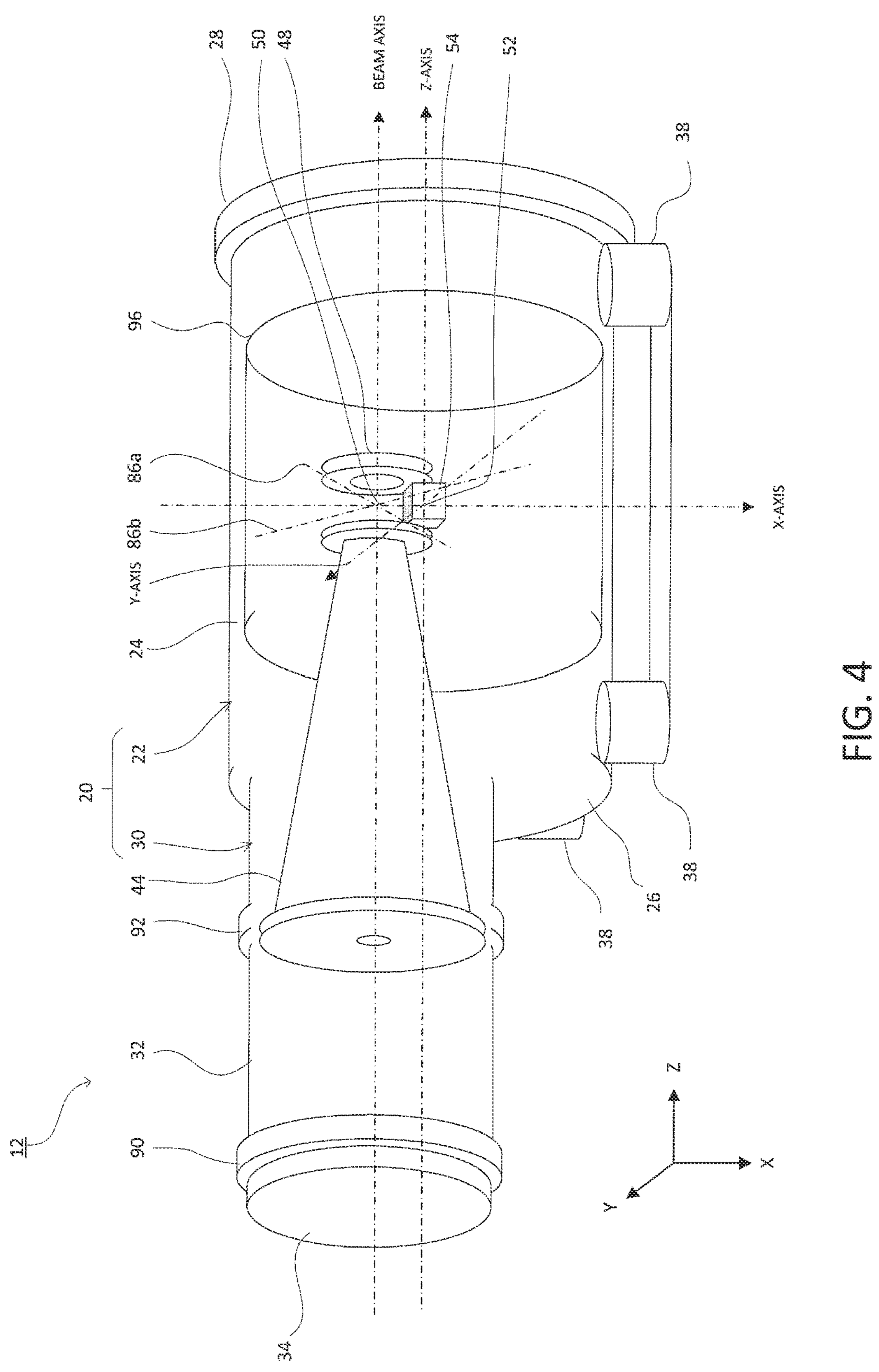
FIG. 4 is a partially perspective view of the inside of the physics package shown in FIG. 3.

FIG. 2 schematically shows the physics package 12 of the optical lattice clock according to the embodiment. FIG. 3 schematically shows an example of the appearance of the physics package 12. FIG. 4 is a partially perspective view of the internal structure of the physics package 12 shown in FIG. 3. FIGS. 2 to 4 (and the diagrams thereafter) show an XYZ orthogonal rectilinear coordinate system having an origin in a target space (clock transition space 52) where atoms to be described later can reside during clock transition spectroscopy.

The physics package 12 includes a vacuum chamber 20, an atomic oven 40, a coil 44 for a Zeeman slower, an optical resonator 46, a coil 48 for a MOT (Magneto-Optical Trap) device, a cryostat reservoir 54, a thermal link member 56, a refrigerator 58, a vacuum pump main body 60, and a vacuum pump cartridge 62.

The vacuum chamber 20 is a case that maintains the main portion of the physics package 12 to be vacuum, and is formed to have a substantially cylindrical shape. In particular, the vacuum chamber 20 includes a main body 22 formed to have a large substantially cylindrical shape, and a protruding portion 30 formed to have a small substantially cylindrical shape that protrudes from the main body 22. The main body 22 is a portion that internally stores the optical resonator 46 to be described later and the like. The main body 22 includes a cylindrical wall 24 that serves as a side surface of the cylinder, and a front circular wall 26 and a rear circular wall 28 which serve as circular surfaces of the cylinder. The front circular wall 26 is a wall provided with the protrusion 30. The rear circular wall 28 is a wall opposite to the protruding portion 30, and has a shape with a diameter larger than that of the cylindrical wall 24.

The protruding portion 30 includes a cylindrical wall 32 serving as a side surface of the cylinder, and a front circular wall 34. The front circular wall 34 is a circular surface remote from the main body 22. A portion of the protruding portion 30 adjacent to the main body 22 has an almost open shape, is connected to the main body 22, and has no wall portion.

The vacuum chamber 20 is arranged so that the central axis (this axis is called a Z-axis) of the cylinder of the main body 22 is substantially horizontal. The central axis (this axis serves as a beam axis) of the cylinder of the protruding portion 30 extends in parallel with the Z-axis above the Z-axis in the vertically upward direction.

The vacuum chamber 20 is assumed to be formed to be, for example, about 35 cm or less in the Z-axis direction, and about 20 cm or less in the X-axis direction and the Y-axis direction. Further miniaturization is also assumed so as to be about 30 cm or less, about 25 cm or less, or about 20 cm or less in the Z-axis direction. Also in the X-axis direction and the Y direction, it is assumed to be about 15 cm or less, or about 10 cm or less. The distance between the beam axis and the Z-axis is configured to be, for example, about 10 to 20 mm.

In the embodiment, four legs 38 are provided around the four corners at the lower portion of the main body 22 of the vacuum chamber 20, and support the vacuum chamber 20. The vacuum chamber 20 is made sufficiently robust from metal, such as SUS (stainless steel), so as to withstand difference in air pressure when the inside becomes vacuum. The vacuum chamber 20 is formed so that the rear circular wall 28 and the front circular wall 34 are detachable. These walls are detached at maintenance check.

The atomic oven 40 is a device provided around the distal end of the protruding portion 30. The atomic oven 40 causes a heater to heat an arranged solid metal, emits, through a pore, atoms ejected from the metal owing to thermal agitation, and forms an atom beam 42. The beam axis on which the atom beam 42 passed is configured in parallel with the Z-axis, and is configured to intersect with the X-axis at a position slightly apart from the origin. The intersecting position corresponds to a capture space 50 that is a minute space where atoms to be described later are captured. The atomic oven 40 is basically provided in the vacuum chamber 20. However, its heat radiator extends to the outside of the vacuum chamber 20 for cooling. The atomic oven 40 heats the metal to about 750K, for example. As the metal, for example, any of strontium, mercury, cadmium, ytterbium, and the like may be selected. However, the metal is not limited thereto.

The coil 44 for the Zeeman slower is arranged on the downstream side of the beam axis of the atomic oven 40, from the protruding portion 30 to the main body 22 of the vacuum chamber 20. The coil 44 for the Zeeman slower is a device made by integrally including a Zeeman slower that decelerates the atoms of the atom beam 42, and a MOT device that captures the decelerated atoms. Both the Zeeman slower and the MOT device are devices based on an atomic laser cooling technology. The coil 44 for the Zeeman slower shown in FIG. 2 is provided with a Zeeman coil used for the Zeeman slower, and one of the pair of MOT coils used for the MOT device, as a series of coils. Although clear classification cannot be made, the large portion from the upstream to the downstream corresponds to the Zeeman coil that generates a magnetic field contributing to the Zeeman slowing method, and the furthest downstream side corresponds to the MOT coil that generates a gradient magnetic field contributing to the MOT method.

In the illustrated example, the Zeeman coil is of a decreasing type that has a greater number of turns on the upstream side and a smaller number of turns on the downstream side. The coil 44 for the Zeeman slower is axisymmetrically arranged around the beam axis so that the atom beam 42 passes through the inside of the Zeeman coil and the MOT coil. In the Zeeman coil, a magnetic field caused to have a spatial gradient is formed, and emission of a Zeeman slower optical beam 82 decelerates atoms.

The optical resonator 46 is a cylindrical component arranged around the Z-axis, and enables formation of an optical lattice therein. Multiple optical components are installed in the optical resonator 46. One pair of optical mirrors on the X-axis, and another pair of optical mirrors in parallel therewith are provided, and optical lattice light is multiply reflected between the four mirrors, thus generating a bow-tie-shaped optical lattice resonator. The atom population captured in the capture space 50 is confined in the optical lattice. The relative frequencies of two optical lattice light beams (clockwise and counterclockwise) caused to enter the optical resonator 46 are shifted, and this resonator forms a moving optical lattice that causes the standing wave of the optical lattice to move. The moving optical lattice moves the atom population to the clock transition space 52. In the embodiment, an optical lattice including the moving optical lattice is configured to be formed on the X-axis. Note that there may be adopted a two-dimensional or three-dimensional optical lattice with a lattice arranged not only on the X-axis but also on one or both of the Y-axis and the Z-axis. Thus, the optical resonator 46 can be called an optical lattice formation portion forming an optical lattice. The optical resonator 46 is also a device based on the atomic laser cooling technology.

The coil 48 for the MOT device generates a gradient magnetic field for the capture space 50. The MOT device emits MOT light beams respectively along three, or X, Y, and Z, axes in a space where the gradient magnetic field is formed. Accordingly, the MOT device captures atoms in the capture space 50. The capture space 50 is configured on the X-axis. The coil 44 for the Zeeman slower shown in FIG. 2 is provided with a Zeeman coil used for the Zeeman slower, and one of the pair of MOT coils used for the MOT device, as a series of coils. In this diagram, the gradient magnetic field that contributes to the MOT method is generated integrally by the coil 48 for the MOT device and a portion of the coil 44 for the Zeeman slower.

The cryostat reservoir 54 is formed so as to enclose the clock transition space 52, and keep the inner space at a low temperature. Accordingly, in an inner space, blackbody radiation decreases. The thermal link member 56 also serving as a support structure is attached to the cryostat reservoir 54. The thermal link member 56 transfers heat from the cryostat reservoir 54 to the refrigerator 58. The refrigerator 58 keeps the cryostat reservoir 54 at a low temperature via the thermal link member 56. The refrigerator 58 includes a Peltier element, and cools the cryostat reservoir 54 to about 190K, for example.

The vacuum pump main body 60 and the vacuum pump cartridge 62 are devices for vacuumizing the vacuum chamber 20 . . . . The vacuum pump main body 60 is provided outside of the vacuum chamber 20. The vacuum pump cartridge 62 is provided in the vacuum chamber 20. At start of activation, the vacuum pump cartridge 62 is heated by a heater provided at the vacuum pump main body 60 and is activated. Accordingly, the vacuum pump cartridge 62 is activated, and absorbs atoms, thus achieving a vacuum.

The vacuum pump cartridge 62 is installed in the main body 22 so as to be in parallel with the coil 44 for the Zeeman slower. The coil 44 for the Zeeman slower is arranged along the beam axis decentered in the X-axis direction from the central axis of the cylinder of the main body 22. Accordingly, there is a relatively large space on the opposite side away from the direction in which the coil 44 for the Zeeman slower is eccentrically arranged. The vacuum pump cartridge 62 is installed in this space.

The physics package 12 includes, as components of the optical system: vacuum-resistant optical windows 64 and 66 for optical lattice light; a vacuum-resistant optical window 68 for MOT light; vacuum-resistant optical windows 70 and 72 for Zeeman slower light and MOT light; and optical mirrors 74 and 76.

The vacuum-resistant optical windows 64 and 66 for optical lattice are vacuum-resistant optical windows provided on opposite cylindrical walls 24 of the main body 22 of the vacuum chamber 20 so as to face each other. The vacuum-resistant optical window 64 and 66 for optical lattice light are provided so as to enable entry and emission therethrough of optical lattice light.

The vacuum-resistant optical window 68 for MOT light is provided so as to enable entry and emission therethrough of MOT light beams on two axes, among MOT light beams on the three axes used for the MOT device.

The vacuum-resistant optical windows 70 and 72 for Zeeman slower light and MOT light are provided so as to enable entry and emission therethrough of Zeeman slower light and MOT light on one axis.

The optical mirrors 74 and 76 are provided so as to change the directions of the Zeeman slower light and the MOT light on the one axis.

The physics package includes, as components for cooling: a cooler 90 for an atomic oven; a cooler 92 for a Zeeman slower; and a cooler 94 for a MOT device.

The cooler 90 for the atomic oven is a water-cooling device that cools the atomic oven 40. The cooler 90 for the atomic oven is provided outside of the vacuum chamber 20, and cools a radiator of the atomic oven 40, the radiator extending outside of the vacuum chamber 20. The cooler 90 for the atomic oven includes a water-cooling tube that is a tube made of metal and is for cooling, and causes flow of cooling water, which is a liquid coolant, in the tube, thus cooling the vacuum chamber 20.

The cooler 92 for the Zeeman slower is a device that is provided on the wall portion of the vacuum chamber 20, and cools the coil 44 for the Zeeman slower. The cooler 92 for the Zeeman slower includes a tube made of a metal, and flows cooling water in the tube, thus removing Joule heat generated at the coil of the coil 44 for the Zeeman slower.

The cooler 94 for the MOT device is a heat radiator provided on the circular wall portion of the vacuum chamber 20. At the coil 48 for the MOT device, Joule heat is generated at the coil, although the amount of Joule heat is smaller (e.g., about 1/10) than that of the cooler 92 for the Zeeman slower. Accordingly, the metal of the cooler 94 for the MOT device extends to the outside of the vacuum chamber 20 from the coil 48 for the MOT device, and radiates heat to the atmosphere.

The physics package 12 further includes, as components for correcting a magnetic field: a triaxial magnetic field correction coil 96; a vacuum-resistant electric connector 98; an individual magnetic field compensation coil 102 for a refrigerator; and an individual magnetic field compensation coil 104 for the atomic oven.

The triaxial magnetic field correction coil 96 is a coil for uniformly nullifying the magnetic field in the clock transition space 52. The triaxial magnetic field correction coil 96 is formed to have a three-dimensional shape so as to correct the magnetic field in the three, or X, Y, and Z, axes. In the example shown in FIG. 4, the triaxial magnetic field correction coil 96 is formed to have a substantially cylindrical shape as a whole. Each of coils constituting the triaxial magnetic field correction coil 96 is formed to have a point-symmetric shape centered in the clock transition space 52 in each axis direction.

The vacuum-resistant electric connector 98 is a connector for supplying electric power to the inside of the vacuum chamber 20, and is provided on the circular wall portion of the vacuum chamber 20. From the vacuum-resistant electric connector 98, power is supplied to the coil 44 for the Zeeman slower, the coil 48 for the MOT device, and the triaxial magnetic field correction coil 96.

The individual magnetic field compensation coil 102 for the refrigerator is a coil for compensating the stray magnetic field from the refrigerator 58 that cools the cryostat reservoir 54. The Peltier element included in the refrigerator 58 is a large current device where relatively large current flows, and generates a large magnetic field. Around the Peltier element, the magnetic field is shielded by a high permeability material. However, complete shielding is not achieved, and part of the magnetic field leaks. Accordingly, the individual magnetic field compensation coil 102 for the refrigerator is configured so as to compensate the stray magnetic field in the clock transition space 52.

The individual magnetic field compensation coil 104 for the atomic oven is a coil for compensating the stray magnetic field from the heater of the atomic oven 40. The heater of the atomic oven 40 is also a large current device, and the stray magnetic field cannot be ignored in some cases even with shielding by a high permeability material. For example, even in a case where a heater circuit is made of noninductive winding, an induced component remains in actuality, in wiring via a wiring terminal and an insulating layer. For example, even if the atomic oven is covered with a high permeability material to facilitate magnetic shielding, a portion that cannot be covered in actuality, such as an opening of the atom beam, remains. Accordingly, the individual magnetic field compensation coil 104 for the atomic oven is configured so as to compensate the stray magnetic field in the clock transition space 52.

(2) Operation of Physics Package

The basic operation of the physics package 12 is described. In the physics package 12, the vacuum pump cartridge 62 included in the vacuum chamber 20 absorbs atoms, thus vacuumizing the inside of the vacuum chamber 20. Accordingly, for example, the inside of the vacuum chamber 20 is in a vacuum state of about 10-8 Pa, which eliminates the effect of air components, such as nitrogen and oxygen. Dependent on the type of the vacuum pump to be used, a preprocess is preliminarily executed. For example, for a non-evaporable getter pump (NEG pump) and an ion pump, rough pumping must be performed from the atmosphere to a certain degree of vacuum before their operation. In this case, a rough pumping port is provided for the vacuum chamber, and rough pumping is sufficiently performed through the port using a turbomolecular pump, for example. For example, in a case of using a NEG pump as the vacuum pump main body 60, a step of activation of heating to a high temperature in a vacuum must be preliminarily executed.

In the atomic oven 40, the metal is heated by the heater to a high temperature, and atomic vapor is generated. The atomic vapor emitted from the metal in this process sequentially passes through the pore, is converged, translates, and forms an atom beam 42. The atomic oven 40 is installed so as to form the atom beam 42 on the beam axis in parallel with the Z-axis. Note that in the atomic oven 40, an atomic oven main body is heated by a heater. However, the atomic oven main body and a joint that supports this main body are thermally insulated via a thermal insulator. Furthermore, a joint connected to the physics package is cooled by the cooler 90 for the atomic oven, thus preventing the physics package 12 from being affected by a high temperature, or reducing the adverse effect of the high temperature.

The coil 44 for the Zeeman slower is installed so as to be axisymmetrical with respect to the beam axis. The inside of the coil 44 for the Zeeman slower is irradiated with the Zeeman slower optical beam 82 and the MOT optical beam 84 on one axis. The Zeeman slower optical beam 82 enters from the vacuum-resistant optical window 70 for Zeeman slower light and MOT light, and is reflected by the optical mirror 74 installed downstream of the beam away from the coil 48 for the MOT. Accordingly, the Zeeman slower optical beam 82 is overlaid on the atom beam 42, and travels upstream of the beam axis in parallel to the beam axis. In this process, owing to the effect of the Zeeman splitting proportional to the intensity of the magnetic field and the effect of the Doppler shift, the atoms in the atom beam 42 absorb the Zeeman slower light, are given momentum in the deceleration direction, and are decelerated. The Zeeman slower light is reflected upstream of the coil 44 for the Zeeman slower by the optical mirror 76 disposed aside of the beam axis, and is emitted through the vacuum-resistant optical window 72 for Zeeman slower light and MOT light. Note that the coil 44 for the Zeeman slower generates Joule heat. However, cooling is performed by the cooler 92 for the Zeeman slower. Accordingly, the temperature is prevented from being high.

The sufficiently decelerated atom beam 42 reaches the MOT device that includes the MOT coil on the furthest downstream side of the coil 44 for the Zeeman slower, and the coil 48 for the MOT device. In the MOT device, a magnetic field having a linear spatial gradient is formed centered in the capture space 50. The MOT device is irradiated with MOT light in the three-axis directions, in the positive and negative sides.

The MOT optical beam 84 in the Z-axis direction is emitted in the negative direction of the Z-axis, and is then reflected outside of the vacuum-resistant optical window 72 for Zeeman slower light and MOT light, thus being emitted also in the positive direction of the Z-axis. MOT optical beams **86*a* and 86*b* on the remaining two axes are emitted into the MOT device through the vacuum-resistant optical window 68 for MOT light and by an optical mirror, not shown. As shown in FIG. 4, these two axes are in two directions perpendicular to the Z-axis and inclined respectively from the X-axis and the Y-axis by 45 degrees; emission is performed in these two directions. The configuration allowing the two MOT optical beams 86*a* and 86*b* to be perpendicular to the Z-axis can narrow the distance between the coil 44 for the Zeeman slower and the coil 48 for the MOT device, thus contributing to miniaturization of the vacuum chamber 20**. In a case where the directions of emission of the MOT optical beams are configured to be inclined respectively from the Z-axis and the Y-axis by 45 degrees, the distance in the beam axis must be large so as to prevent the MOT optical beams from interfering with the Zeeman slower and the cryostat reservoir. In this case, the device size is larger than in the case where the two axes of the MOT light beams are perpendicular to the Z-axis.

In the MOT device, the atom beam receives a restoring force centered in the capture space 50 by the magnetic field gradient and is decelerated. Accordingly, the atom population is captured in the capture space 50. Note that the position of the capture space 50 can be finely adjusted by adjusting the offset values for the magnetic field to be generated by the triaxial magnetic field correction coil 96. The Joule heat generated at the coil 48 for the MOT device is discharged outside of the vacuum chamber 20 by the cooler 94 for the MOT device.

An optical lattice light beam 80 enters in the X-axis through the vacuum-resistant optical window 64 for optical lattice light toward the vacuum-resistant optical window 66 for optical lattice light. On the X-axis, the optical resonator 46 including two optical mirrors is installed, and causes reflection. Accordingly, on the X-axis there is formed an optical lattice potential with a series of standing waves in the X-axis direction in the optical resonator 46. The atom population is captured by the optical lattice potential.

The optical lattice can be moved along the X-axis by slightly changing the wavelength. By movement means through the moving optical lattice, the atom population is moved to the clock transition space 52. As a result, the clock transition space 52 is apart from the beam axis of the atom beam 42. Accordingly, the effects of blackbody radiation emitted from the atomic oven 40 at a high temperature can be removed. The clock transition space 52 is enclosed by the cryostat reservoir 54, and is shielded from blackbody radiation emitted from ambient materials at ordinary temperatures. In general, blackbody radiation is proportional to the fourth power of the absolute temperature of a material. Accordingly, reduction in temperature by the cryostat reservoir 54 exerts a large advantageous effect of removing the impact of the blackbody radiation.

In the clock transition space 52, atoms are irradiated with laser light whose optical frequency is under control, highly accurate spectroscopy of clock transitions (i.e., resonance transitions of atoms serving as the reference of the clock) is performed, and the frequency that is specific to the atom and invariant is measured. Thus, an accurate atomic clock is achieved. Improvement of the accuracy of the atomic clock requires removal of perturbation around the atoms, and accurate reading of the frequency. It is particularly important to remove the frequency shift caused by the Doppler effect due to the thermal agitation of the atoms. In the optical lattice clock, the atom movement is frozen by confining the atoms in a space sufficiently smaller than the wavelength of the clock laser by the optical lattice created by interference of the laser light. Meanwhile, in the optical lattice, the frequencies of atoms are shifted by laser light that forms the optical lattice. For the optical lattice light beam 80, a specific wavelength or frequency called "magic wavelength" or "magic frequency" is selected, which removes the effects of the optical lattice to the resonant frequency.

Furthermore, the clock transitions are also affected by a magnetic field. Atoms in the magnetic field cause Zeeman splitting dependent on the intensity of the magnetic field. Accordingly, the clock transitions cannot be accurately measured. In the clock transition space 52, the magnetic field is corrected so as to equalize and nullify the magnetic field. First, a stray magnetic field caused by the Peltier element of the refrigerator 58 is dynamically compensated by the individual magnetic field compensation coil 102 for the refrigerator that generates a compensation magnetic field dependent on the intensity of the stray magnetic field. Likewise, it is configured so that the stray magnetic field caused by the heater of the atomic oven 40 can be dynamically compensated by the individual magnetic field compensation coil 104 for the atomic oven. Note that for the coil 44 for the Zeeman slower and the coil 48 for the MOT device, the current signal is turned off at timing of measurement of the frequency of clock transition, and energization is not performed, thus preventing effects of the magnetic field. The magnetic field of the clock transition space 52 is further corrected by the triaxial magnetic field correction coil 96. The triaxial magnetic field correction coil 96 includes multiple coils in each axis, and can remove not only uniform components of the magnetic field but also spatially varying components.

Thus, in the state where the disturbances are removed, the atom population is urged to subjected to clock transition by laser light. Light emitted as a result of the clock transition is received by the optical system device, subjected to a spectroscopic process and the like by the control device, and the frequency is obtained. Hereinafter, embodiments of the physics package 12 are described in detail.

(3) Shape and Installation Mode of Magnetic Field Correction Coil

By reference to FIGS. 5 to 11, the triaxial magnetic field correction coil 96 in the physics package 12 is described. Here, the triaxial magnetic field correction coil 96 is assumed to be formed to have a predetermined shape by winding a covered conductor wire that includes a conducive wire made of copper or the like and is subjected to an insulating process with a polyimide resin.

Figure 5:
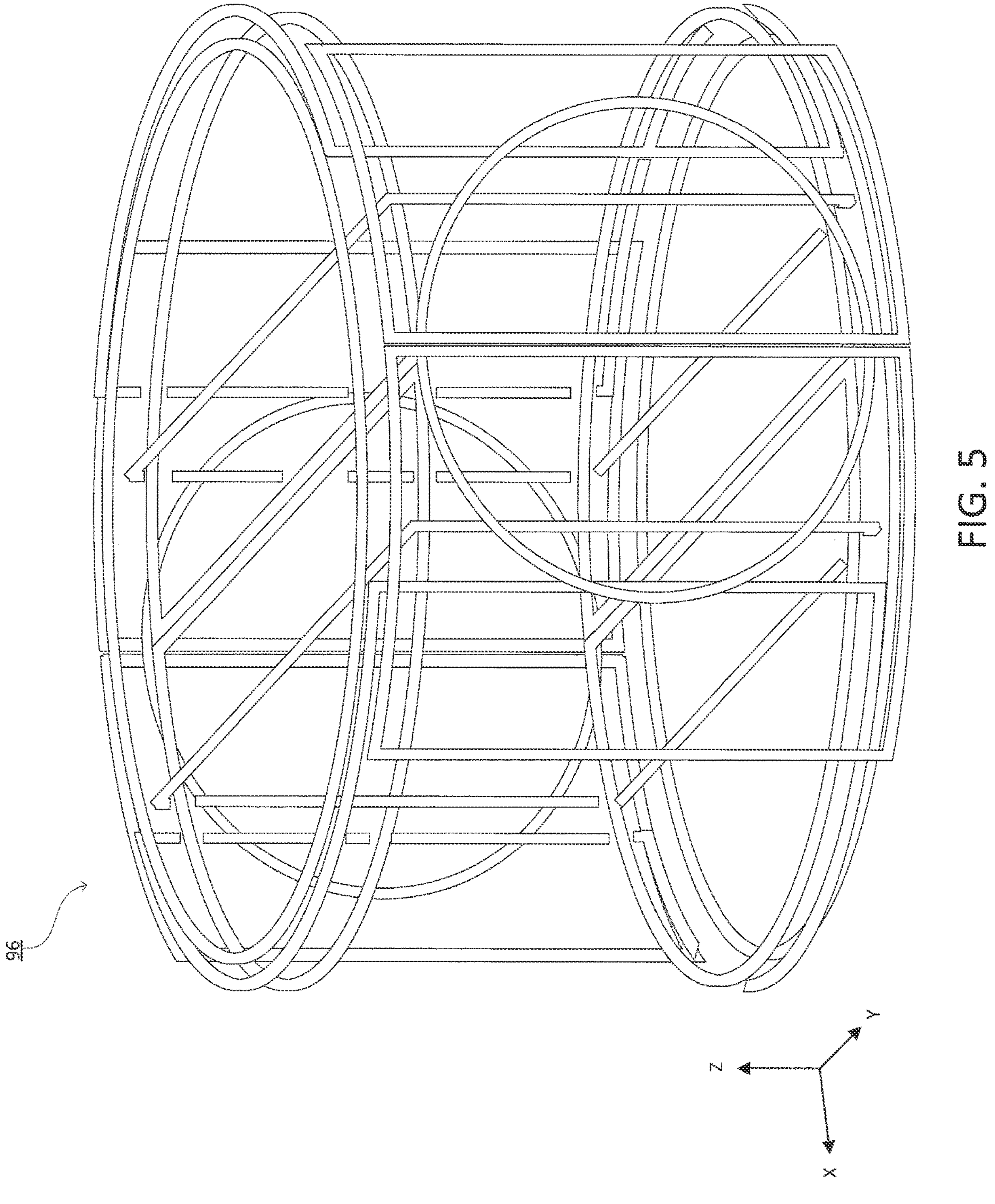
FIG. 5 shows an overall shape of a triaxial magnetic field correction coil.

FIG. 5 is a perspective view showing all the coils of the triaxial magnetic field correction coil 96. FIGS. 6 to 11 are perspective views showing individual coils that constitute the triaxial magnetic field correction coil. The triaxial magnetic field correction coil 96 is attached around an inner wall of the main body 22 of the vacuum chamber 20. Accordingly, the triaxial magnetic field correction coil 96 is formed to have a substantially cylindrical shape centered in the clock transition space 52. The triaxial magnetic field correction coil 96 includes a first coil group and a second coil group in each of the directions of the X-axis, Y-axis, and Z-axis.

Figure 6:
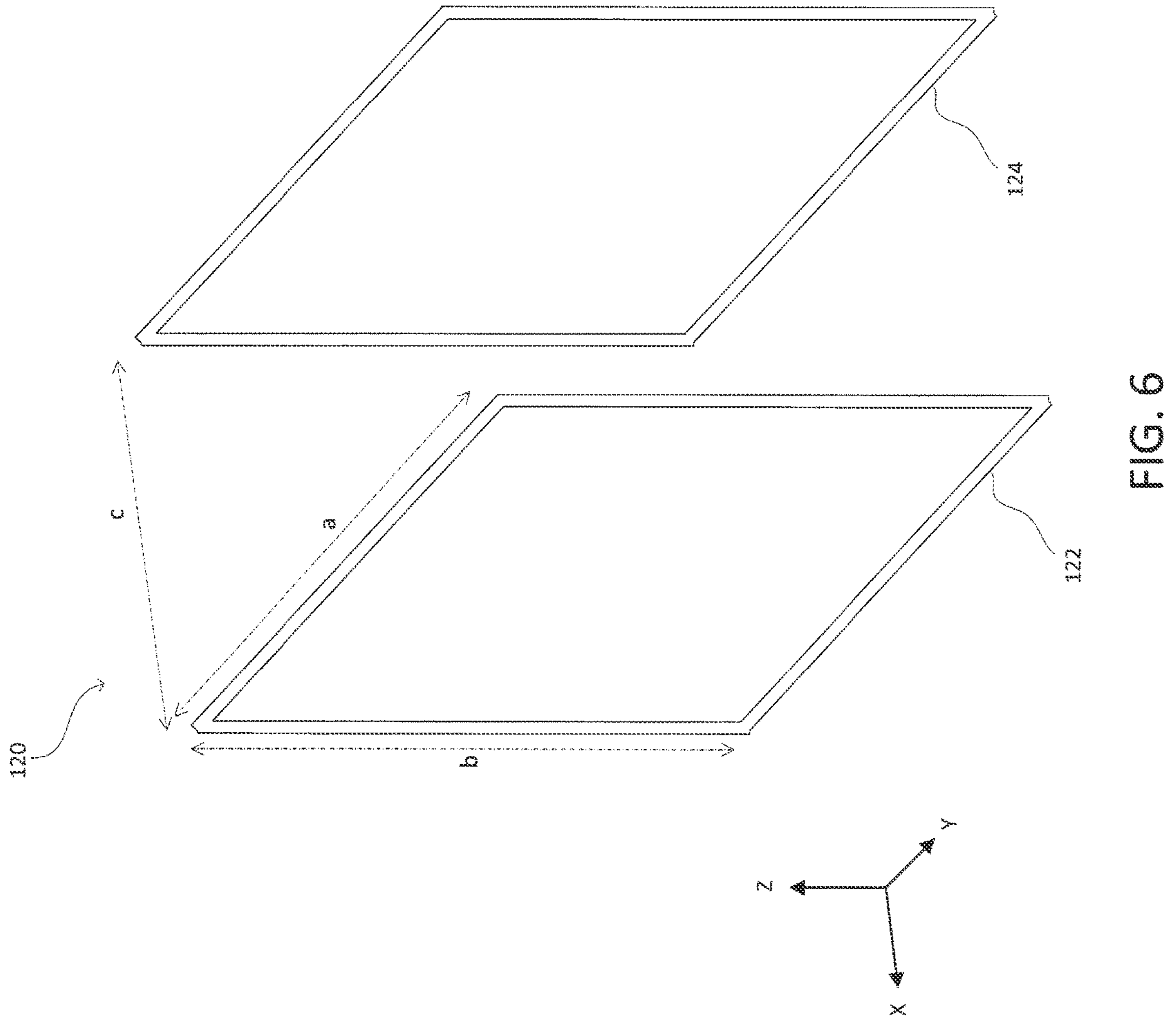
FIG. 6 shows a shape of a first coil group of an X-axis magnetic field correction coil.

FIG. 6 shows a first coil group 120 in the X-axis direction (a direction in which an optical lattice in one axis is formed, and the moving optical lattice moves). The first coil group 120 includes two coils 122 and 124 installed apart from each other by a distance c in the X-axis direction centered in the clock transition space 52. Each of the coils 122 and 124 is each formed to have a rectangle with the length of the side in the Y-axis direction being a, and the length of the side in the Z-axis direction being b. Each of the coils 122 and 124 is formed to have a point-symmetric shape with respect to the clock transition space 52.

The first coil group 120 causes the coils 122 and 124 to have a square-shaped Helmholtz-type coil so as to substantially uniformly generate the magnetic field at a central portion in the X-axis direction. The square-shaped Helmholtz-type coil includes the coils 122 and 124 formed to have a square shape with a=b, with about c/2a=0.5445. When currents having the same magnitude flow in the same direction, the coils 122 and 124 serve as a Helmholtz-type coil pair that form a magnetic field having high uniformity in the X-axis direction. However, in the embodiment, currents having different magnitudes and directions are allowed to flow through the coils 122 and 124. Note that the coils 122 and 124 can sufficiently improve the uniformly of the magnetic field even in a case of a≠b. In a case of a>b, the deviation of the magnetic field distribution in the Y-axis direction tends to be smaller than that of the magnetic field distribution in the Z-axis direction. In a case of a<b, the deviation of the magnetic field distribution in the Z-axis direction tends to be smaller than that of the magnetic field distribution in the Y-axis direction. In the case of a≠b, c is optimized by what is called a rectangular Helmholtz-type coil. The first coil group 120 may be configured as a rectangular Helmholtz-type coil.

The first coil group 120 is used to adjust the value of the magnetic field component in the X-axis direction, and its first order spatial derivative term in the X-axis direction. First, 1) when currents having the same magnitude flow in the same direction through the coils 122 and 124, a uniform magnetic field having little gradient in the X-axis direction is formed in the clock transition space 52. On the other hand, 2) when currents having the same magnitude flow in the opposite directions through the coils 122 and 124, a uniform magnetic field having a substantially uniform gradient in the X-axis direction is formed in the clock transition space 52. When the magnitudes and directions of currents flowing through the coils 122 and 124 are appropriately changed, a magnetic field of a linear sum of 1) and 2) is formed. Accordingly, the first coil group 120 can correct the constant term component of the magnetic field component Bx in the X-axis direction in the clock transition space 52, and its first order spatial derivative term in the X-axis direction.

Figure 7:
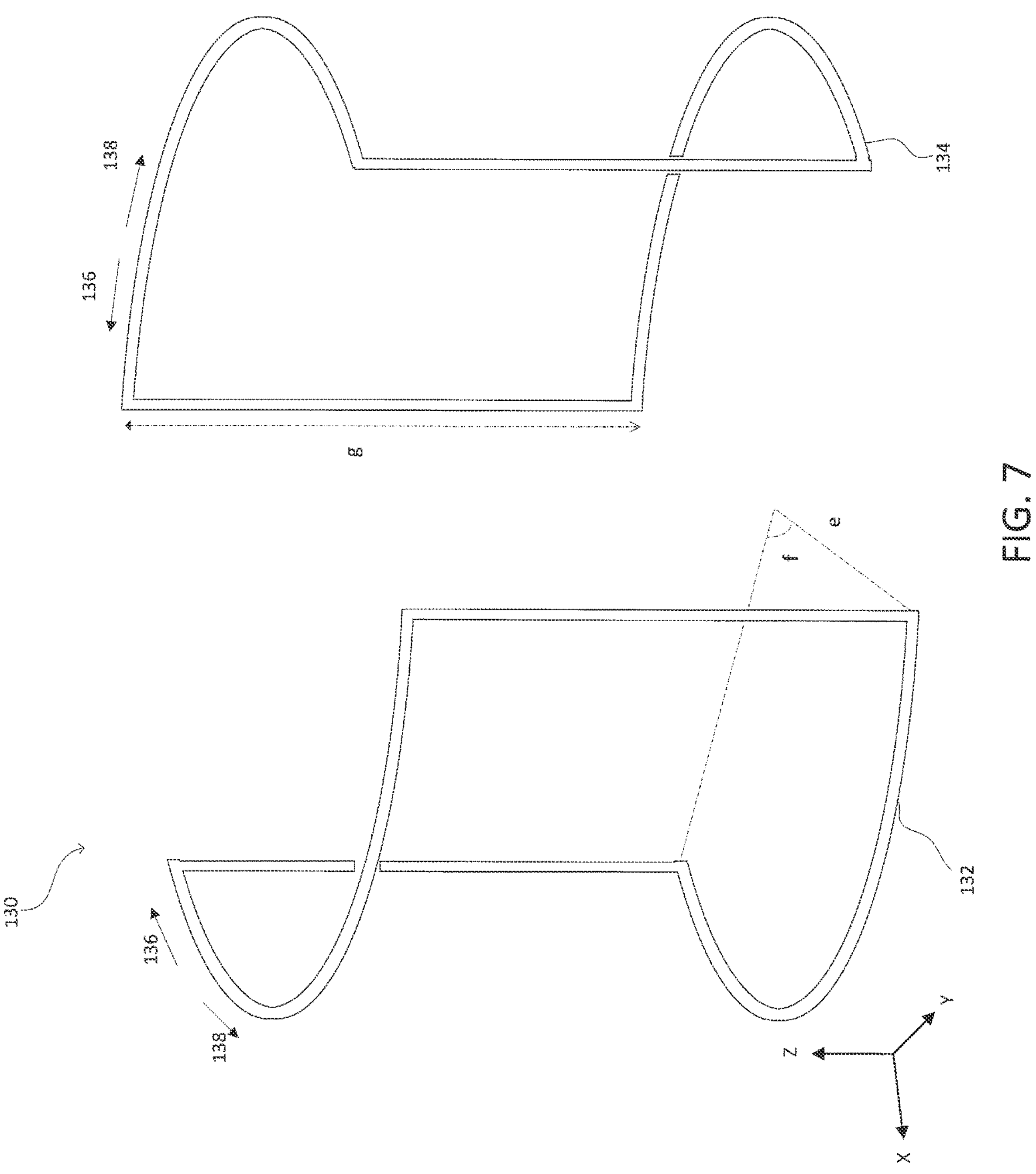
FIG. 7 shows a shape of a second coil group of the X-axis magnetic field correction coil.

FIG. 7 shows a second coil group 130 in the X-axis direction. The second coil group 130 includes two coils 132 and 134 installed apart from each other in the X-axis direction centered in the clock transition space 52. Each of the coils 132 and 134 is formed to have shapes obtained by deforming rectangular coils to have a curvature so that the coils can be laid on the same cylindrical surface having a radius e and are configured so that the central angle is f, and the height in the Z-axis direction is g. The cylindrical surface is formed to have a radius substantially identical to that of a cylindrical surface onto which the first coil group 120 in FIG. 6 is fixed. Accordingly, the relationship $e^2=(a/2)^2+(c/2)^2$ holds. The coils 132 and 134 are formed to have a point-symmetric shape with respect to the clock transition space 52.

The second coil group 130 is a non-Helmholtz-type coil that has a shape different from that of the Helmholtz coil. The coils 132 and 134 of the second coil group are electrically connected to each other. Currents with the same magnitude flow through the coils in the same direction. That is, currents flow in the direction of an arrow 136 or currents flow in the direction of an arrow 138 through both the coils 132 and 134. Since the second coil group 130 is a non-Helmholtz-type coil, a non-uniform component is also generated in addition to a uniform component according to a Helmholtz coil in the clock transition space 52 at the center. Note that the magnitudes and the directions of currents are the same. Accordingly, the non-uniform component is mainly a second order spatial derivative term component. That is, the second coil group 130 can correct the constant term component of the magnetic field component Bx in the X-axis direction in the clock transition space 52, and its second order spatial derivative term in the X-axis direction.

The magnetic field component Bx in the X-axis direction in the triaxial magnetic field correction coil 96 is basically controlled by the first coil group 120 and the second coil group 130 in the X-axis direction. Accordingly, these are collectively called an X-axis magnetic field correction coil. To perform correction, first, the value of the second order spatial derivative term in the X-axis direction is nullified by the second coil group 130. Subsequently, adjustment of nullifying the value of the first order spatial derivative term in the X-axis direction and nullifying the constant term in the X-axis direction by the first coil group 120 is performed.

Figure 8:
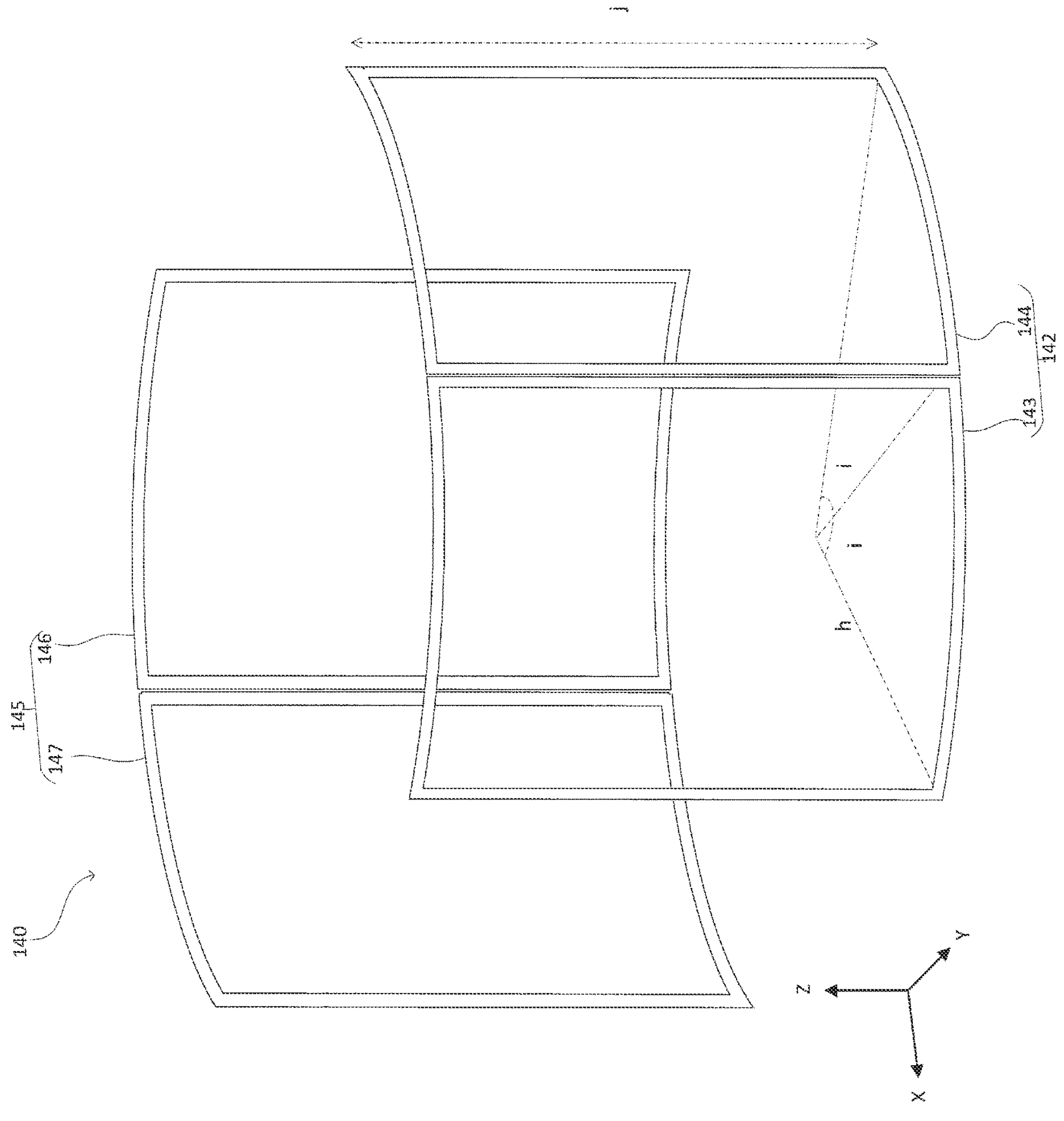
FIG. 8 shows a shape of a first coil group of a Y-axis magnetic field correction coil.

FIG. 8 shows a first coil group 140 in the Y-axis direction. The first coil group 140 is formed by deforming rectangular coils so as to have a curvature, and is laid on a cylindrical surface having a radius h centered in the clock transition space 52. The first coil group includes a composite coil 142 made up of a coil 143 and a coil 144, and a composite coil 145 made up of a coil 146 and a coil 147, the composite coils being installed apart from each other in the Y-axis direction. The coils 143, 144, 146, and 147 are configured so that the central angle is i and the height in the Z-axis direction is j. The coils 143 and 144 are formed so that their edges can overlap with or be adjacent to each other. Likewise, the coils 146 and 147 are formed so that their edges can overlap with or be adjacent to each other. The composite coil 142 and the composite coil 145 are point-symmetrically formed centered in the clock transition space 52. The coil 143 and the coil 146, and the coil 144 and the coil 147 are point-symmetrically formed centered in the clock transition space 52.

First, 3) a case is discussed where currents with the same magnitude flow in the same direction through the coils 143 and 144. In this case, currents at the overlapping or adjacent configuration cancel each other, and the entire composite coil 142 serves as a single large coil. Likewise, in a case where currents with the same magnitude flow in the same direction through the coils 146 and 147, the composite coil 145 serves as a single large coil. The first coil group 140 is configured so that the composite coil 142 and the composite coil 145 serve as a pair of Helmholtz-type coils. The Helmholtz-type coil on the cylindrical surface shown in FIG. 8 (i.e., a Helmholtz-type coil obtained by bending two rectangular coils and arranging on the same cylindrical surface) has a central angle of about 120 degrees. The length in the Z-axis direction is not specifically limited. It is however known that the greater the length in the Z-axis direction in comparison with the radius of the cylinder, the higher the magnetic field uniformly of the central portion. The first coil group 140 can equalize the component of the magnetic field in the Y-axis direction around the center by adjusting the direction and magnitude of the current allowed to flow.

Next, 4) the current is slightly changed from the current when the Helmholtz coil is formed. Specifically, only currents through the coil 143 and the coil 147 are slightly increased in the same direction. In this case, the component of the magnetic field in the Y-axis direction has the value of the first order spatial derivative term in the X-axis direction. Note that in a strict sense, the magnetic field formed by the coil 143 and the coil 147 has a component in the X-axis direction. When the first coil group 140 is adjusted, the X-axis magnetic field correction coil also must be adjusted.

Figure 9:
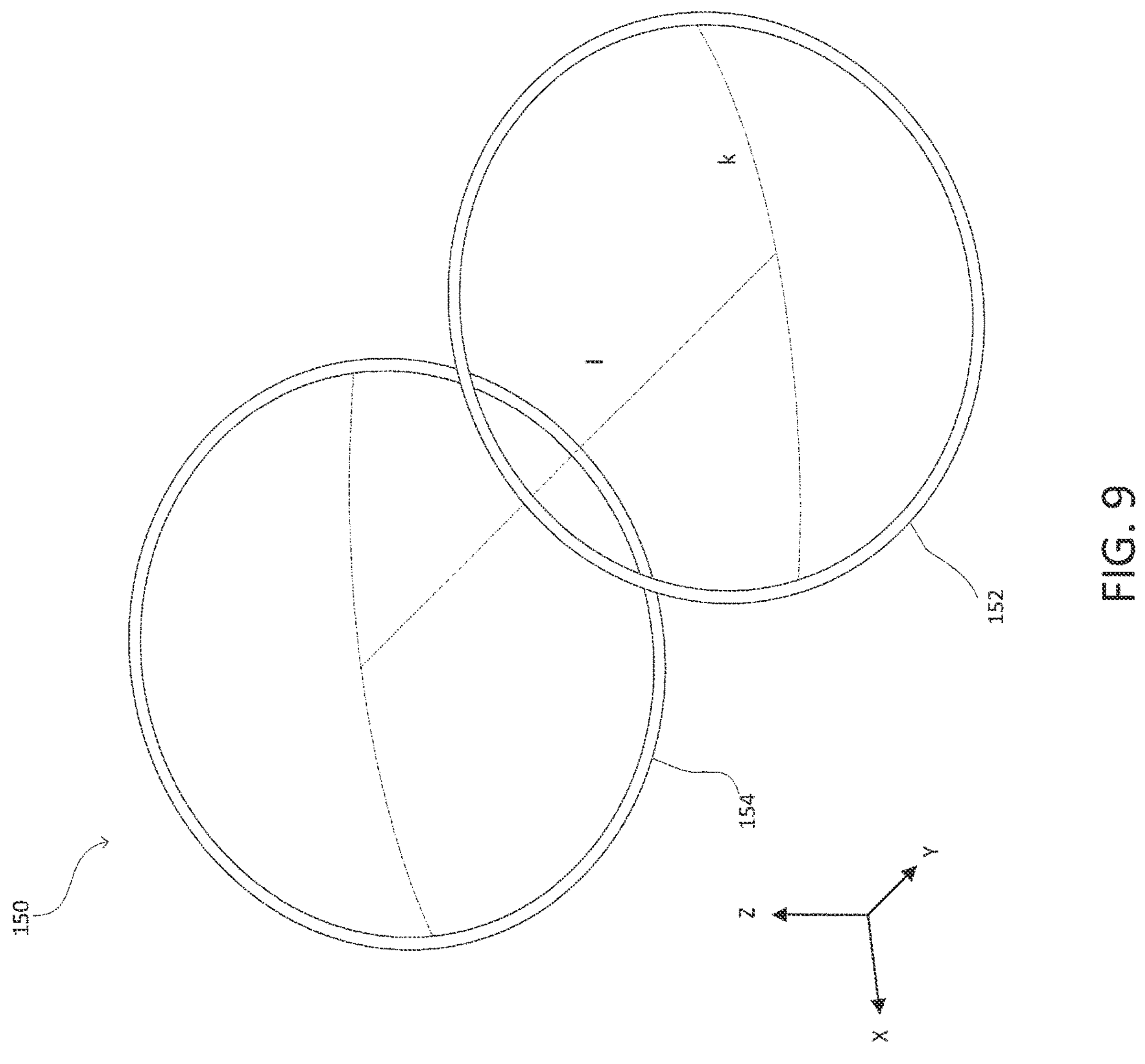
FIG. 9 shows a shape of a second coil group of the Y-axis magnetic field correction coil.

FIG. 9 shows a second coil group 150 in the Y-axis direction. The second coil group 150 shown in FIG. 9 is made up of a pair of coils 152 and 154 that face each other in the Y-axis direction. Each of the coils 152 and 154 is a non-Helmholtz-type coil formed to have a shape obtained by causing a circular coil having a radius k to have a curvature, and laying the coil on the plane of a cylinder with a radius 1 centered in the clock transition space 52. The non- Helmholtz-type coil also forms the second order spatial derivative term component of the magnetic field. Accordingly, the second coil group 150 is used to control the X-axis-direction second order spatial derivative term of the magnetic field component By in the Y-axis direction.

The first coil group 140 in the Y-axis direction shown in FIG. 8 and the second coil group 150 in the Y-axis direction shown in FIG. 9 basically form a Y-axis magnetic field correction coil that corrects the magnetic field component By in the Y-axis direction. The Y-axis magnetic field correction coil can correct the constant term of the magnetic field component By in the Y-axis direction, the first order spatial derivative term in the X-axis direction, and the second order spatial derivative term in the X-axis direction.

Figure 10:
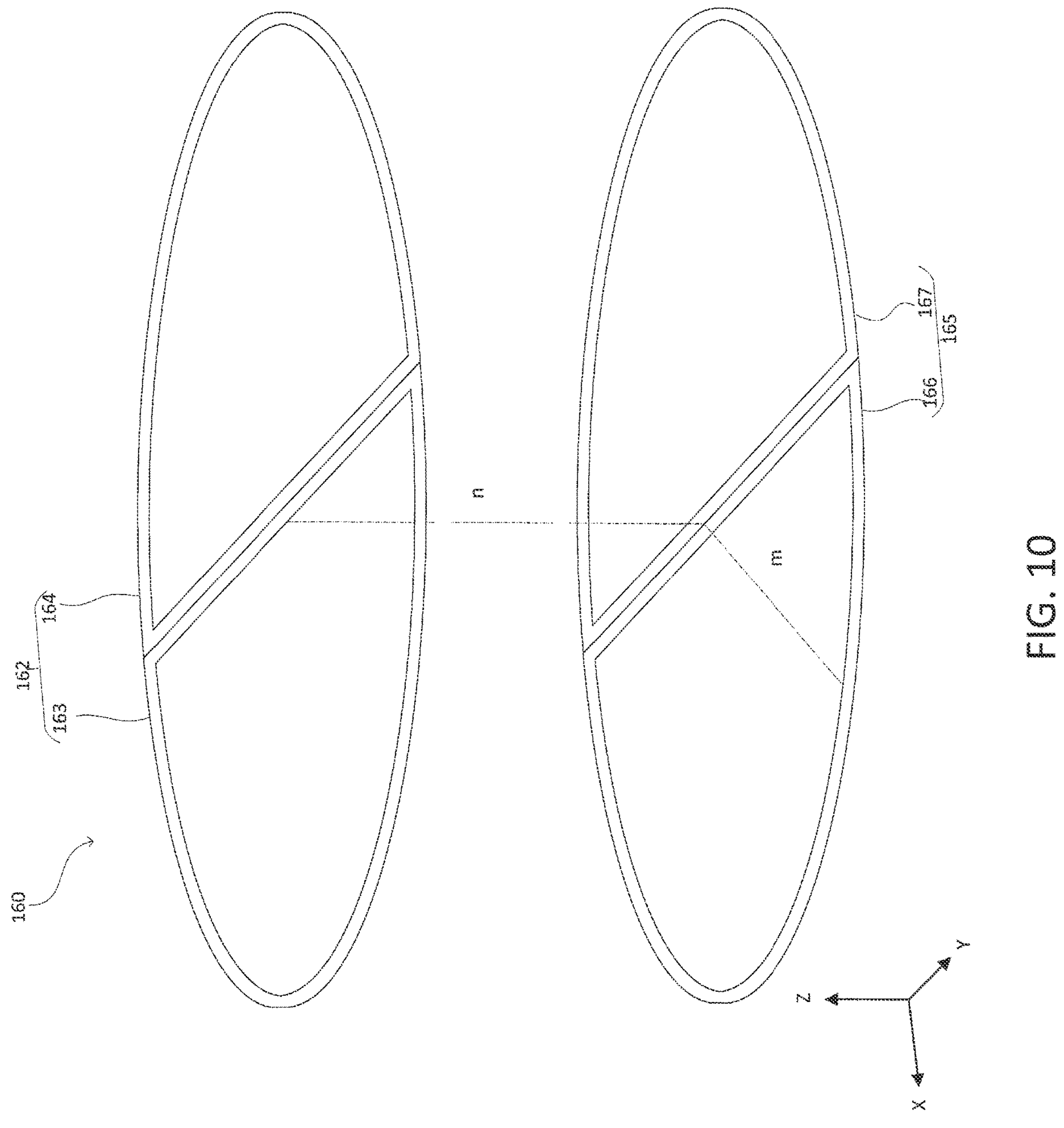
FIG. 10 shows a shape of a first coil group of a Z-axis magnetic field correction coil.

FIG. 10 shows a first coil group 160 in the Z-axis direction. The first coil group 160 includes circular composite coils 162 and 165 that have a radius m and are arranged to face each other and separated by a distance n. The composite coils 162 and 165 are point-symmetric with respect to the center. The composite coil 162 includes semicircular coils 163 and 164 whose chords overlap with or are adjacent to each other. The semicircular coil 163 is arranged on the positive side of the X-axis, and the semicircular coil 164 is arranged on the negative side of the X-axis. Likewise, the composite coil 165 is formed by combining a semicircular coil 166 on the positive side of the X-axis and a semicircular coil 167 on the negative side of the X-axis.

The composite coils 162 and 165 are configured to have sizes and the like so as to serve as a Helmholtz-type coil. The circular Helmholtz coil has a relationship of m=n. The composite coils 162 and 165 are configured so that when currents having the same magnitude flow in the same direction, the uniformity of the magnetic field in the Z direction around the center is substantially equivalent to that of a Helmholtz coil. Note that the directions and magnitudes of the currents through the coils 163 and 164, which constitute the composite coil 162, can be freely changed. Accordingly, similar to the first coil group 140 in the Y direction shown in FIG. 8, the first coil group 160 can correct the constant term and the X-axis-direction first order spatial derivative term of the magnetic field component Bz in the Z direction.

Figure 11:
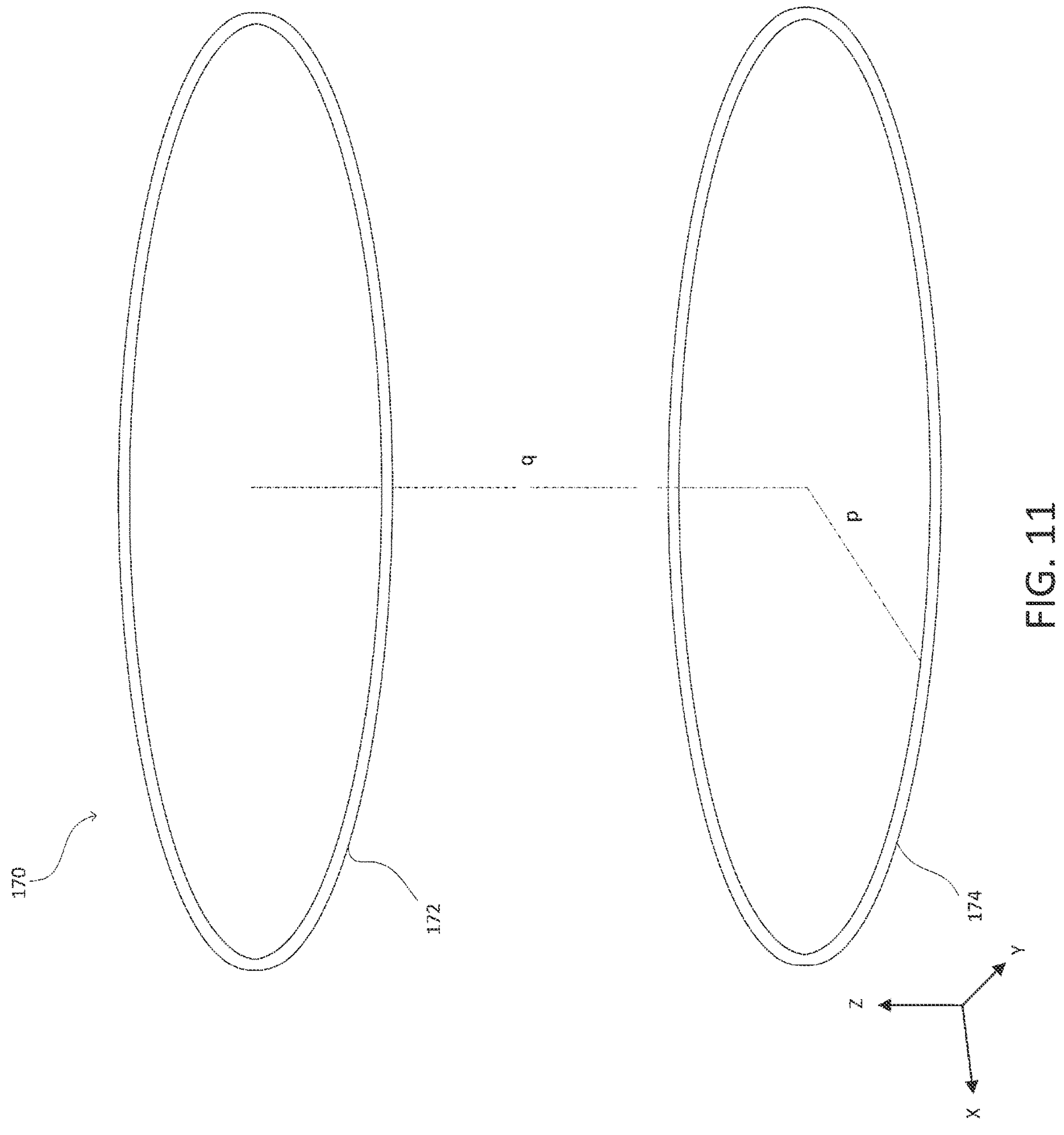
FIG. 11 shows a shape of a second coil group of the Z-axis magnetic field correction coil.

FIG. 11 shows a second coil group 170 in the Z-axis direction. The second coil group 170 includes circular coils 172 and 174 that have a radius p and are apart by a distance q in the Z-axis direction facing each other. The second coil group 170 is a non-Helmholtz-type coil. The non-Helmholtz-type coil has a non-uniform component. Accordingly, the X-axis-direction second order spatial derivative term of the magnetic field component Bz in the Z-axis direction can be corrected.

The first coil group 160 in the Z-axis direction shown in FIG. 10 and the second coil group 170 in the Z-axis direction shown in FIG. 11 basically form a Z-axis magnetic field correction coil that corrects the magnetic field component Bz in the Z-axis direction. The Z-axis magnetic field correction coil can correct the constant term of the magnetic field component Bz in the Z-axis direction, the first order spatial derivative term in the X-axis direction, and the second order spatial derivative term in the X-axis direction.

The triaxial magnetic field correction coil 96 shown in FIG. 5 is formed by controlling the X-axis magnetic field correction coil, the Y-axis magnetic field correction coil, and the Z-axis magnetic field correction coil in a combined manner. The triaxial magnetic field correction coil 96 can correct the constant term, the X-axis-direction first order spatial derivative term, and the X-axis-direction second order spatial derivative term of the magnetic field component Bx in the X-axis direction. The constant term, the X-axis-direction first order spatial derivative term, and the X-axis-direction second order spatial derivative term of the magnetic field component By in the Y-axis direction can be corrected. The constant term, the X-axis-direction first order spatial derivative term, and the X-axis-direction second order spatial derivative term of the magnetic field component Bz in the Z-axis direction can be corrected.

The triaxial magnetic field correction coil 96 performs correction of uniformly nullifying the value of the magnetic field of the clock transition space 52. In a case of a one-dimensional optical lattice, the clock transition space 52 is configured to have dimensions such as 10 mm in the X-axis direction (the direction of the lattice), and about 1 to 2 mm in the Y-axis and Z-axis directions, for example. In this space, for example, the error of the magnetic field is controlled so as to be within 3 μG, within 1 μG, or within 0.3 μG. The Helmholtz-type coils and the non-Helmholtz-type coils included in the triaxial magnetic field correction coil 96 are configured to have accuracies so as to be capable of forming the magnetic field.

As shown in FIG. 4, the triaxial magnetic field correction coil 96 is formed to have a point-symmetric shape centered in the clock transition space 52, and can accurately correct the magnetic field in the clock transition space 52. However, in a macroscopic view, the capture space 50 is present around the center of the triaxial magnetic field correction coil. Accordingly, use for correcting the magnetic field of the capture space 50 due to the MOT device is also available. That is, the current is controlled to correct the magnetic field of the capture space 50 in a time period in which the MOT device is activated and captures atoms from the atom beam 42. After the capture is finished, power transmission to the coil 44 for the Zeeman slower and the coil 48 for the MOT device is stopped, and the magnetic field of the clock transition space 52 is corrected. Thus, the position of the capture space 50 is adjusted with high accuracy, and the atom population can be efficiently confined in the optical lattice.

Figure 12:
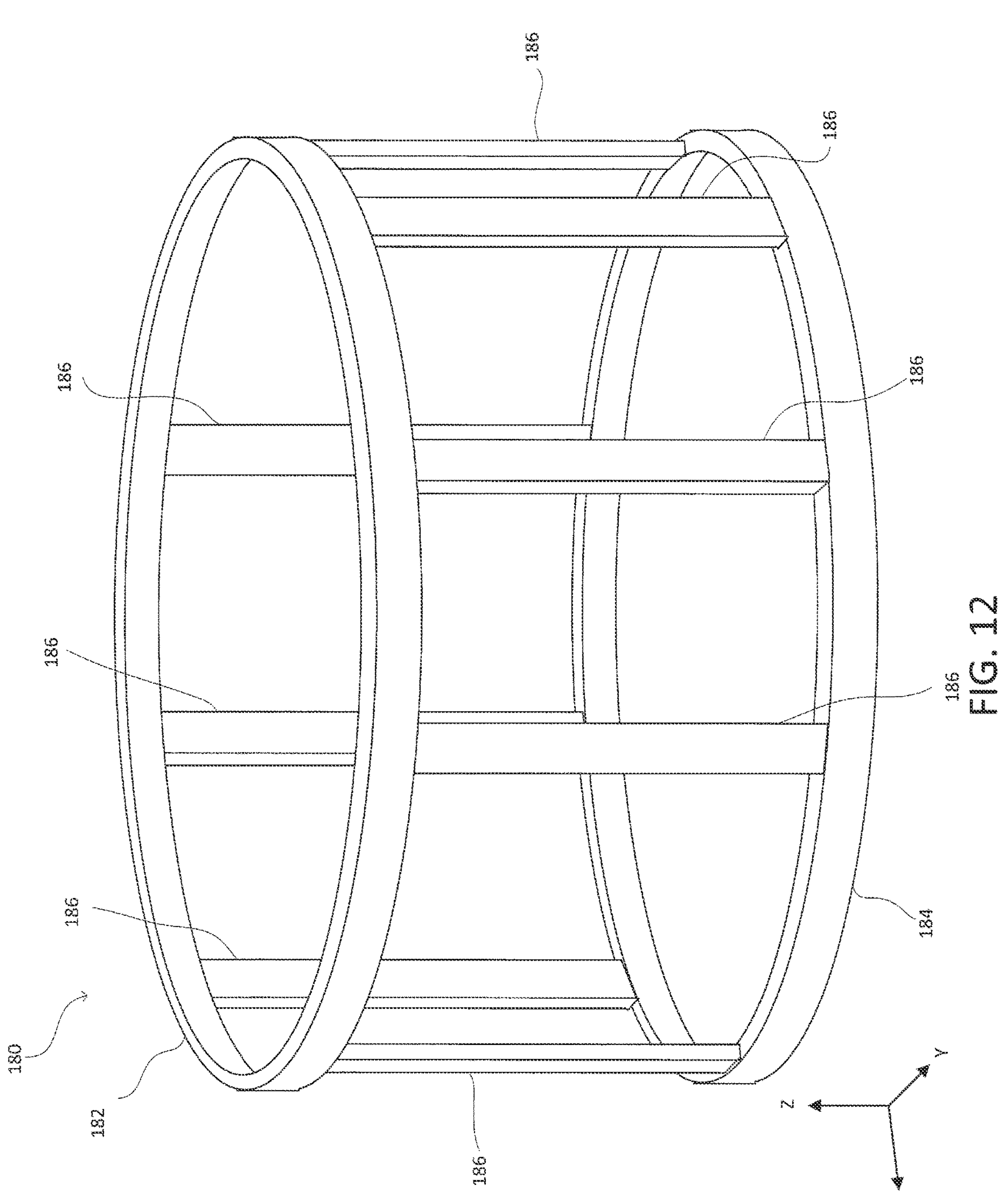
FIG. 12 shows a shape of a holder of the triaxial magnetic field correction coil.

FIG. 12 shows a cylindrical holder 180 to which the triaxial magnetic field correction coil 96 is attached. The holder 180 includes circular ring-shaped frames 182 and 184, and eight linear frames 186 that connect the frames 182 and 184. The triaxial magnetic field correction coil 96 is attached to the inner wall and the outer wall of the holder 180. The holder 180 is then fixed to the rear circular wall 28 of the main body 22 of the vacuum chamber 20. By attaching the triaxial magnetic field correction coil 96 to the holder 180, the efficiency of assembly and maintenance checkup operations of the physics package 12 is improved.

The holder 180 is made of a low-permeability material such a resin, aluminum, or the like in order not to affect the magnetic field created by the triaxial magnetic field correction coil 96. The holder 180 is installed in the main body 22 so as to be coaxial with the central axis of the cylinder of the main body 22. The holder 180 is formed to have a size close to the inner diameter of the main body 22. Accordingly, the triaxial magnetic field correction coil 96 and the holder 180 hardly occupy the space in the main body 22. Note that the coils 122 and 124, which are the first coil group 120 in the X-axis direction, are attached linearly across the inside of the main body 22.

The holder 180 is formed to have a sparse structure using the frames. The sparse structure is a structure having many interspaces on each surface. The sparse structure of the holder 180 reduces the weight, and facilitates prevention of interference with laser light that enters and is emitted from the vacuum chamber 20.

The triaxial magnetic field correction coil 96 may be, for example, attached only to the inner wall of the holder 180 or attached only to the outer wall of the holder 180, instead of being attached to the inner wall and the outer wall of the holder 180. In this case, for example, fixation can be easily achieved using a circular ring-shaped fastener that presses the triaxial magnetic field correction coil 96 against the outer wall, or a circular ring-shaped fastener that presses the coil against the inner wall. The triaxial magnetic field correction coil 96 can be fixed to the inner wall of the main body 22 without using the holder 180.

It is assumed that the triaxial magnetic field correction coil 96 described above is formed by winding a covered conductor wire one or multiple times. However, the triaxial magnetic field correction coil 96 can be partially or entirely made of a flexible printed board.

Figure 13:
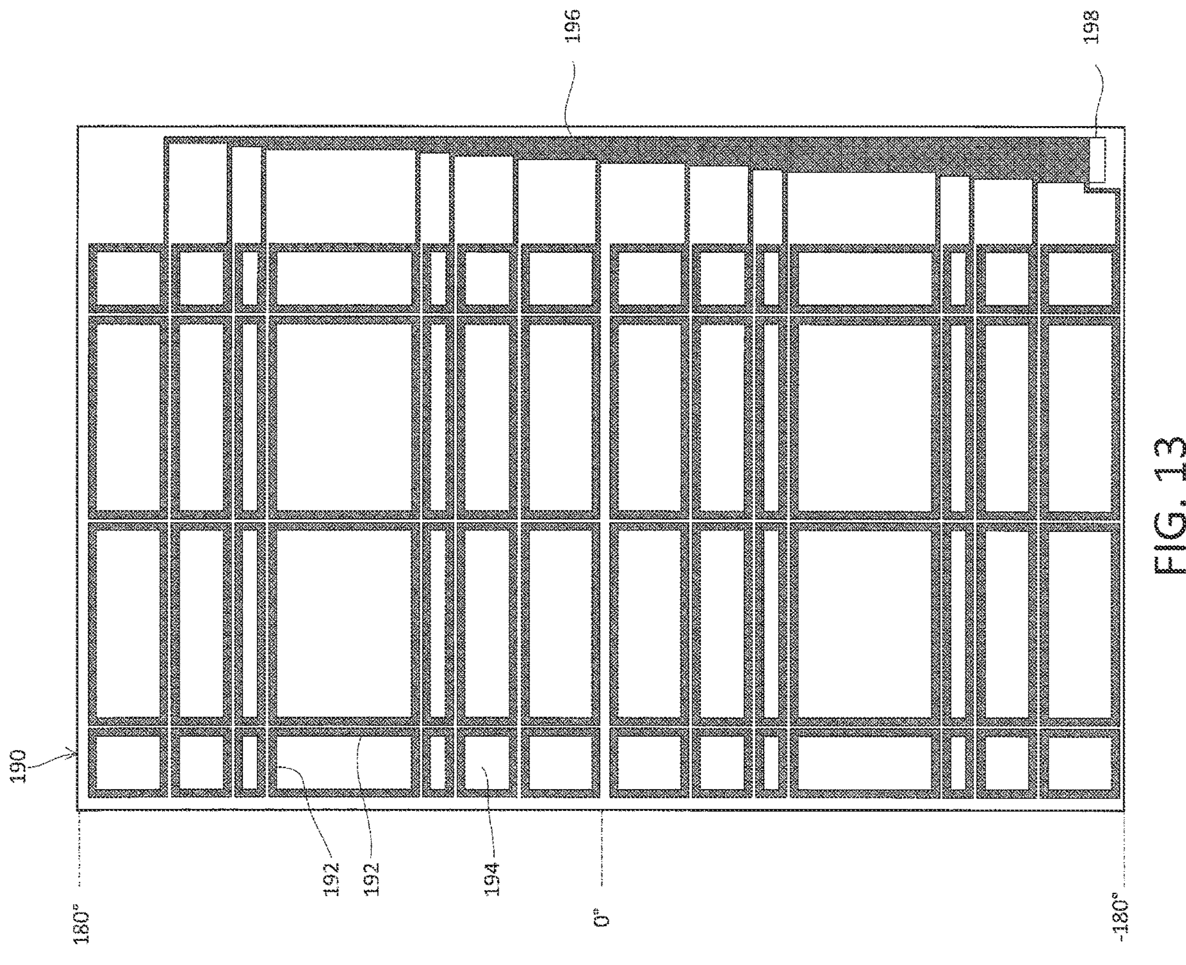
FIG. 13 shows an example of a correction coil using a flexible printed board.

FIG. 13 shows a flexible printed board developed on a plane. A correction coil 190 is formed on the flexible printed board. The correction coil 190 includes current paths 192 that are made of a printed electric conductor, such as copper, and contribute to forming the magnetic field, and an insulator 194 made of a sheet-shaped flexible resin or the like, and can be flexibly bent. Each current path 192 is connected to a wiring path 196 provided intensively on one end. The wiring path 196 is made of a print made of an electric conductor. The wiring path arranges a pair where currents reciprocate, so as to be adjacent to each other, and cancel magnetic fields to be formed therearound. The wiring path 196 is connected to a terminal connector 198.

Figure 14:
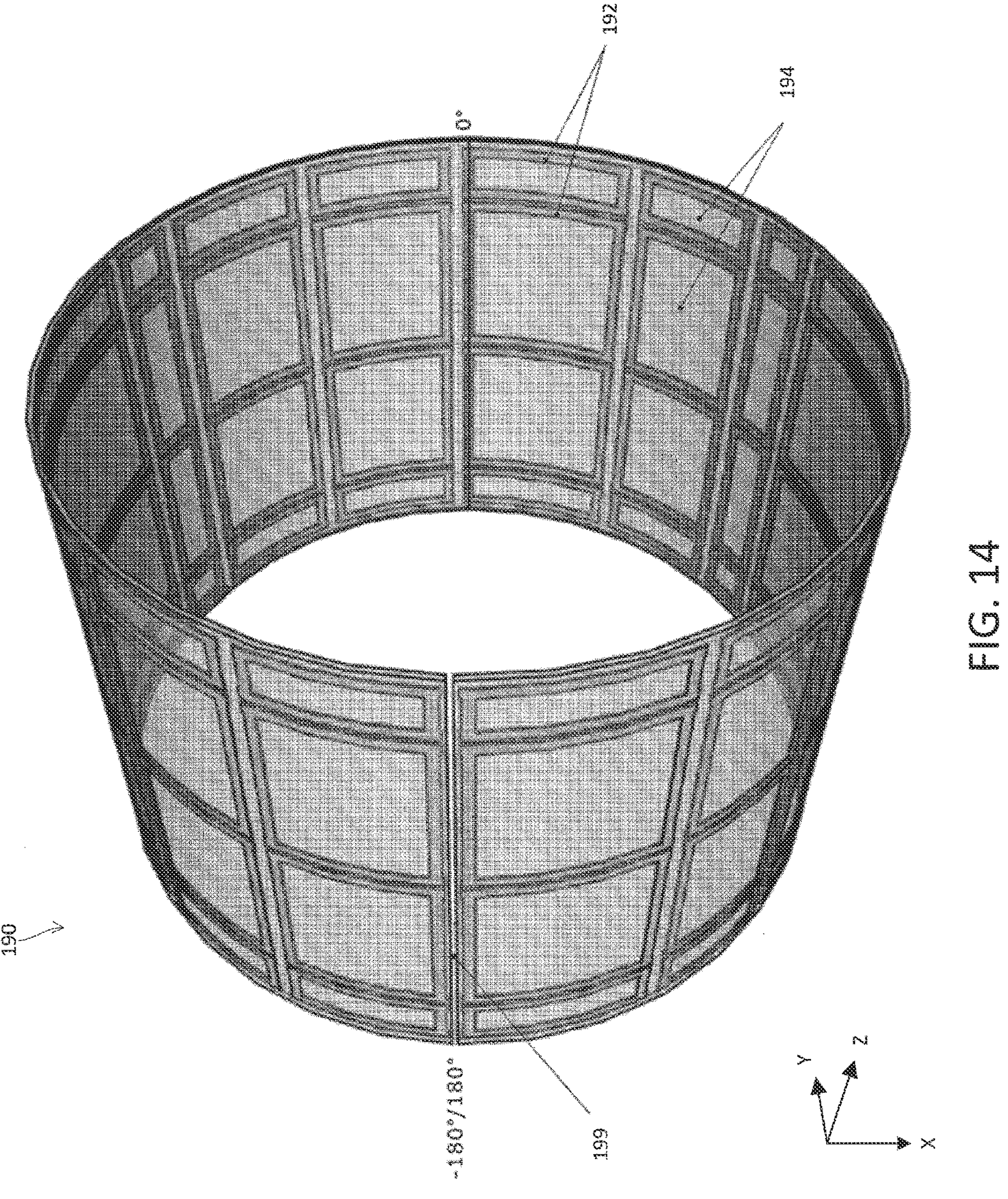
FIG. 14 shows an example of a cylindrical correction coil using a flexible printed board.

FIG. 14 shows the cylindrically bent correction coil 190, which can be found along the main body 22 of the vacuum chamber 20 of FIGS. 2, 3, and 4. The correction coil 190 includes a boundary portion 199 where the two edges are connected to or arranged adjacent to each other. Note that in FIG. 14, the wiring path 196 and the terminal connector 198 are omitted.

Similar to the triaxial magnetic field correction coil 96 where the covered conductor wire is wound, the triaxial magnetic field correction coil configured with the flexible printed board is assumed to be attached to the inner wall of the cylindrical main body 22 or to the cylindrical holder 180. Note that the triaxial magnetic field correction coil 96 includes a current path disengaged from the cylindrical surface, in addition to the current path arranged on the cylindrical surface. Specifically, a side having a length a of the first coil group 120 in the X-axis direction shown in FIG. 6, and a linear portion of the first coil group 160 in the Z-axis direction shown in FIG. 10 are disengaged from the cylindrical surface. Hereinafter, an example is described where among the current paths constituting the triaxial magnetic field correction coil 96, current paths arranged on the cylindrical surface are formed on a flexible printed board.

Figure 15:
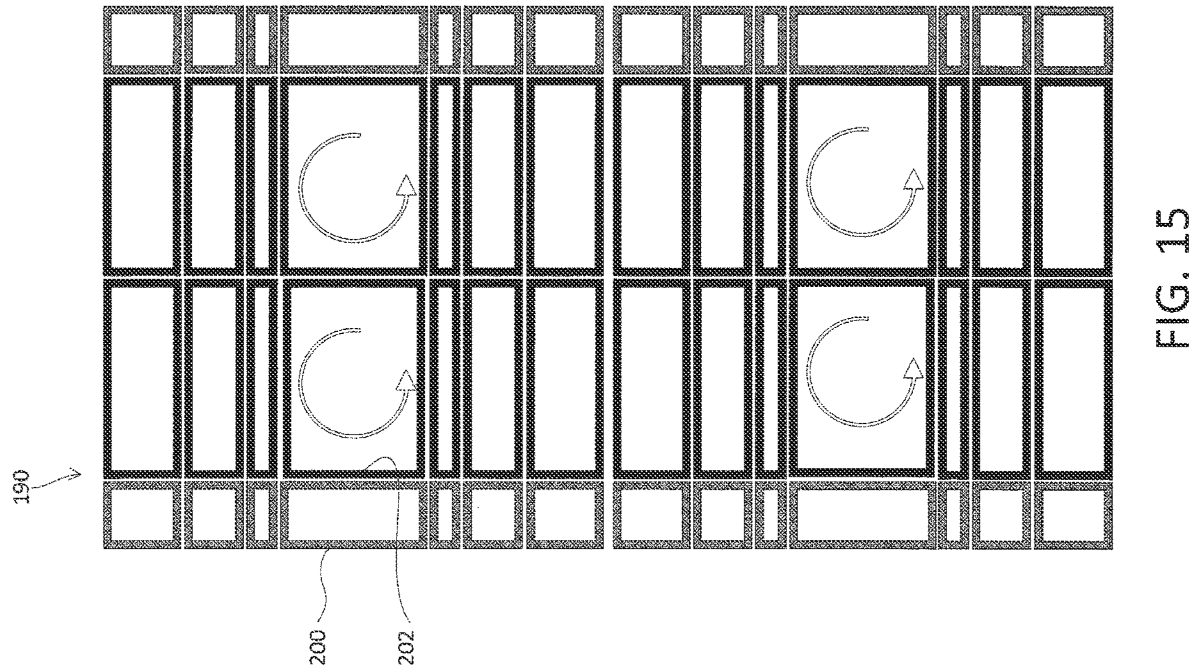
FIG. 15 shows an example of currents flowing in the correction coil.
Figure 16:
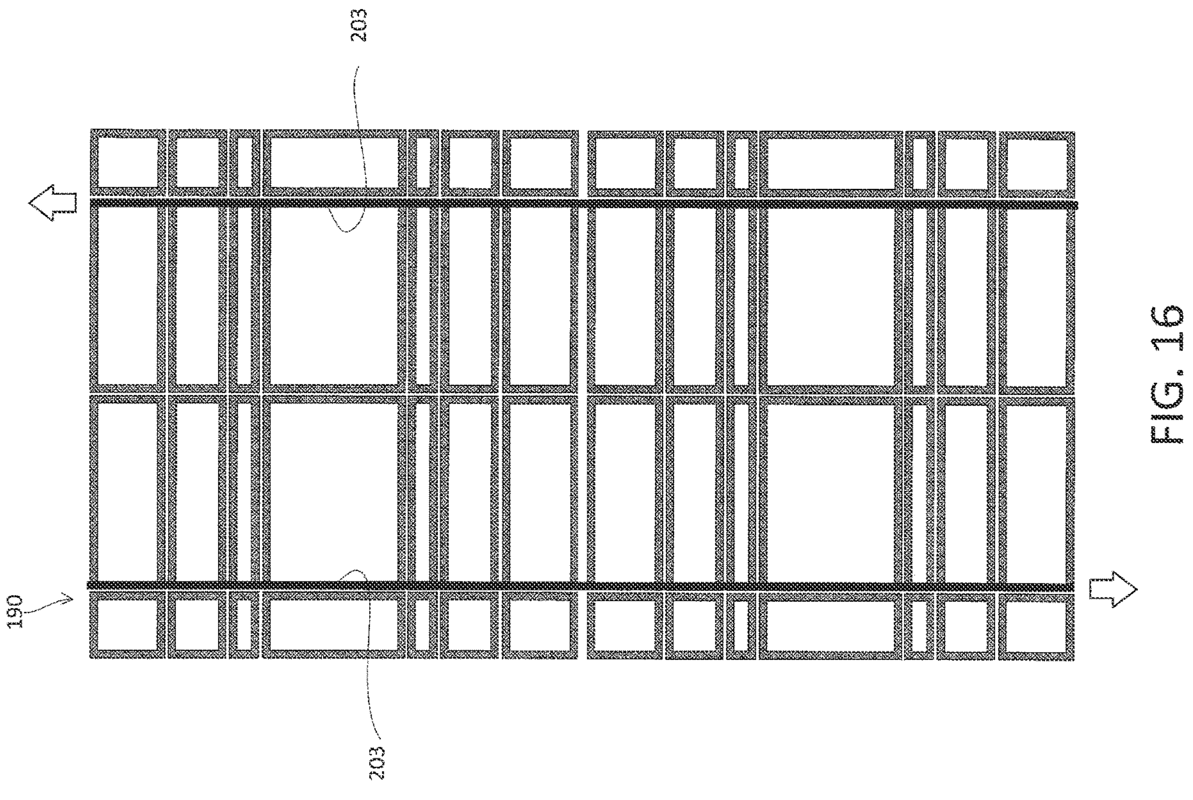
FIG. 16 shows flows of currents equivalent to those in the correction coil shown in FIG. 15.

FIGS. 15 and 16 show an example of forming a coil at the circular portion of the first coil group 160 in the Z-axis direction shown in FIG. 10 using a flexible printed board. As shown in FIG. 15, counterclockwise currents flow through current paths 202 indicated by black lines, but no current flows to current paths 200 indicated by gray lines. At this time, in consideration that the currents that are adjacent to each other and flow in the opposite directions cancel each other, this is equivalent to a case where currents flow through virtual current paths 203 shown in FIG. 16.

Figure 17:
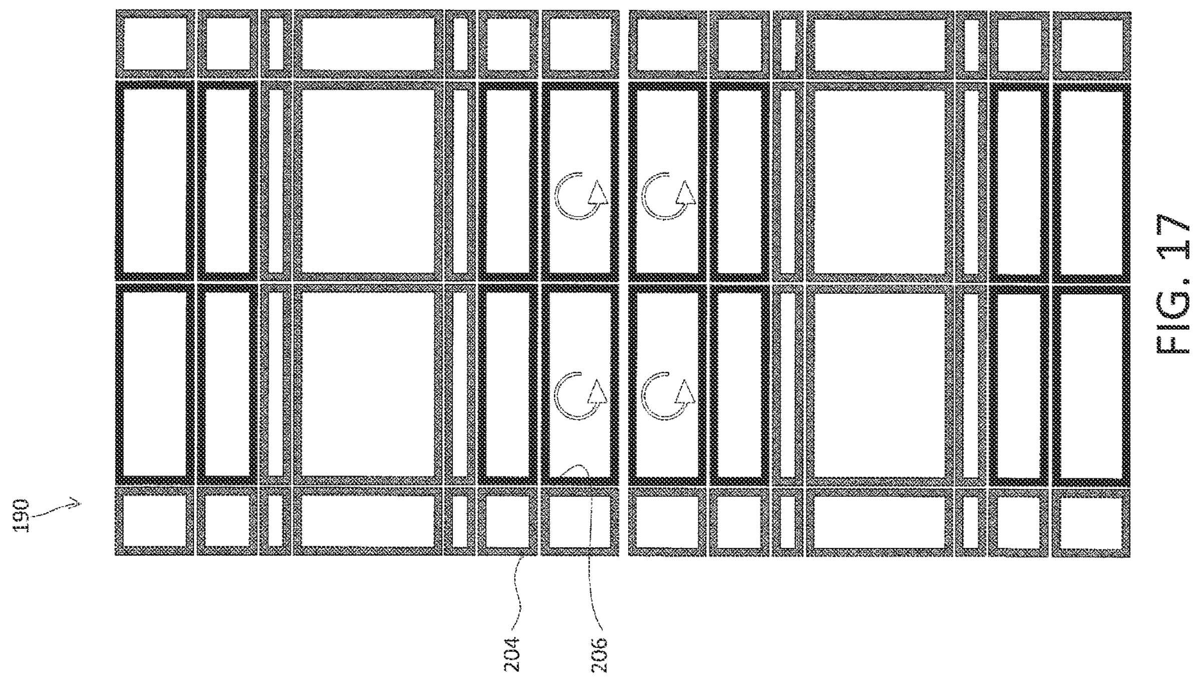
FIG. 17 shows another example of currents flowing in the correction coil.
Figure 18:
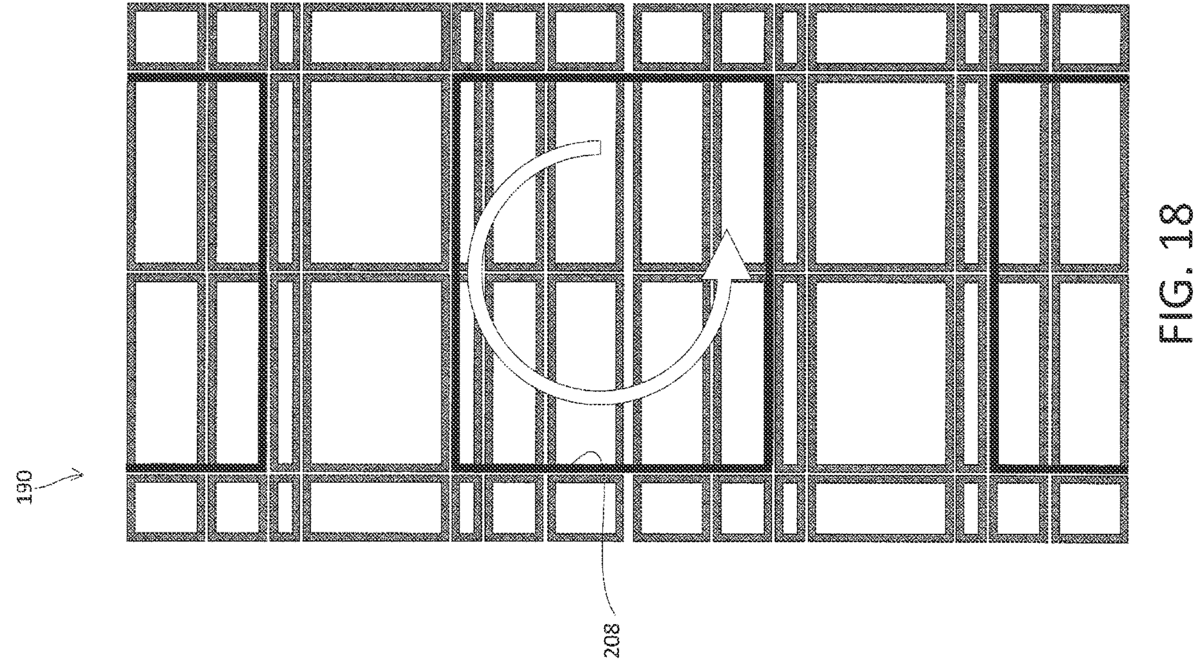
FIG. 18 shows flows of currents equivalent to those in the correction coil shown in FIG. 17.

FIGS. 17 and 18 show an example of forming the outermost coil of the first coil group 140 in the Y-axis direction shown in FIG. 8 using a flexible printed board. As shown in FIG. 17, counterclockwise currents flow through current paths 206 indicated by black lines, but no current flows to current paths 204 indicated by gray lines. At this time, in consideration that the currents that are adjacent to each other and flow in the opposite directions cancel each other, this is equivalent to a case where currents flow through virtual current paths 208 shown in FIG. 18.

As described above, on a flexible printed board, various current paths can be formed, including a current path going back around the outer periphery of the cylindrical surface about the central axis of the cylinder, and a current path going back on the cylindrical surface not about the central axis of the cylinder.

Figure 19:
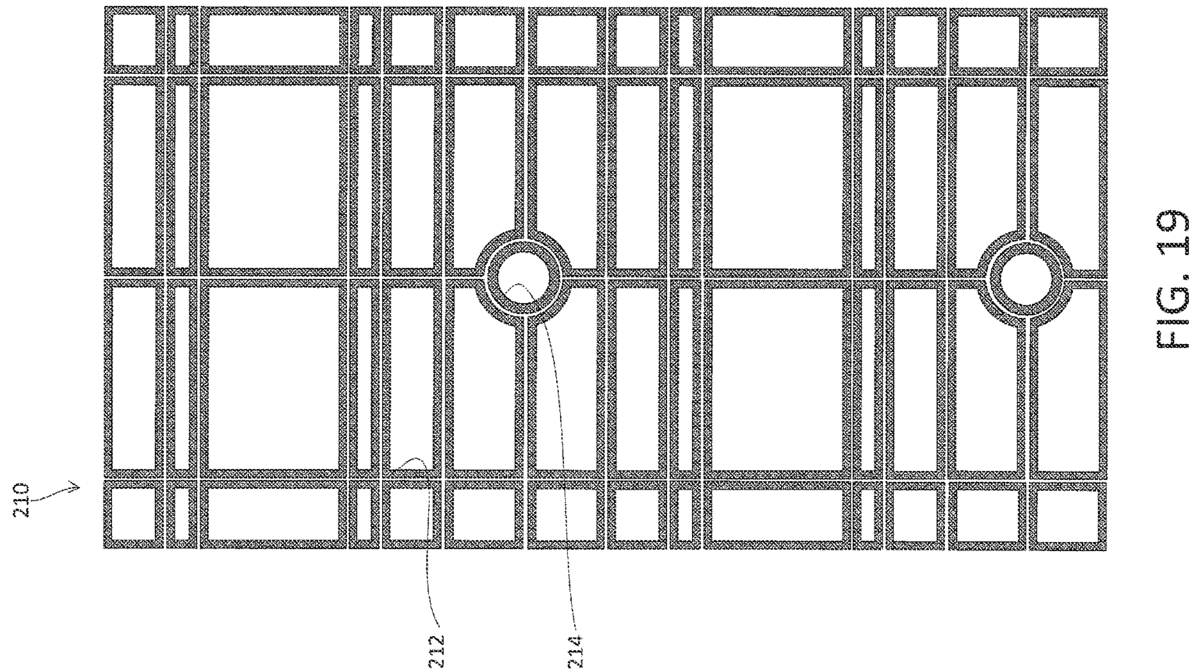
FIG. 19 shows another example of a correction coil using a flexible printed board.

In the developed diagram as shown in FIG. 13, on the flexible printed board, a pattern made up of rectangular current paths can be printed. Similar to a correction coil 210 shown in FIG. 19, a composite pattern that includes rectangular current paths 212 and circular current paths 214 can be printed. In the physics package 12, a laser light path, a vacuum-resistant optical window, and the like are provided around the wall surface of the vacuum chamber 20. Accordingly, it is effective to provide the circular current paths 214 and prevent interference. On the flexible printed board, the coils as shown in FIGS. 16 and 18 may be formed. Multiple flexible printed boards may be used in an overlaid manner. Thus, a portion or the entirety of the triaxial magnetic field correction coil may be formed using multiple boards.

On the flexible printed board, in some cases a minute amount of gas may be emitted from a resin of the insulator 194. Accordingly, for the insulator 194, a material with a small amount of gas emission, such as polyimide resin, is selected. It is conceivable that a production step performs a baking process at an appropriate temperature, in addition to a deaeration process, a defoaming process, a cleaning process, and the like.

The triaxial magnetic field correction coil formed of a flexible printed board may be installed in the vacuum chamber 20 in various forms. For example, it is conceivable that the triaxial magnetic field correction coil is installed around the inner wall of the main body 22 in a state of being cylindrically bent, and the triaxial magnetic field correction coil is fixed to the main body 22 with a fastener that presses the coil against the main body 22. Alternatively, installation may be done by attaching to the holder 180. Instead of the holder 180 having the sparse structure, a holder that has a dense structure with not many pores may be adopted so as to support the flexible printed board on a plane.

On the other hand, a current path disengaged from the cylindrical surface may be separately formed using a covered conductor wire. Alternatively, by changing the structure of the holder, a current path disengaged from the cylindrical surface may also be created by adopting the flexible printed board.

In comparison with the triaxial magnetic field correction coil 96 with the covered conductor wire being wound, the triaxial magnetic field correction coil using the flexible printed board has advantages that facilitate attachment to the vacuum chamber 20, and improve production reproducibility and production yield.

Note that the coil shape of the triaxial magnetic field correction coil may be configured in various other forms. For example, for each of the three axes, a large-sized circular coil is arranged at the middle of two circular coils, thus enabling formation of a Maxwell type triaxial magnetic field correction coil. For the Maxwell type triaxial magnetic field correction coil, the components of the constant term, the first order spatial derivative term, and the second order spatial derivative term of the magnetic field can be corrected.

Furthermore, for each of the three axes, small circular coils that have a predetermined size and are provided at predetermined intervals are arranged outside of a pair of large circular coils that have a predetermined size and are provided at predetermined intervals, thus enabling formation of a tetra type axial magnetic field correction coil. The components of the constant term, the first order spatial derivative term, the second order spatial derivative term, and the third order spatial derivative term of the triaxial magnetic field correction coil can be corrected.

The axial magnetic field correction coil described above has a spherical shape or a slightly distorted spherical shape as a whole. Accordingly, in particular, attachment to the inner wall of the substantially spherical vacuum chamber or therearound enables effective utilization of the inner space of the vacuum chamber.

Figure 20:
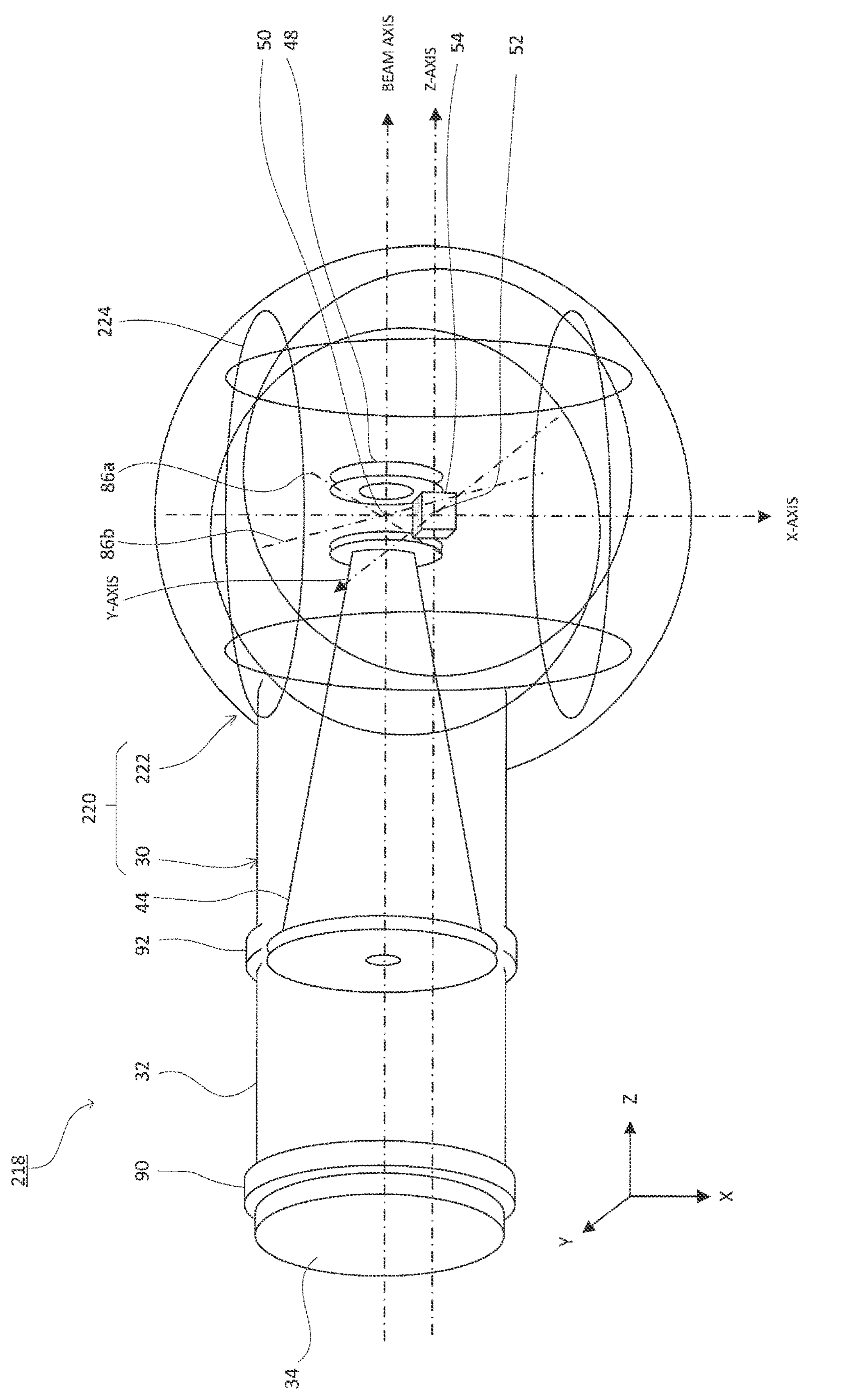
FIG. 20 shows a physics package that includes a spherical vacuum chamber.

FIG. 20 is a diagram corresponding to FIG. 4, and schematically shows the appearance and the inside of a physics package 218. Components identical or corresponding to those in FIG. 4 are assigned the same or corresponding symbols. A vacuum chamber 220 of the physics package 218 is made up of a substantially spherical main body 222, and a protruding portion 30.

In the main body 222, a triaxial magnetic field correction coil 224 made up of circular coils is provided centered in the clock transition space 52. To simplify the diagram, FIG. 20 only shows a pair of Helmholtz-type coil in each axis direction. In actuality, one or more non-Helmholtz-type coils are assumed to be further provided on each axis. The outer edge of the triaxial magnetic field correction coil 224 can be configured to form a substantially spherical surface. Accordingly, by installing the triaxial magnetic field correction coil 224 in the substantially spherical main body 222 around the inner wall, interference with the other components installed in the inner space of the main body 222 can be prevented, and design flexibility is improved.

Likewise, the triaxial magnetic field correction coil may be constructed using square coils. Similar to the circular coils, there may be adopted a Helmholtz type triaxial magnetic field correction coil including each pair of square coils, a Maxwell type triaxial magnetic field correction coil including three square coils, a tetra type triaxial magnetic field correction coil including two pair of square coils, and the like. These triaxial magnetic field correction coils have a cubic shape or a slightly distorted cubic shape as a whole. Accordingly, attachment to the inner wall or the inner wall surface of the substantially-cubic-shaped or substantially-cuboid-shaped vacuum chamber enables effective utilization of the inner space of the vacuum chamber.

Figure 21:
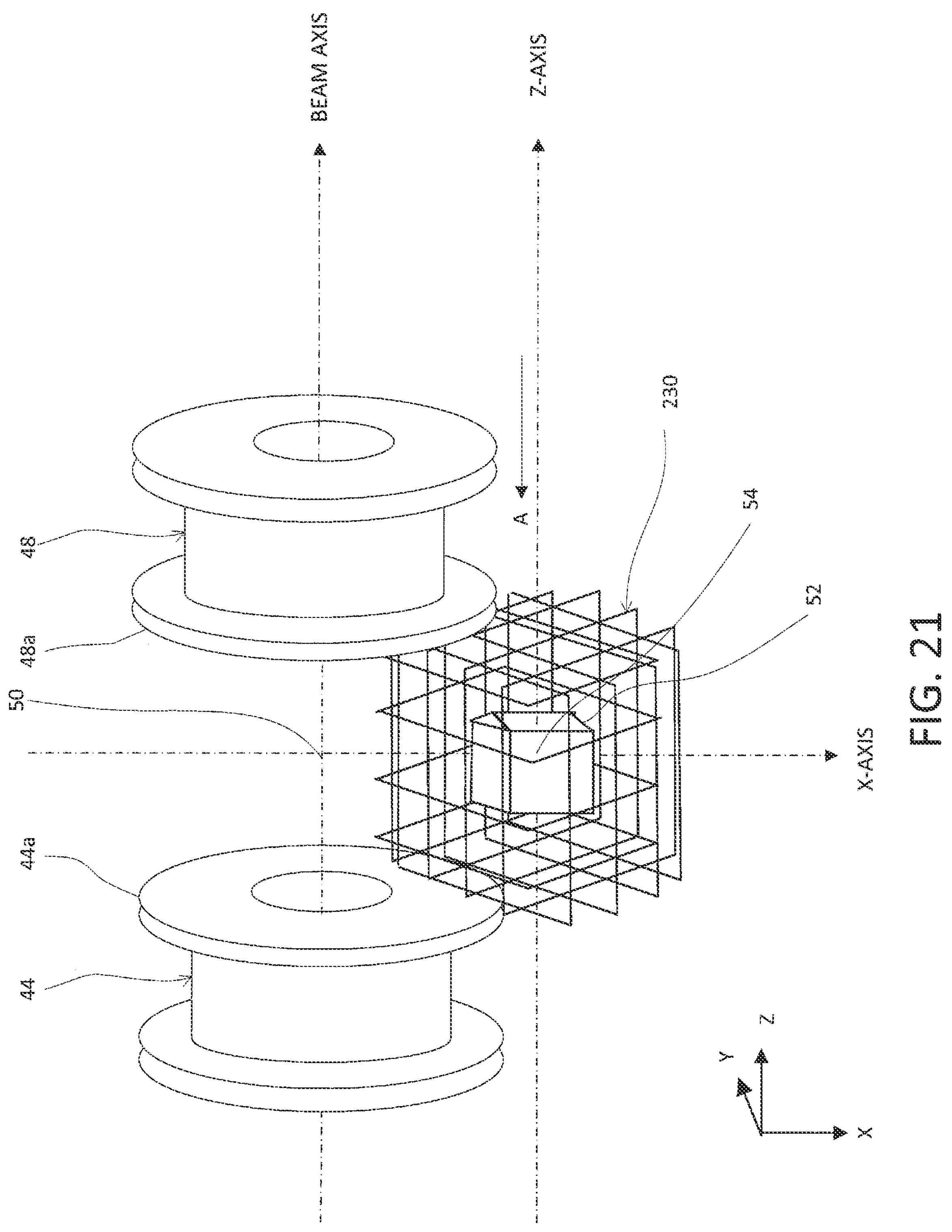
FIG. 21 shows another installation example of a triaxial magnetic field correction coil.

The triaxial magnetic field correction coil may be attached to a position closer to the clock transition space 52 than to the inner wall of the main body 22. FIG. 21 schematically shows the inside of the optical resonator 46 shown in FIG. 2 and therearound. Note that in FIG. 21, instead of the triaxial magnetic field correction coil 96 in FIG. 2, a cubic-shaped triaxial magnetic field correction coil 230 is provided at a space between the coil 44 for the Zeeman slower and the coil 48 for the MOT device. The cubic-shaped triaxial magnetic field correction coil 230 is arranged centered in the clock transition space 52 in the cryostat reservoir 54. The cubic-shaped triaxial magnetic field correction coil 230 is formed of two pairs of coil groups made up of square coils in each of the three-axis directions. One pair among the two pairs of coil groups is a Helmholtz-type coil, and the other pair is a non-Helmholtz-type coil. In a case where the magnitudes and directions of currents are not specifically limited, the cubic-shaped triaxial magnetic field correction coil 230 can compensate the magnetic field component up to the third order spatial derivative term. Alternatively, in a case where currents having the same magnitude flow in the same direction similar to the case of the non-Helmholtz-type coils of the triaxial magnetic field correction coils 96 shown in FIGS. 5 to 11, the magnetic field component up to the second order spatial derivative term can be simply compensated.

In comparison with the triaxial magnetic field correction coils 96 shown in FIGS. 5 to 11, the triaxial magnetic field correction coil 230 is significantly small sized, and is close to the clock transition space 52. Accordingly, the magnetic field formed in the clock transition space 52 varies in a relatively small spatial scale. However, the triaxial magnetic field correction coil 230, through the Helmholtz-type coil, can compensate the constant term and the first order spatial derivative term over a relatively large range. At least the magnetic field component of the second order spatial derivative term can be compensated through the non-Helmholtz-type coil. Consequently, the magnetic field of the clock transition space 52 is uniformly nullified with sufficiently high accuracy. Since the triaxial magnetic field correction coil 230 is at a position close to the clock transition space 52, the current caused to flow to form the magnetic field can be significantly small, thereby achieving excellent power saving capability.

Figure 22:
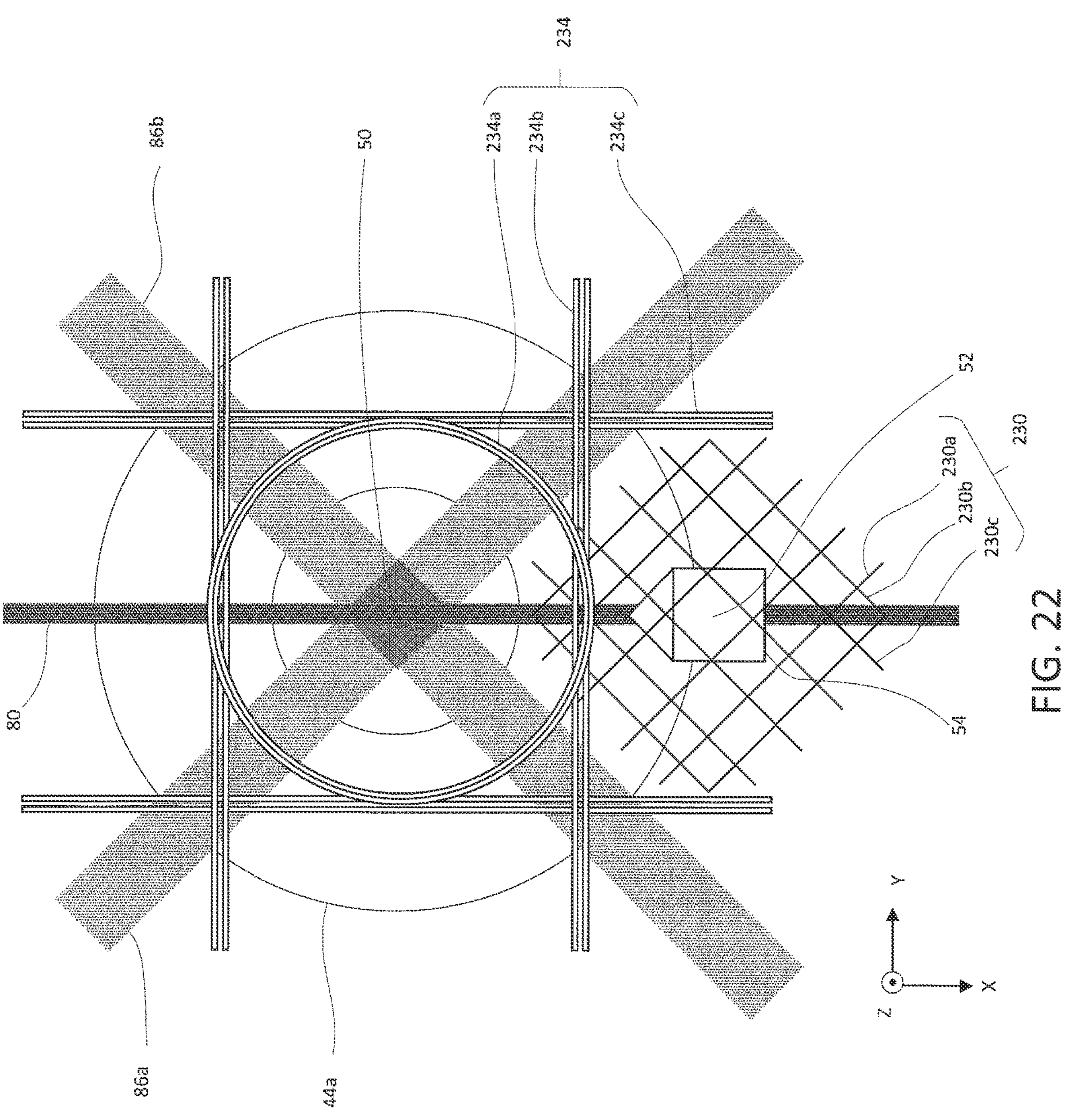
FIG. 22 illustrates a mode of supporting the triaxial magnetic field correction coil shown in FIG. 21.

FIG. 22 is a side view from a direction A in FIG. 21. As shown in FIG. 22, the capture space 50 is irradiated with two MOT optical beams 86*a* and 86*b* that are perpendicular to the Z-axis and inclined by 45 degrees from the X-axis and the Y-axis. Also in the direction perpendicular to the sheet, a MOT optical beam 84 is emitted. To adjust the gradient magnetic field formed in and around the capture space 50, a bias coil 234 is arranged centered in the capture space 50. The bias coil 234 includes: a pair of Helmholtz type circular coils 234*a* that face each other along the beam axis; a pair of Helmholtz type square coils 234*b* that face each other along the X-axis; and a pair of Helmholtz type square coils 234*c* that face each other along the Y-axis. The bias coil 234 corrects the gradient magnetic field to a desired distribution by adjusting the constant term component or the first order spatial derivative term component through the coils in each axis.

In the X-axis passing through the capture space 50, the optical lattice light beam 80 is emitted. The cryostat reservoir 54 including the clock transition space 52 is provided on the optical lattice light beam 80. The triaxial magnetic field correction coil 230 is provided centered in the clock transition space 52 around the cryostat reservoir 54. The triaxial magnetic field correction coil 230 includes: a coil group 230*b* whose plane has a normal in parallel with the Z-axis; and two coil groups 230*a* and 230*c* whose planes have a normal perpendicular to the Z-axis and are inclined from the X-axis and the Y-axis by 45 degrees. That is, the triaxial magnetic field correction coil 230 is arranged in a state where a cubic shape along the X-axis, the Y-axis, and the Z-axis is rotated about the Z-axis by 45 degrees.

The triaxial magnetic field correction coil 234 is supported by flanges 44*a* and 48*a* that are support members supporting the MOT device. Accordingly, the triaxial magnetic field correction coil 230 must be arranged close to the capture space 50 at the center of the MOT device. Meanwhile, the triaxial magnetic field correction coil 230 must be arranged so as to prevent interference with the MOT optical beams 86*a* and 86*b* passing through the capture space 50.

The triaxial magnetic field correction coil 230 is constructed in a cubic shape using wires arranged along the Z-axis and along the propagation directions of the MOT laser beams 86*a* and 86*b*.

The triaxial magnetic field correction coil 230 includes a Helmholtz-type coil and a non-Helmholtz-type coil in each axis direction. Equalization of the magnetic field in a large space that includes correction of the higher order spatial derivative terms can be achieved.

Accordingly, also in the X-axis direction that is the direction of the optical lattice light beam 80, the magnetic field can be corrected with high accuracy.

Note that the triaxial magnetic field correction coil 230 does not enclose the capture space 50. Accordingly, the magnetic field in the capture space 50 cannot be corrected. Accordingly, as described above, the bias coil 234 that corrects the gradient magnetic field is provided in the capture space 50.

FIGS. 21 and 22 exemplify the triaxial magnetic field correction coil 230 made of square coils. However, for example, coils having other shapes, such as circular coils instead of the square coils, may be adopted. For example, the cylindrical-shaped triaxial magnetic field correction coil 96 shown in FIGS. 5 to 11 may be adopted.

The triaxial magnetic field correction coil may be provided to each of a position close to the clock transition space 52 and a position around the inner wall of the main body 22. For example, it is conceivable that a Helmholtz-type coil may be provided around the inner wall of the main body 22, and a non-Helmholtz-type coil may be provided at a position close to the clock transition space 52. By providing the non-Helmholtz-type coil at the position close to the clock transition space 52, a magnetic field having a large curvature can be easily corrected.

(4) Adjustment of Magnetic Field Correction Coil

Adjustment of the magnetic field by the triaxial magnetic field correction coil is described. To correct the magnetic field, the magnetic field distribution is periodically observed around the clock transition space 52, and when a non-uniform magnetic field distribution is identified, the currents through the triaxial magnetic field correction coil 96 are operated so as to cancel the magnetic field distribution. The magnetic field distribution is observed by moving the atom population confined in the optical lattice by means of the moving optical lattice. These operations embody a situation where the individual atoms included in the atom group are always in a zero magnetic field.

Figure 23A:
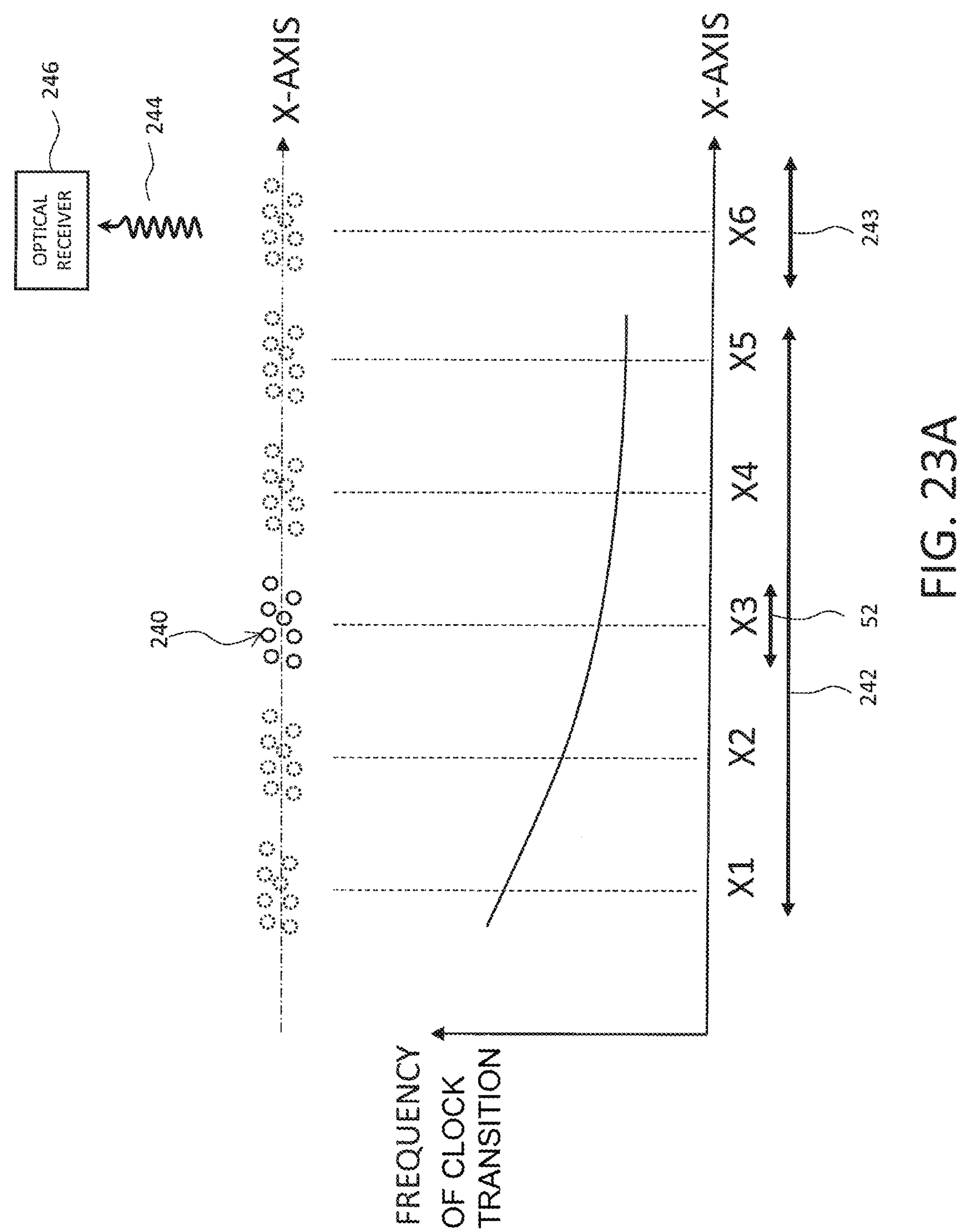
FIG. 23A schematically shows a mode of correcting magnetic fields.
Figure 23B:
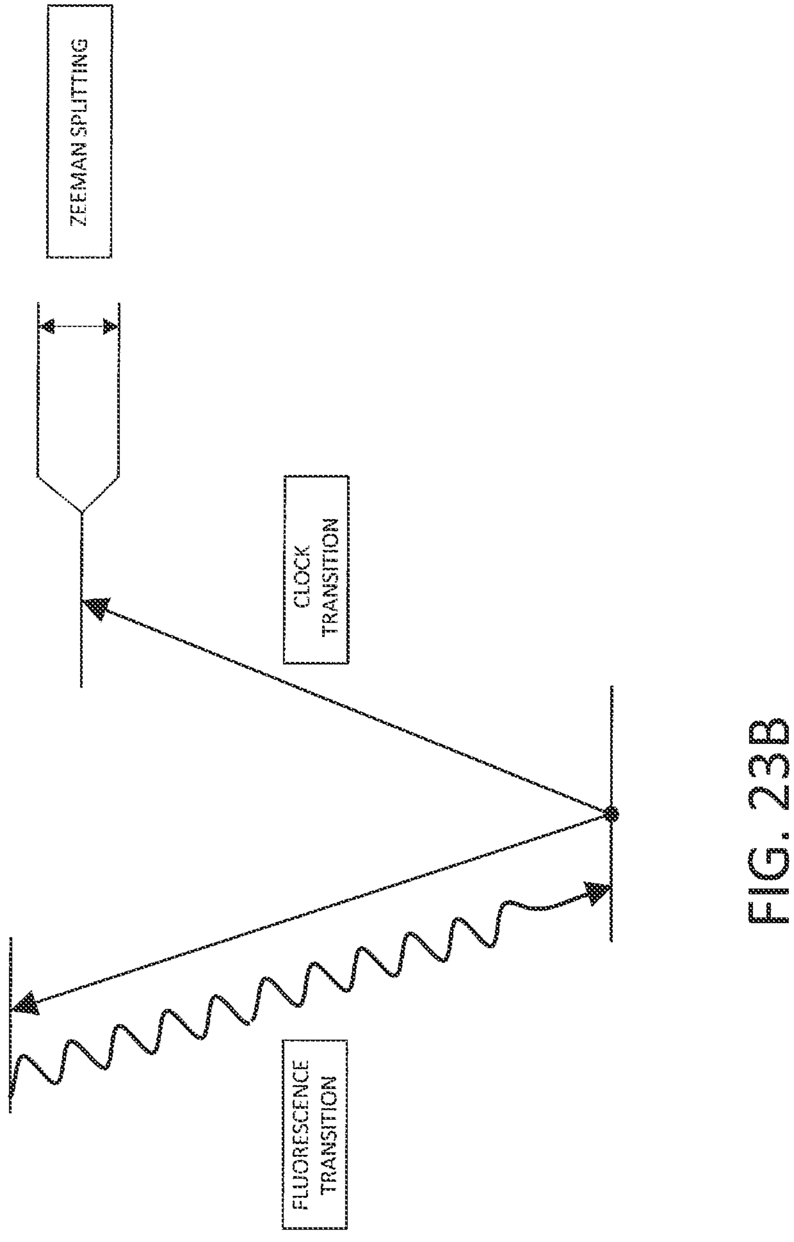
FIG. 23B schematically shows a mode of correcting magnetic fields.

FIGS. 23A and 23B schematically show a process of adjusting the triaxial magnetic field correction coil. FIG. 23A shows a state of moving an atom population 240 confined in the moving optical lattice along the X-axis. FIG. 23B shows the relationship between the fluorescence transition and the clock transition.

As shown in FIG. 23A, the atom population 240 is confined in the lattices sequential in the X-axis direction with a certain spatial extent. In the diagram, representative positions on the X-coordinate where the atom population 240 moves are represented as a position X1, a position X2, a position X3, a position X4, a position X5, and a position X6. These are positions set in the correction space 242 set for correcting the magnetic field. The correction space 242 is set over a wide range including the clock transition space 52 that performs actual measurement. The embodiment adopts the one-dimensional lattice with the optical lattice extending in the X-axis direction, and the atom population 240 ranges in a manner extending in the X-axis direction. It is particularly intended to highly accurately nullify the magnetic field in the X-axis direction. The correction space 242 is set over an extent in the X-axis direction. Note that in a case where the optical lattice is two-dimensionally formed, it is desirable to set a correction space obtained by extending the clock transition space 52 two-dimensionally. In a case where the optical lattice is three-dimensionally formed, it is desirable to set a correction space obtained by extending the clock transition space 52 three-dimensionally.

At each position in the moved correction space 242, the atom population 240 is irradiated with laser light for exciting clock transition, and the clock transition is excited. The frequency of the laser light is swept, and the frequency of clock transition is measured at each position. The electron shelving method is used to observe the excitation rate of clock transition. The electron shelving method excites clock transition and subsequently moves the atoms to a fluorescent observation space 243. As shown in FIG. 23A, by emitting light of fluorescence transition, the atoms emit fluorescent light 244 dependent on the excitation rate. The fluorescent light is observed by an optical receiver 246. The clock transition is subjected to Zeeman splitting depending on the magnitude of the magnetic field at each position.

Accordingly, the magnetic field distribution at each position is obtained from information on the Zeeman splitting. The thus obtained frequency distribution is shown in the lower part of FIG. 23A. According to this method, the magnetic field can be measured even at a location where no fluorescent light can be observed (in a cryo head, etc.). Instead of the electron shelving method, a non-destructive measurement method using a measurement of phase shifts of atoms can be applied to the measurement of the excitation rate of clock transition.

Figure 24:
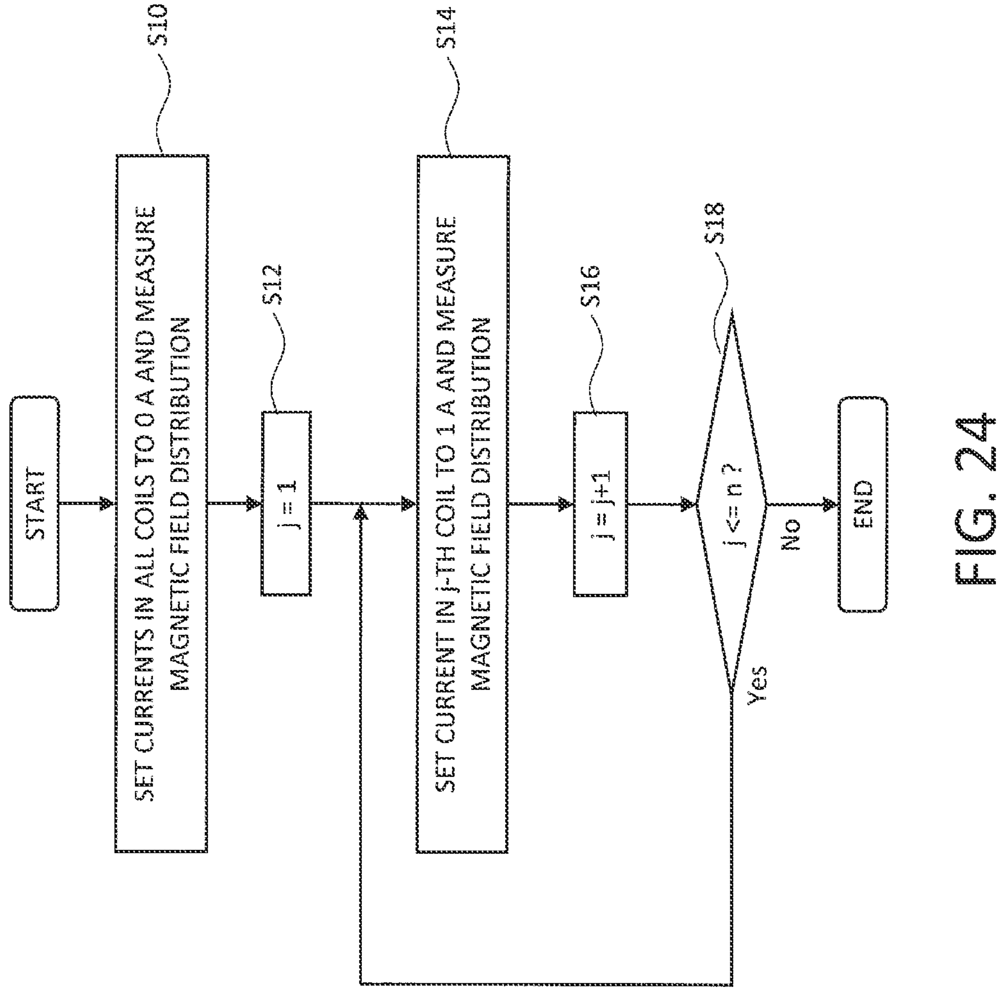
FIG. 24 is a flowchart of calibration of the triaxial magnetic field correction coil.
Figure 25:
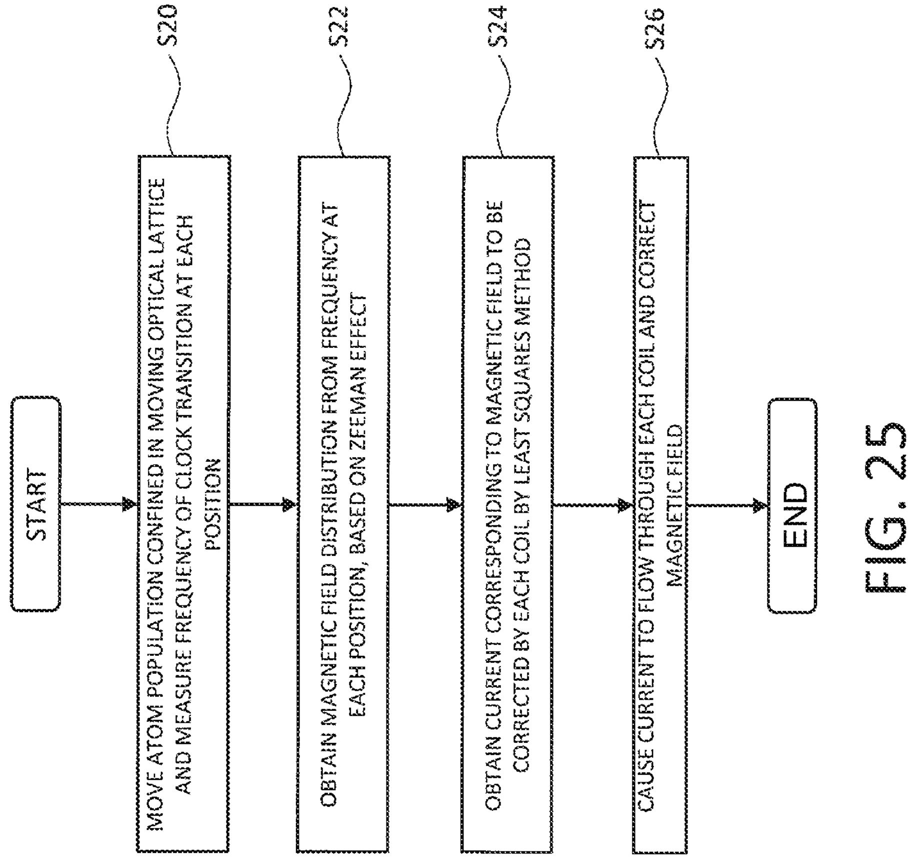
FIG. 25 is a flowchart showing procedures of correcting the triaxial magnetic field correction coil.

FIGS. 24 and 25 are flowcharts illustrating procedures for correcting the magnetic field by the triaxial magnetic field correction coil. First, according to the procedures shown in FIG. 24, calibration is performed. In calibration, currents in all the coils constituting the triaxial magnetic field correction coil are stopped (set to 0 A), and the distribution of the magnetic field in the three-axis directions is measured (S10). As for the magnetic field measurement, for example, the magnetic fields in the three-axis directions are measured using a magnetic sensor, such as a small-sized coil or a Hall element. The measured magnetic field represents the value of the background in a state where the triaxial magnetic field correction coil is not used. Next, currents having the same magnitude (1 A in FIG. 24) are caused to flow through all the coils (n coils, where j is any integer coil less than or equal to n), and the magnetic field distributions in the three-axis directions are measured using the magnetic field sensor or the like (S12 to S18). By subtracting the background magnetic field from the obtained magnetic field distribution, a basic magnetic field formed by the current of 1 A in each coil can be obtained.

The calibration may measure the magnetic field of the correction space 242. However, the correction space 242 is in the cryostat reservoir 54. Accordingly, it is not always easy to install a magnetic sensor. Accordingly, the magnetic field may be measured adjacent to the correction space 242, and the magnetic field may be estimated based on a result of an electromagnetic field simulation combined therewith. The magnetic field may be measured in the atmosphere instead of a vacuum. Accordingly, the basic magnetic field distribution formed by each coil of the triaxial magnetic field correction coil with a current of 1 A may be grasped. In principle, it is sufficient to perform the calibration once at a stage of creating the physics package 12.

Next, according to the procedures shown in FIG. 25, the magnetic field is corrected. First, as described above, the atom population 240 is moved by the moving optical lattice, and the frequency of clock transition is measured at each position in the correction space 242 (S20). The effect of Zeeman splitting is estimated, thus obtaining the magnetic field distribution in the correction space 242 (S22). The magnetic field distribution is obtained as the absolute value of the magnetic field.

Subsequently, the current corresponding to the magnetic field to be corrected by each coil is determined using an optimization method, such as the least squares method (S24). That is, there is obtained the superimposition coefficient such that the magnetic field formed in the correction space 242 is uniformly zero when the basic magnetic fields formed by the respective coils are superimposed. Note that as described above, in the case of using both the Helmholtz-type coil and the non-Helmholtz-type coil, first, the optimal superimposition coefficients for the higher order spatial derivative terms generated by the non-Helmholtz-type coil are obtained through the least squares method or the like. Next, the optimal superimposition for the constant term and the first order spatial derivative term generated by the Helmholtz-type coil is obtained by the least squares method or the like. Accordingly, calculation is simplified, and the calculation accuracy is improved. The obtained superimposition coefficients indicate the direction and magnitude of the current caused to flow to each coil. The obtained currents are caused to flow to the triaxial magnetic field correction coil, thereby enabling correction of the magnetic fields of the three axes (S26).

The correction indicated in FIG. 25 is not necessarily frequently performed under a normal condition where the magnetic field varied little. For example, in a case where clock transition is repetitively measured in the clock transition space 52, it is sufficient to perform the correction shown in FIG. 25 every predetermined number of times. It is conceivable that in the case where the clock transition is measured in the clock transition space 52, the magnitude of Zeeman splitting is always verified, and when the magnitude becomes a predetermined value or more, the correction shown in FIG. 25 is performed.

In a case where the magnetic field of the triaxial magnetic field correction coil is corrected for the range of the correction space 242, it is expected to stably and uniformly nullify the magnetic field of the clock transition space 52, in comparison with the case for the range of the clock transition space 52. For example, it is conceivable that this is because fine-scale disturbances, such as a slight fluctuation of the magnetic field, the error of magnetic field measurement, and the error of the basic magnetic field of each coil, affect the case where only a narrow space, such as the clock transition space 52, is adopted as a target. In actuality, in an experiment, the correction space 242 is adopted as a target and corrected, and a result of improving the accuracy is obtained.

In the example shown in FIGS. 23A and 25, using the moving optical lattice, the atom population 240 is moved to each place in the correction space 242. On the other hand, FIG. 26 schematically shows an example of measuring the magnetic field distribution in the correction space 242 at one time.

Figure 26:
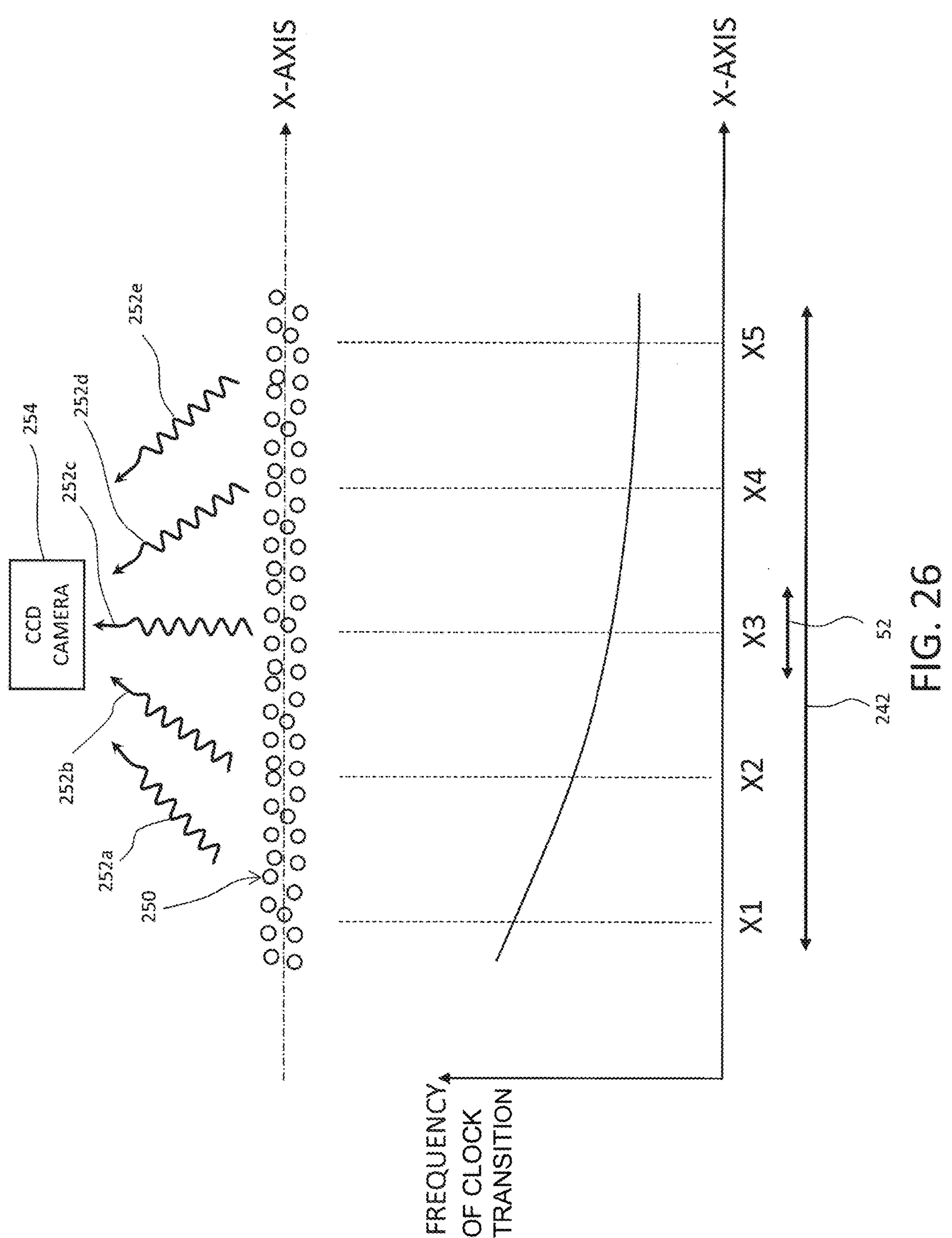
FIG. 26 schematically shows another mode of correcting magnetic fields.

In FIG. 26, the atom population 250 is confined in the optical lattice over the entire area of the correction space 242. The fluorescent light beams 252*a*, 252*b*, 252*c*, 252*d*, and 252*e* of the atom population 250 are received at one time with spatial position information being left, by a CCD camera 254, and the frequencies are obtained. Accordingly, the magnetic field distribution of the correction space 242 is immediately obtained.

(5) Individual Magnetic Field Compensation Coil

As described in the aforementioned (1), for the Peltier element (refrigerator 58), which is a large current device, the individual magnetic field compensation coil 102 for the refrigerator is provided, and compensates the magnetic field in the clock transition space 52. For the heater of the atomic oven 40, the individual magnetic field compensation coil 104 for the atomic oven is provided, and compensates the magnetic field in the clock transition space 52. In a case of compensating the entire large stray magnetic field from the large current device by the triaxial magnetic field correction coil, it is necessary to increase the order of the triaxial magnetic field correction coil, and to increase the current. Accordingly, it is effective to provide individual magnetic field compensation coils to compensate the magnetic field. Here, the individual magnetic field compensation coil 102 for the refrigerator is exemplified and described in detail.

Figure 27:
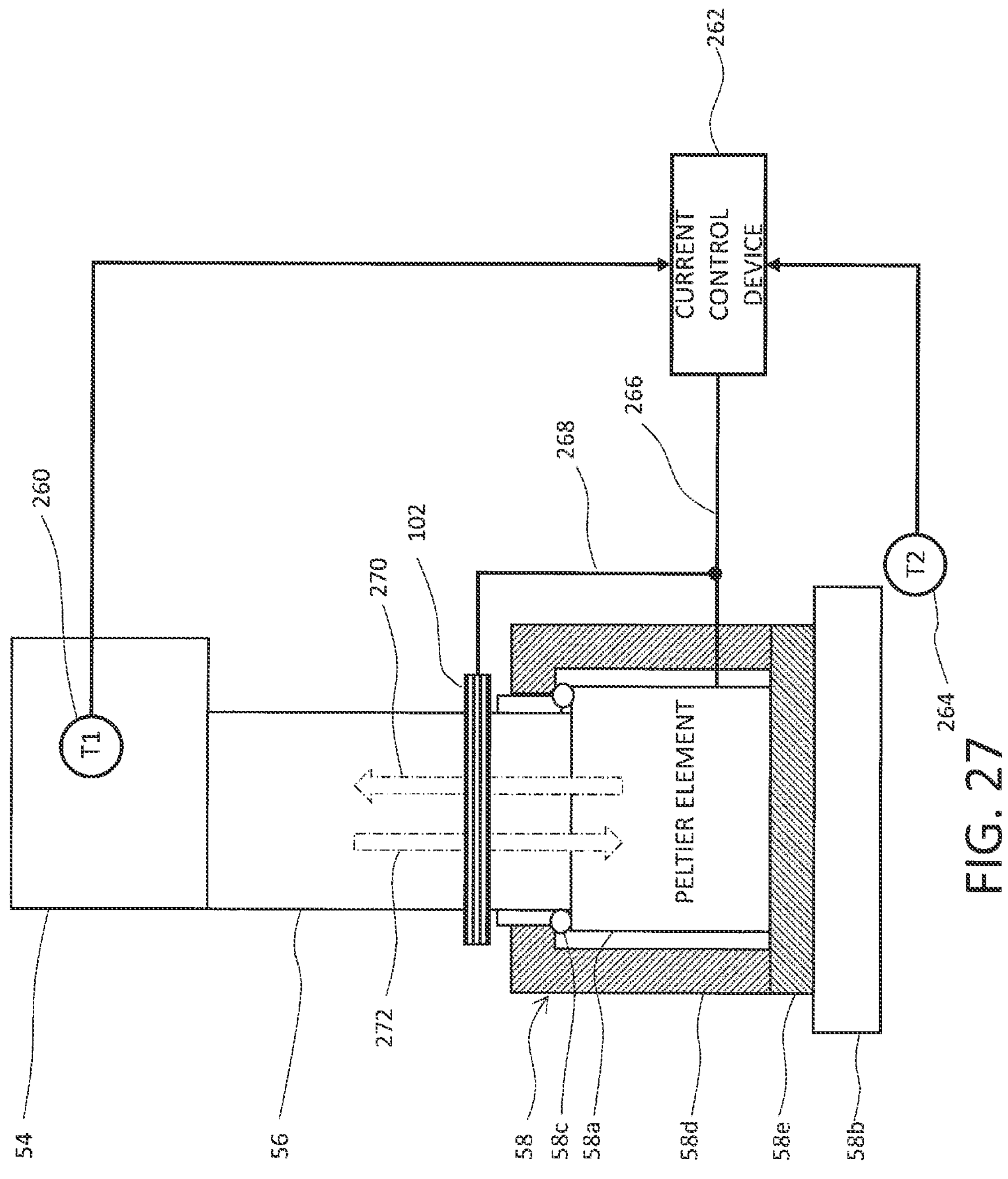
FIG. 27 shows compensation of a stray magnetic field in a refrigerator.

FIG. 27 schematically shows example configurations of the cryostat reservoir 54, the thermal link member 56, the refrigerator 58, and the individual magnetic field compensation coil 102 for the refrigerator. The cryostat reservoir 54 is a hollow component that encloses the clock transition space 52. Although not shown, an opening for allowing optical lattice light to pass therethrough internally is provided along the X-axis on the wall portion of the cryostat reservoir 54. The cryostat reservoir 54 is made of oxygen-free copper having high thermal conductivity or the like.

The thermal link member 56 is attached to the cryostat reservoir 54. The thermal link member 56 is a member that serves as a support structure that supports the cryostat reservoir 54 and also as a path that removes heat from the cryostat reservoir 54. The thermal link member 56 is also made of oxygen-free copper having high thermal conductivity or the like.

The refrigerator 58 includes a Peltier element 58*a*, a radiator plate 58*b*, a heat-insulating member 58*c*, and permalloy magnetic field shields 58*d* and 58*e*. The Peltier element 58*a* is connected to the thermal link member 56, and removes heat from the thermal link member 56 with current flowing therethrough. The radiator plate 58*b* is a member made of oxygen-free copper having high thermal conductivity or the like. The radiator plate 58*b* is provided on the outer wall of the vacuum chamber 20, and radiates heat transmitted from the Peltier element 58*a* to the outside of the vacuum chamber 20.

The heat-insulating member 58*c* secures the heat insulation between the permalloy magnetic field shield 58*d* and the thermal link member 56. The heat-insulating member 58*c* is made of a member, such as of silica having low thermal conductivity, and is spherically formed in order to reduce the number of contacts between the permalloy magnetic field shield 58*d* and the thermal link member 56. The permalloy magnetic field shield 58*e* is a magnetic field shield, and is made of permalloy, which has high thermal conductivity and high permeability. The permalloy magnetic field shield 58*e* is provided between the Peltier element 58*a* and the radiator plate 58*b*, and transmits heat from the Peltier element 58*a* to the radiator plate 58*b*.

A temperature sensor 260 that includes a thermocouple, a thermistor, or the like is provided in the cryostat reservoir 54, and inputs a measured temperature T1 into the control device 262. A temperature sensor 264 is provided at or around the radiator plate 58*b*, and inputs a measured temperature T2 into the control device 262.

The control device 262 controls current so as to keep the temperature T1 of the cryostat reservoir 54 at a certain low temperature (e.g., 190K). The control is performed, for example, according to PID (Proportional Integral Differential) control in consideration also of the temperature T2 on the radiator plate 58*b* side. The determined current is caused to flow to the Peltier element 58*a* through a current path 266.

The Peltier element 58*a* is a thermoelectric element that moves heat depending on the flowing current. By causing the current to flow, the Peltier element 58*a* removes heat from the thermal link member 56 (and from the low cryostat reservoir 54 connected to the thermal link member 56) on the low temperature side, and releases the heat to the permalloy magnetic field shield 58*e* (and to the radiator plate 58*b* connected to the permalloy magnetic field shield 58*e*) on the high temperature side.

Through the Peltier element 58*a*, a large current of, for example, about several amperes is caused to flow. Accordingly, a large magnetic field is generated. The greater portion of the Peltier element 58*a* is covered with the permalloy magnetic field shield 58*d* and the permalloy magnetic field shield 58*e*, which are of the high permeability material. Accordingly, most of the generated magnetic field flows in these members, and is not leaked to the outside. However, in view of thermal conduction, a magnetic field cannot be provided between the thermal link member 56 and the Peltier element 58*a*. Accordingly, the stray magnetic field 270 occurs. The stray magnetic field 270 disturbs the magnetic field in the clock transition space 52 in the cryostat reservoir 54.

In the embodiment, the individual magnetic field compensation coil 102 for the refrigerator is provided around the thermal link member 56 serving as an opening portion where the magnetic field cannot be shielded. The individual magnetic field compensation coil 102 for the refrigerator generates a compensation magnetic field 272 when a current flows.

The current is caused to flow to the individual magnetic field compensation coil 102 for the refrigerator by a current path 268 branched off the current path 266. That is, the Peltier element 58*a* and the individual magnetic field compensation coil 102 for the refrigerator have a relationship of being connected to the same current path in parallel. The electrical resistance of the Peltier element 58*a* and the electrical resistance of the individual magnetic field compensation coil 102 for the refrigerator may be assumed to have constant values in a temperature environment where measurement is performed, although the values vary slightly. Consequently, the current that flows from the control device 262 to the current path 266 is distributed to the Peltier element 58*a* and the individual magnetic field compensation coil 102 for the refrigerator at constant ratios.

When the current flowing through the Peltier element 58*a* increases, the current flowing through the individual magnetic field compensation coil 102 for the refrigerator increases proportionally. Accordingly, when the stray magnetic field 270 from the Peltier element 58*a* increases, the compensation magnetic field 272 generated by the individual magnetic field compensation coil 102 for the refrigerator increases in the same manner. The individual magnetic field compensation coil 102 for the refrigerator is formed so as to compensate the stray magnetic field 270 in the clock transition space 52 in the cryostat reservoir 54 (so as to generate a magnetic field having the same magnitude in the opposite direction) when a current having a certain magnitude flows through the current path 266. Accordingly, even when the current varies, the magnetic field can be compensated. Note that the currents flow also through the current paths 266 and 268. However, the reciprocating currents flow close to each other through the current paths 266 and 268. Accordingly, the generated magnetic field is small, which causes no problem.

The arrangement of the current paths 266 and 268 may be regarded as compensation current control means for dynamically changing the current flowing through the individual magnetic field compensation coil 102 for the refrigerator depending on the stray magnetic field 270. The compensation current control means may be constructed in another manner. For example, there can be exemplified a mode where the control device 262 causes the current required by the computation to flow through the individual magnetic field compensation coil 102 for the refrigerator.

In the example shown in FIG. 27, it is assumed that the individual magnetic field compensation coil 102 for the refrigerator is formed of one coil wound around the thermal link member 56. According to this configuration, the individual magnetic field compensation coil 102 for the refrigerator is provided adjacent to the wall of the vacuum chamber 20, which can prevent the configuration around the cryostat reservoir 54 from being complicated. However, the installation location of the individual magnetic field compensation coil 102 for the refrigerator is not specifically limited. For example, it may be installed adjacent to the cryostat reservoir 54. In a case where the individual magnetic field compensation coil 102 for the refrigerator is installed adjacent to the cryostat reservoir 54, the individual magnetic field compensation coil 102 for the refrigerator can be reduced in size, and the power consumption can be reduced.

The individual magnetic field compensation coil 102 for the refrigerator is not necessarily formed of one coil, and may be formed of multiple coils. In a case where the distribution of the stray magnetic field in the clock transition space 52 is complicated, there is a possibility that use of multiple coils can achieve compensation in relatively simple manner. The current device, the individual magnetic field compensation coil, and the compensation current control means constitute the magnetic field compensation module. The magnetic field compensation module can achieve accurate magnetic field compensation. Accordingly, this module is applicable to various devices including the optical lattice clock 10.

(6) Zeeman Slower

Figure 28:
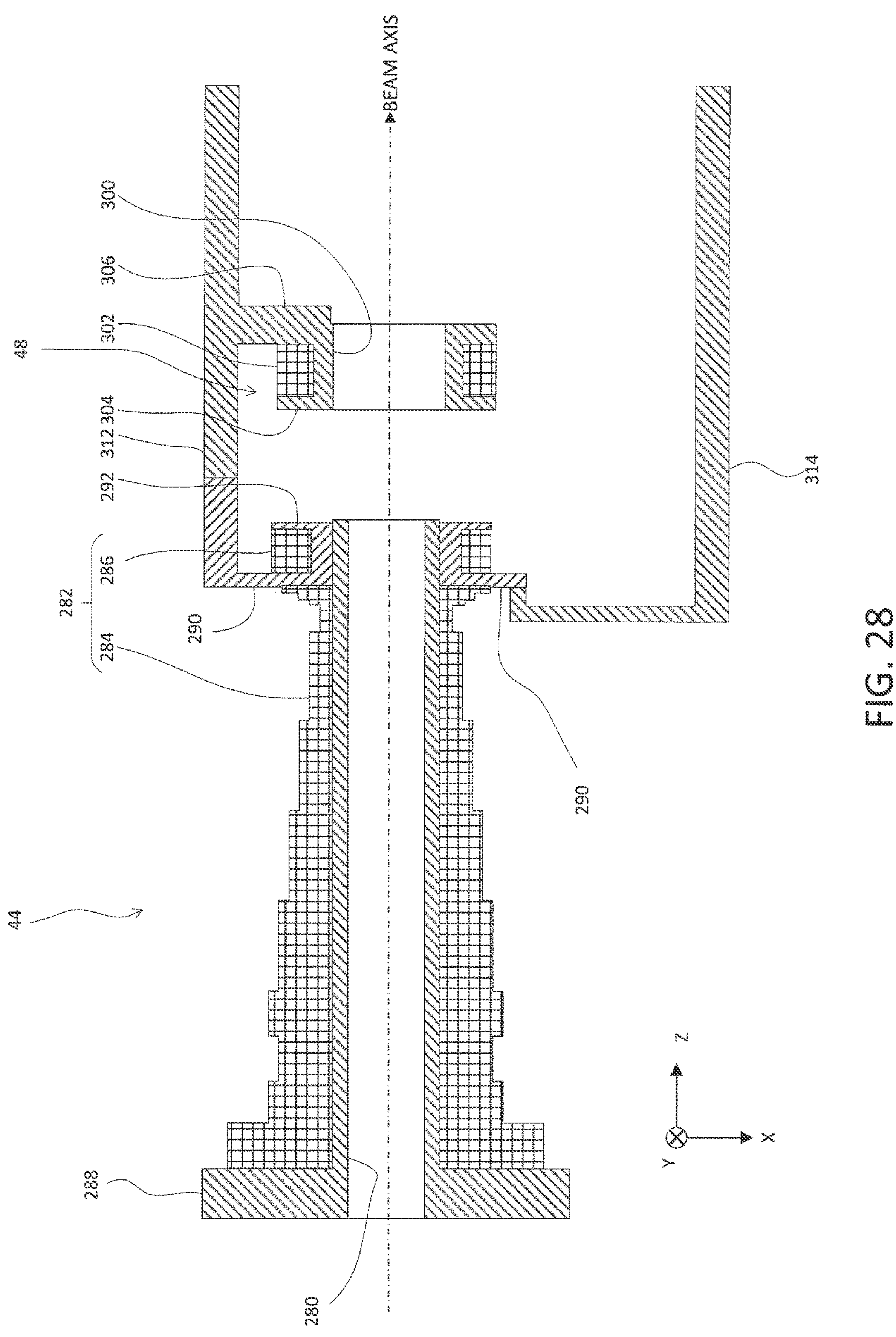
FIG. 28 is a sectional view showing structures of a Zeeman slower and a MOT device.

FIG. 28 shows sectional views of the coil 44 for the Zeeman slower, and the coil 48 for the MOT device. In the illustrated coil 44 for the Zeeman slower, a coil 282 is wound around an elongated cylindrical-shaped bobbin 280 arranged coaxially with the beam axis. A hollow portion of the bobbin around the center is a space through which the atom beam 42 travels along the beam axis.

In view of functionality, the greater portion of the coil 282 constitutes a decreasing type Zeeman coil portion 284 where the number of turns substantially decreases slightly from the upstream side to the downstream side of the beam axis. The furthest downstream side of the coil 282 in the beam axis and therearound forms the MOT coil portion 286 having a large number of turns. The covered conductor wires of the Zeeman coil portion 284 and the MOT coil portion 286 are continuously connected to each other, the magnetic field formed by the Zeeman coil portion 284 extends adjacent to the MOT coil portion 286, and the magnetic field formed by the MOT coil portion 286 extends downstream of the Zeeman coil portion 284. Consequently, it should be noted that the boundary between the Zeeman coil portion 284 and the MOT coil portion 286 cannot be clearly defined.

On the beam-axis upstream side of the bobbin 280 there is provided a disk-shaped upstream flange 288 having a radius larger than the maximum diameter portion of the Zeeman coil portion 284. The upstream flange 288 is attached to the cylindrical wall 32 of the protruding portion 30 of the vacuum chamber 20. A mirror supporter, not shown, is attached to a front portion of the upstream flange 288. The optical mirror 76 is attached to the distal end of the mirror supporter.

On the beam-axis downstream side of the bobbin 280, there are provided two circular ring-shaped downstream flanges 290 and 292 formed to have a diameter substantially identical to that of the MOT coil portion 286. The downstream flange 290 is formed to have a circular ring shape that is relatively thick along the beam axis direction, and is provided around the boundary between the Zeeman coil portion 284 and the MOT coil portion 286. The downstream flange 292 is formed to have a circular ring shape that is relatively thin along the beam axis direction, and is provided downstream of the MOT coil portion 286. The upper parts of the downstream flanges 290 and 292 are attached to the upper support member 312, and the lower parts of the flanges are attached to the lower support member 314. The upper support member 312 and the lower support member 314 are attached to the rear circular wall 28 of the main body 22 of the vacuum chamber 20.

The coil 48 for the MOT device is arranged downstream of the coil 44 for the Zeeman slower away by a predetermined distance. In the coil 48 for the MOT device, a MOT coil 302 is wound around a short cylindrical-shaped bobbin 300 provided coaxially with the beam axis. On the beam-axis upstream side of the bobbin 300, there is provided a thin circular ring-shaped flange 304 having a diameter substantially identical to that of the MOT coil 302. On the beam-axis downstream side of the bobbin 300, a relatively thick circular ring-shaped flange 306 having a diameter substantially identical to that of the MOT coil 302 is provided. The upper parts of the flanges 304 and 306 are attached and fixed to the upper support member 312.

In the coil 44 for the Zeeman slower, the bobbin 280, the upstream flange 288, and the downstream flanges 290 and 292 are made of copper or the like, which has high thermal conductivity and low permeability. The bobbin 280, the upstream flange 288, and the downstream flanges 290 and 292 are combined with each other by welding to have high strength and to be in close contact.

In the coil 44 for the Zeeman slower, more coil is wound around on the beam-axis upstream side. The upstream side has a greater weight than the downstream side. By combining the upstream flange 288 with the cylindrical wall 32 of the protruding portion 30 of the vacuum chamber 20, the coil 44 for the Zeeman slower is stably arranged in the vacuum chamber 20.

In the coil 44 for the Zeeman slower, heat is generated by the current flowing through the coil 282. The vacuum chamber 20 is in a vacuum. Unlike the atmosphere, thermal conduction via a gas does not occur. Accordingly, in the coil 44 for the Zeeman slower, a slight cooling effect due to blackbody radiation occurs. However, the heat of the coil 282 must be removed mainly by thermal conduction via a solid. The bobbin 280 is in contact with the coil 282, and heat is effectively transferred from the coil 282. The upstream flange 288 and the downstream flanges 290 and 292 have a large area in contact with the coil 282, and remove heat from the coil 282. As shown in FIG. 2, the upstream flange 288 is connected to the cooler 92 for the Zeeman slower at the cylindrical wall 32 of the protruding portion 30. In the cooler 92 for the Zeeman slower, cooling water is circulated in a water-cooling tube made of copper or the like, thereby cooling the upstream flange 288. Thus, excessive increase in temperature of the coil 44 for the Zeeman slower is prevented.

The bobbin 300 and the flanges 304 and 306 of the coil 48 for the MOT device also have high thermal conductivity, and are made of copper or the like having low permeability. The bobbin 300, and the flanges 304 and 306 are combined with each other by welding to have high strength and to be in close contact. The MOT coil 302 of the coil 48 for the MOT device is smaller in size and lighter in weight than the coil 282 of the coil 44 for the Zeeman slower. The entire coil 48 for the MOT device also has a light weight. Accordingly, the coil 48 for the MOT device is stably attached to the rear circular wall 28 via the upper support member 312 to which the flanges 304 and 306 are fixed.

The current caused to flow is smaller and the amount of heat generation is smaller in the MOT coil 302 of the coil 48 for the MOT device than in the coil 282 of the coil 44 for the Zeeman slower. The peripheries of the MOT coil 302 in three directions of the coil 48 for the MOT device are enclosed by the bobbin 300 and the flanges 304 and 306. Accordingly, the heat generated by the MOT coil 302 is transmitted to the cooler 94 for the MOT device via the upper support member 312. It is assumed that a cooling scheme is adopted for the cooler 94 for the MOT device. However, in a case where the heat quantity to be removed is small, an air cooling scheme may be adopted.

In the example in FIG. 28, the number of turns of the coil 282 decreases roughly monotonically. However, in detail, irregularities are formed in the beam axis direction. One reason for providing the irregularities is to obtain a desired magnetic field intensity at a specific position on the beam axis. For example, in the capture space 50 that captures atoms, the magnetic field must be zero. Another reason may be to adopt a configuration of causing no magnetic field at positions where no magnetic field is required, in view of power saving. It is sufficient that the coil 44 for the Zeeman slower generates a magnetic field needed to decelerate atoms or confine atoms. A reason for providing irregularities may be a request for mechanical support or thermal radiation. The weight of the coil increases with the number of turns. Accordingly, it becomes difficult to support. Furthermore, the heat discharge from the coil increases. Accordingly, it is conceivable that the number of turns of the coil of a portion advantageous for support, or a portion having a high heat radiation efficiently, is increased. In the example shown in FIG. 28, the coil 282 of the coil 44 for the Zeeman slower is formed to have a relatively convex shape where the number of turns is large at a portion in contact with the upstream flange 288, and to have a relatively concave shape where the number of turns is relatively small on the downstream side. Accordingly, the barycenter of the coil 44 for the Zeeman slower moves toward the upstream flange 288, and fixation by the upstream flange 288 is more stable. The contact area between the coil 282 and the upstream flange 288 is large, and thermal conduction is effectively achieved from the coil 282 to the upstream flange 288.

Figure 29:
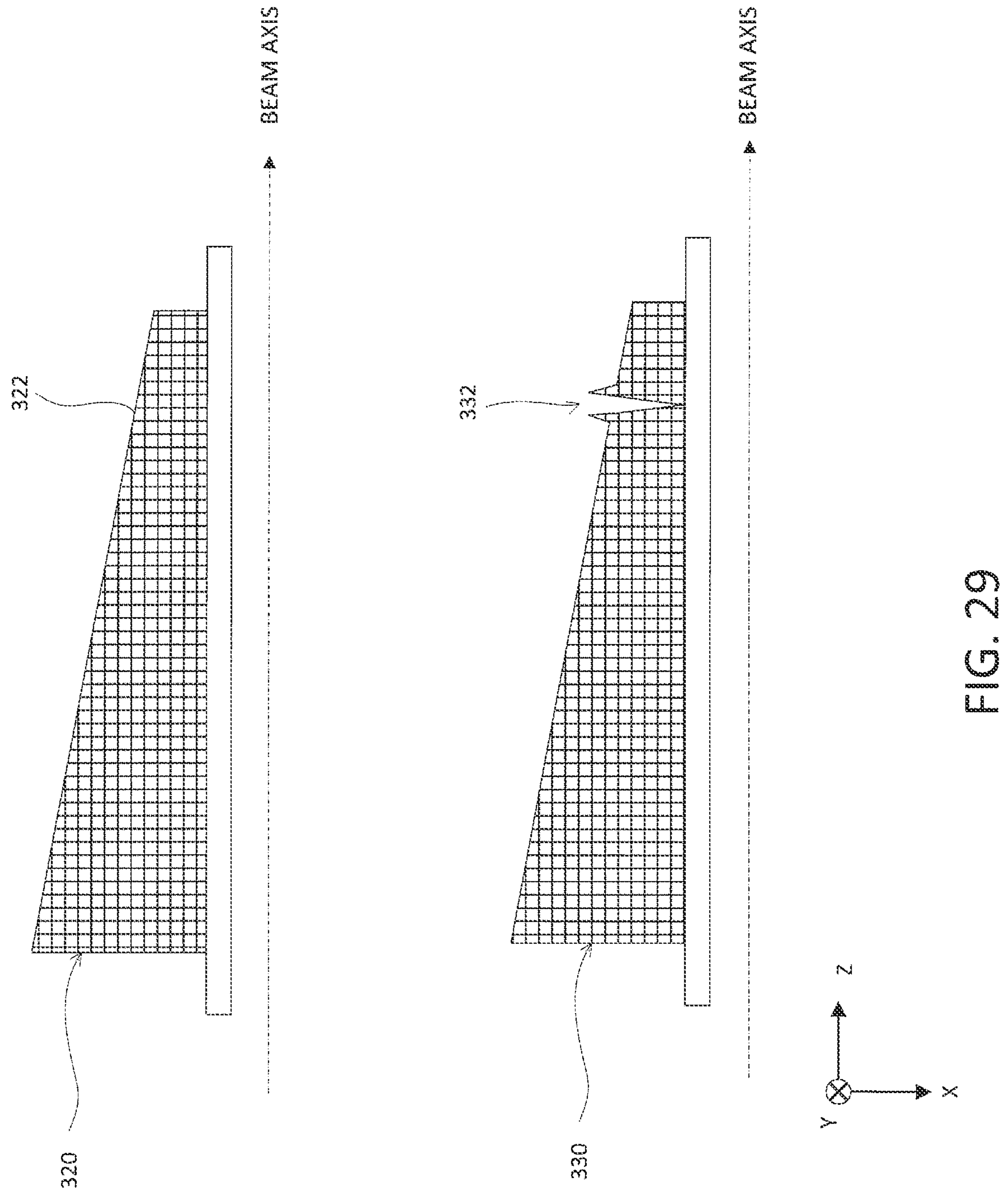
FIG. 29 is a sectional view illustrating a void of a coil.

Here, by reference to FIG. 29, a void in the coil is described. FIG. 29 shows sectional views of upper parts of two Zeeman coils 320 and 330. In the Zeeman coil 320, the number of turns monotonically decreases in the beam axis direction including the portion 322. On the other hand, in the Zeeman coil 330, the number of turns is locally small at the portion 322 called a void. However, in the Zeeman coil 330, the number of turns ais locally large before and after the portion 332 in the beam axis direction. Accordingly, the distribution of the magnetic field created by the entire Zeeman coil 330 is substantially equal to the distribution of the magnetic field created by the Zeeman coil 320.

The way of forming the coil shape at and around the void can be theoretically obtained. The magnetic field distribution generated by a unit component is in accordance with the Biot-Savart law. Conversion from the magnetic field distribution to the current distribution can be dealt with as the deconvolution method, or the inverse problem in a general perspective. The method of obtaining a solution of a minimum current path through the inverse problem is described, for example, in Mansfield P, Grannell P K. "NMR Diffraction in Solids." J Phys C: Solid State Phys 6: L422-L427, 1973. However, it is obvious that there are multiple roots only if there is no restriction to the minimum current. In FIG. 29, provided that the solution of the minimum current path satisfying a desired magnetic field distribution is the Zeeman coil 320, the Zeeman coil 330 with increased current density around the void can also form a desired magnetic field distribution.

As for the coil 282 shown in FIG. 28, the downstream flange 290 is provided at the middle of the coil 282. This means that the downstream flange 290 is provided at the large void. Before and after the downstream flange 290 in the beam direction, the numbers of turns is configured to be larger than in a case without the downstream flange 290, thus removing or reducing the adverse effects of the downstream flange 290.

Figure 30:
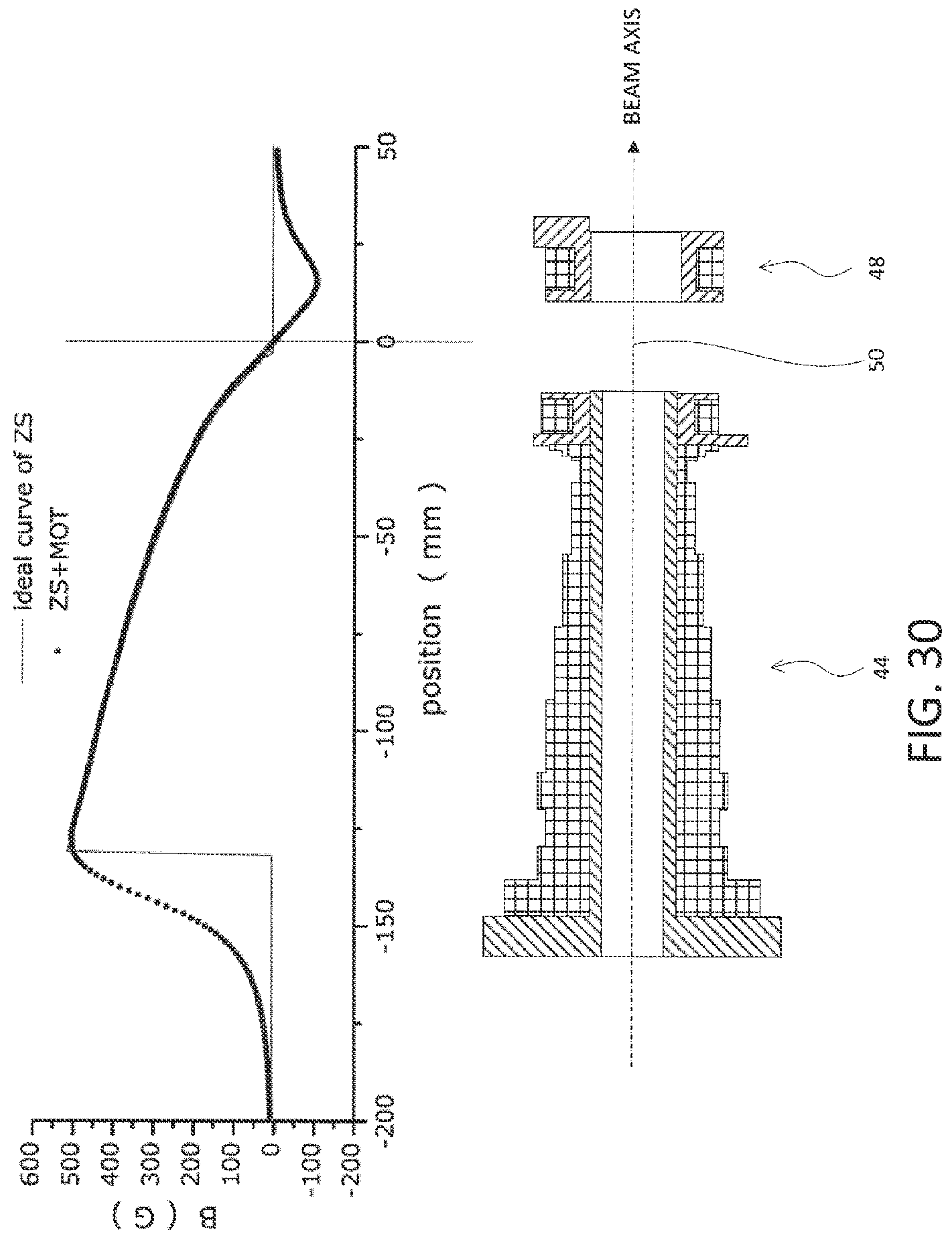
FIG. 30 shows a magnetic field distribution corresponding to the configuration shown in FIG. 28.

FIG. 30 shows the magnetic field distribution at the coil 44 for the Zeeman slower (ZS) and the coil 48 for the MOT device. The x axis represents the position on the beam axis. The origin corresponds to the capture space 50. The y axis represents the magnitude of the magnetic field on the beam axis. The coil 44 for the Zeeman slower and coil 48 for the MOT device are formed symmetrically with respect to the beam axis. Accordingly, the magnetic field on the beam axis only has a component on the beam axis direction. On the beam axis, a position where the coil 282 of the coil 44 for the Zeeman slower is arranged, and a position where the MOT coil 302 of the coil 48 for the MOT device is arranged are indicated. Points on the graph indicate calculated values of the magnetic field. Narrow lines indicate the value of the magnetic field that is ideal for decelerating atoms toward the capture space 50 by the Zeeman slower.

The magnetic field becomes the maximum slightly downstream of the end of the coil 282 on the upstream side. On the slightly upstream side of the position of the maximum value, the value of the magnetic field abruptly decreases. On the further upstream side, the value gradually approaches zero. The ideal magnetic field has a distribution where the magnetic field outside of the coil 282 becomes zero, and no magnetic field leaks to the outside. However, generation of the magnetic field due to the current has a spatial extension. For example, in a case without an opposite directional coil compensating (canceling) the external magnetic field, the magnetic field outside of the coil 282 cannot be zero.

On the downstream side of the position with the magnetic field of the maximum value, the magnetic field decreases monotonically. The number of turns of the coil has slight irregularities as described above. By the effect of the surrounding coil, the monotonically decreasing magnetic field for Zeeman slower is created. The magnetic field having the gradient substantially coincides with the ideal magnetic field distribution for Zeeman slower, and indicates steady deceleration of atoms toward the capture space 50.

The magnetic field abruptly decreases before the end of the downstream side of the coil 282. The MOT coil portion 286 therearound has a large number of turns. No coil is present on the further downstream side. Accordingly, the value of the magnetic field rapidly decreases.

The magnetic field decreases with a substantially constant slope, and becomes zero in the capture space 50. Furthermore, the magnetic field decreases with the same slope, and becomes the minimum value (the negative value becomes strongest) around the MOT coil 302 of the coil 48 for the MOT device. This is because the MOT coil 302 causes the current to flow in the direction opposite to the coil 282. A portion ranging from a portion around the MOT coil portion 286 of the coil 282 to a portion around the MOT coil 302 approximately forms a Helmholtz-type coil. Accordingly, by causing the current to flow through the MOT coil 302 in the opposite direction, the magnetic field having a constant slope can be formed. Although not shown, the magnetic field having a constant slope is formed also in a direction perpendicular to the beam axis. The gradient magnetic field formed by the MOT device is irradiated with MOT optical beams in the respective three axes. Accordingly, the atoms can be captured in the capture space 50 at the origin. On the downstream side of the MOT coil 302, the magnetic field gradually approaches zero.

As described above, the coil 44 for the Zeeman slower and the coil 48 for the MOT device are installed in the combined manner, and the length in the beam axis direction is allowed to be reduced in comparison with a case where the Zeeman slower and the MOT device are separately provided. The entire coil length can be also reduced, which can facilitate power saving and reduction in amount of heat generation.

Note that in a case where a background magnetic field is present, the position where the magnetic field is zero deviates from the capture space 50. Accordingly, in the process of capturing the atoms, the triaxial magnetic field correction coil 96 or a bias coil for correcting the gradient magnetic field is adjusted, thus allowing generation of the compensation magnetic field that cancels the background magnetic field around the capture space 50.

Figure 31A:
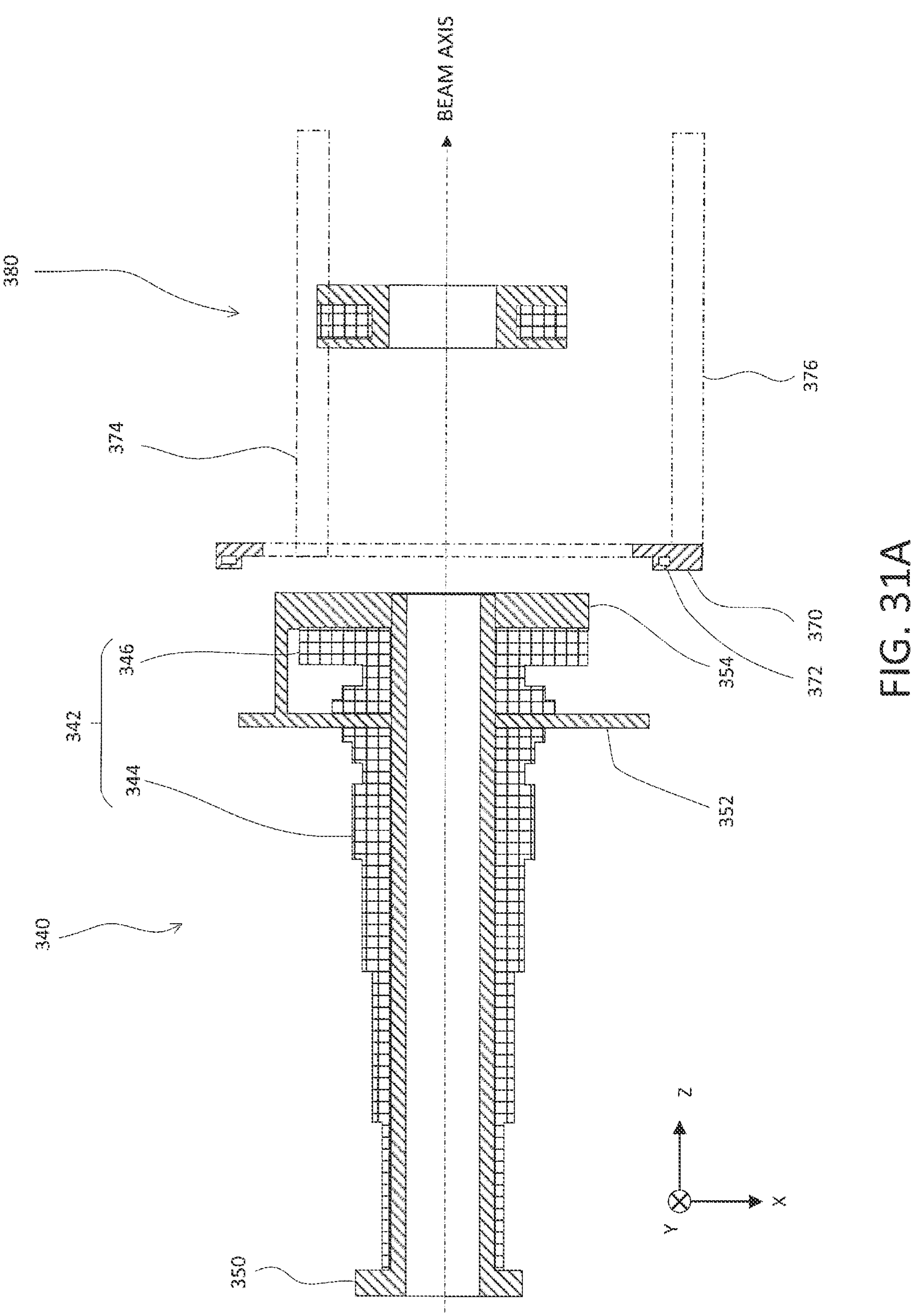
FIG. 31A is a sectional view showing structures of a Zeeman slower and a MOT device.
Figure 31B:
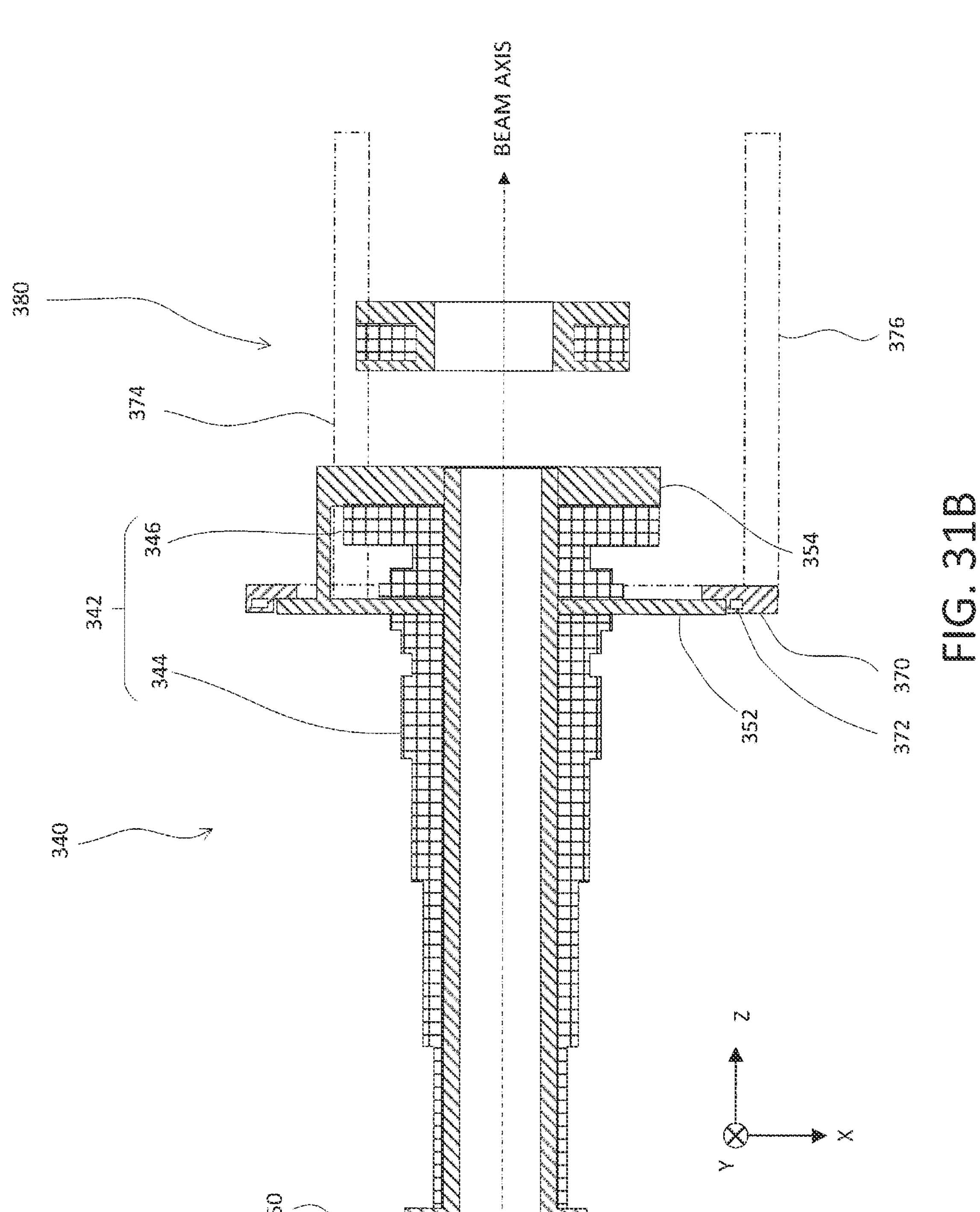
FIG. 31B is a sectional view showing structures of the Zeeman slower and the MOT device.

Next, by reference to FIGS. 31A and 32B, an example of an increasing type coil 340 for a Zeeman slower is described. FIG. 31A is a sectional view showing a state before the coil 340 for the Zeeman slower is attached to the inside of the vacuum chamber 20. FIG. 31B is a sectional view showing a state after the attachment. A coil 342 of the coil 340 for the Zeeman slower shown in FIG. 31A serves as the Zeeman coil portion 344 whose greater portion of the beam-axis upstream side has a function of a Zeeman coil. The furthest downstream side of the coil 342 serves as a MOT coil portion 346 where the function of the Zeeman coil and the function of the MOT coil reside in a combined manner. At the Zeeman coil portion 344, the number of turns monotonically increases from the end of the upstream side to the downstream side. Around the end on the downstream side, irregularities are repeated, and subsequently the number of turns becomes the maximum on the most downstream side. For the sake of convenience, a portion with the maximum number of turns and therearound is called the MOT coil portion 346. As described above, in view of functionality, the portion also plays a role of a Zeeman coil.

The coil 340 for the Zeeman slower internally includes a bobbin. A flange 350 is provided at the end on the upstream side. A flange 352 is provided at the middle of the coil 342 around the end on the downstream side. A flange 354 is provided on the end on the downstream side. The flanges 350, 352, and 354 are welded to the bobbin.

A mirror supporter, not shown, is attached to the furthest upstream flange 350. The optical mirror 76 is fixed to the mirror supporter.

The downstream flanges 352 and 354 are linked to each other at portions other than the bobbin, and improve strength. The flange 352 is a large disk that is thin and has a large radius. The flange 352 is attached to the circular ring supporter 370 made to have a ring shape. The ring of the circular ring supporter 370 internally includes a water-cooling tube 372 through which cooling water flows, and cools the coil 342 through the flange 352. Right and left beams 374 are attached to an upper portion of the circular ring supporter 370. Right and left beams 376 also serving as water-cooling tubes are attached to a lower portion of the circular ring supporter 370. The beams 374 and 376 are attached to the rear circular wall 28 of the main body 22 of the vacuum chamber 20, and support the entire portion including the coil 340 for the Zeeman slower. The beams 374 and 376 serve as exhaust heat paths for transmitting heat of the coil 342 to the rear circular wall 28. Note that cooling water flowing through the beams 376 is allowed to be circulated to the radiator plate **58*b* of the refrigerator 58**.

This configuration assumes that a coil 380 for the MOT device is attached to the rear circular wall 28 by a separately provided support member. The coil 340 for the Zeeman slower is assumed to be positioned with the coil 380 for the MOT device by a positioning mechanism.

Figure 32:
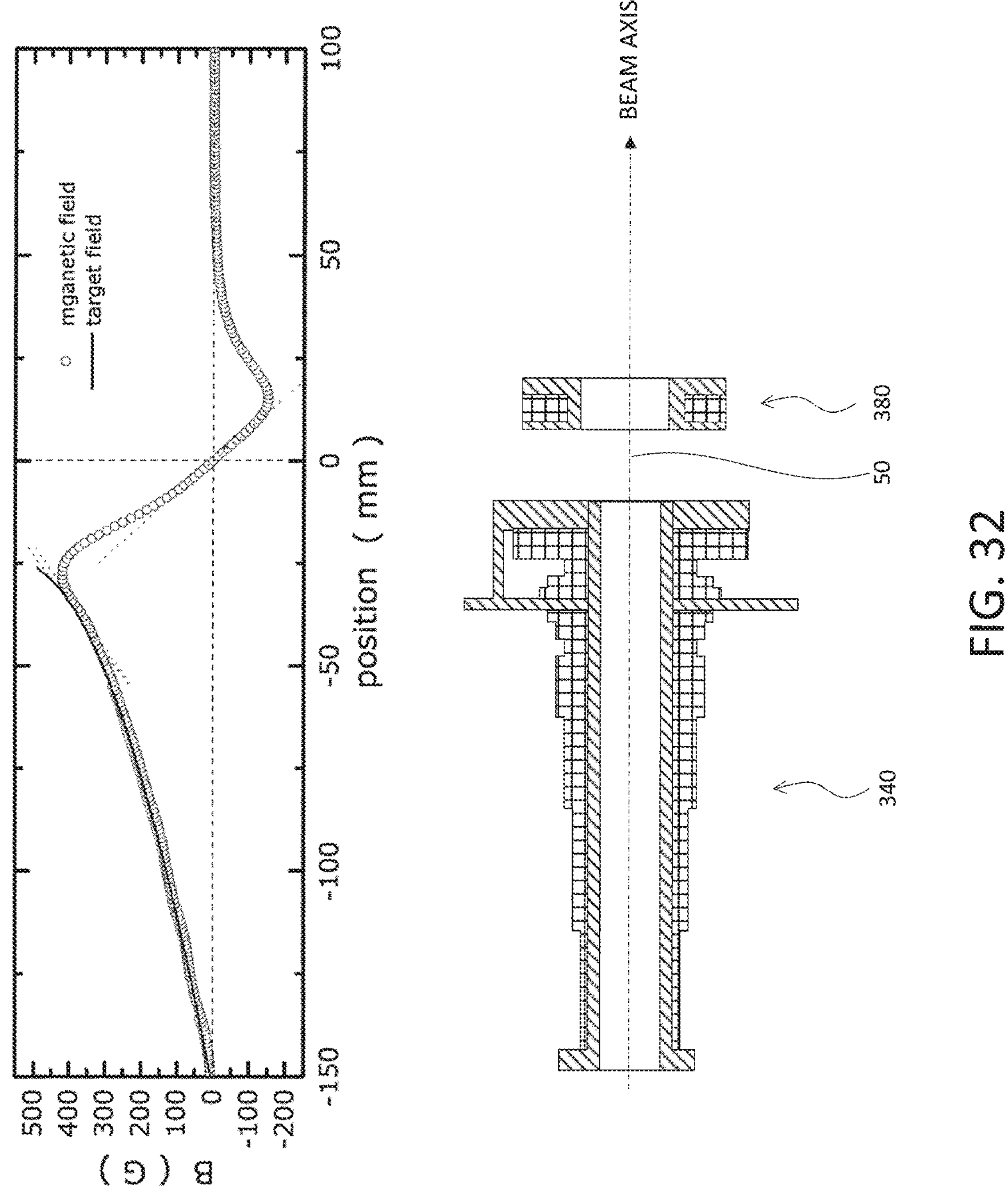
FIG. 32 shows a magnetic field distribution corresponding to the configuration shown in FIGS. 31A and 31B.

FIG. 32 is a diagram corresponding to FIG. 30, and shows the magnetic distribution in a case where the increasing type coil 340 for the Zeeman slower and the coil 380 for the MOT device are adopted. Magnetism gradually increases from the downstream side of the coil 342 of the coil 340 for the Zeeman slower, and becomes the maximum value before the MOT coil portion 346. The increase in magnetism coincides well with a target curve required to achieve the Zeeman slower. On the downstream side of the position with the maximum value, the magnetism rapidly decreases. Before and after the capture space 50 serving as the origin, the magnetism decreases from positive to negative at a substantially constant slope, and becomes zero in the capture space 50. The magnetic field becomes the minimum around the coil 380 for the MOT device, and subsequently gradually approaches zero. The solid line in the upper panel of FIG. 32 represents a typical theoretical magnetic field distribution along the beam axis for the increasing-field-type Zeeman slower shown in the lower panel. The open circles represent the magnetic field distribution along the beam axis, calculated from the current flowing through the coil configuration of the same Zeeman slower.

At a portion constituting the MOT device before and after the capture space 50, the slope of the magnetic field becomes abrupt in comparison with the case of the decreasing type in FIG. 30. This is because the number of turns of the MOT coil 346 at the coil 342 is large, and the number of turns of the facing coil 380 for the MOT device is also large. By making the slope of the magnetic field steep, atoms can be captured with a short distance in the beam axis direction.

The increasing type coil 340 for the Zeeman slower shown in FIG. 32 can have a shorter length than the decreasing type coil 44 for the Zeeman slower in FIG. 30. This is because the increasing type can efficiently decelerate atoms. The increasing type can suppress the magnetic field required to decelerate the atoms and achieve power saving in comparison with the decreasing type.

On the other hand, in the increasing type coil 340 for the Zeeman slower, the side of the capture space 50 is heavier. Accordingly, it is difficult to support the coil in the vacuum chamber 20. The increasing type has a larger number of turns on the capture space 50 side. Accordingly, problems are caused in that the amount of heat generation is large around the center of the vacuum chamber 20 and it is difficult to cool. However, as described above, the coil 340 for the Zeeman slower is supported around the center of the vacuum chamber 20 by the circular ring supporter 370 having the cooling function. Accordingly, these problems are not caused.

The mode of attaching the increasing type coil 340 for the Zeeman slower shown in FIGS. 31A and 31B is only an example. Another mode may be adopted. By reference to FIGS. 33A and 33B, a modified example is described.

Figure 33A:
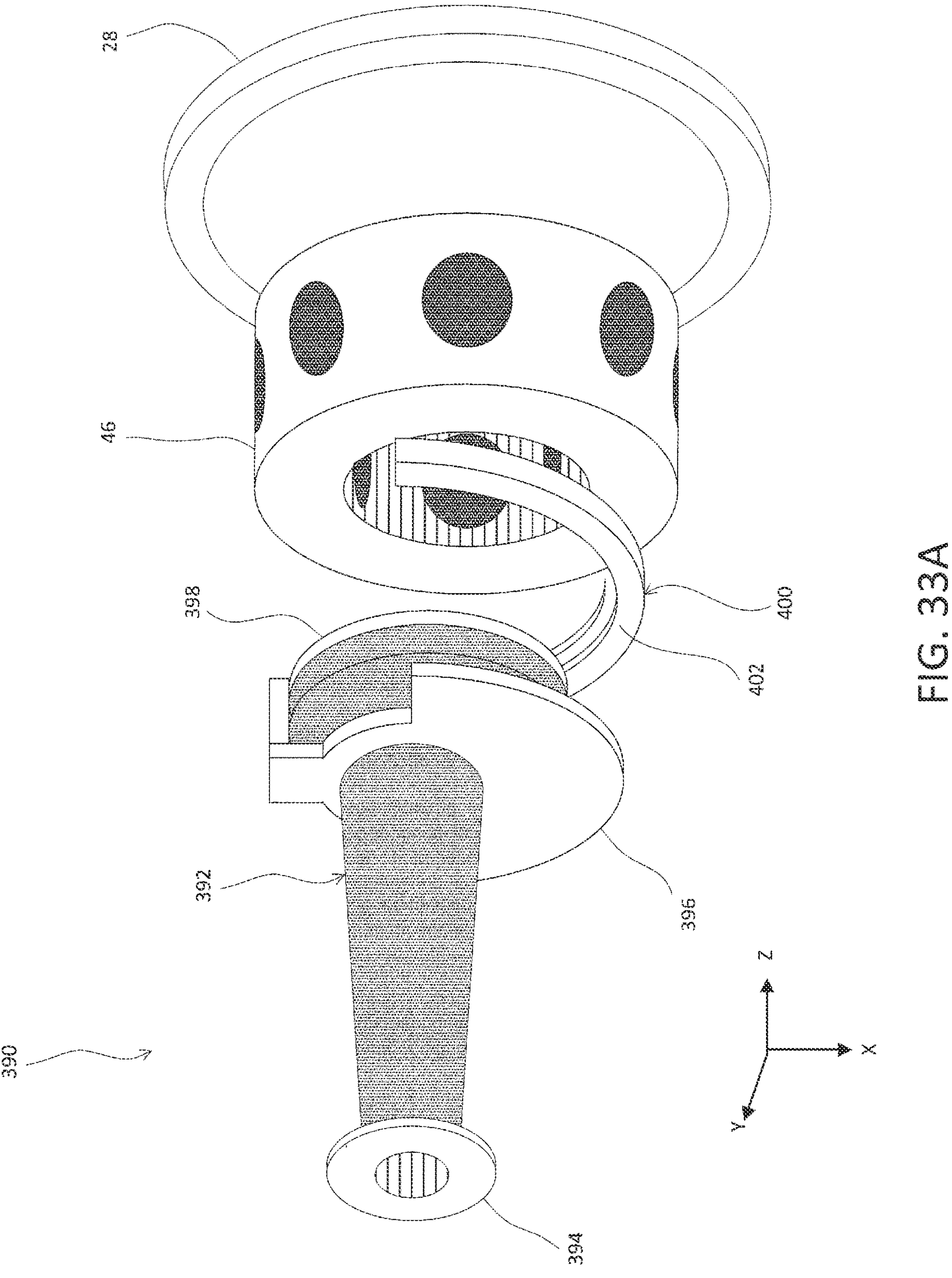
FIG. 33A shows a structure of a modified mode shown in FIGS. 31A and 31B.
Figure 33B:
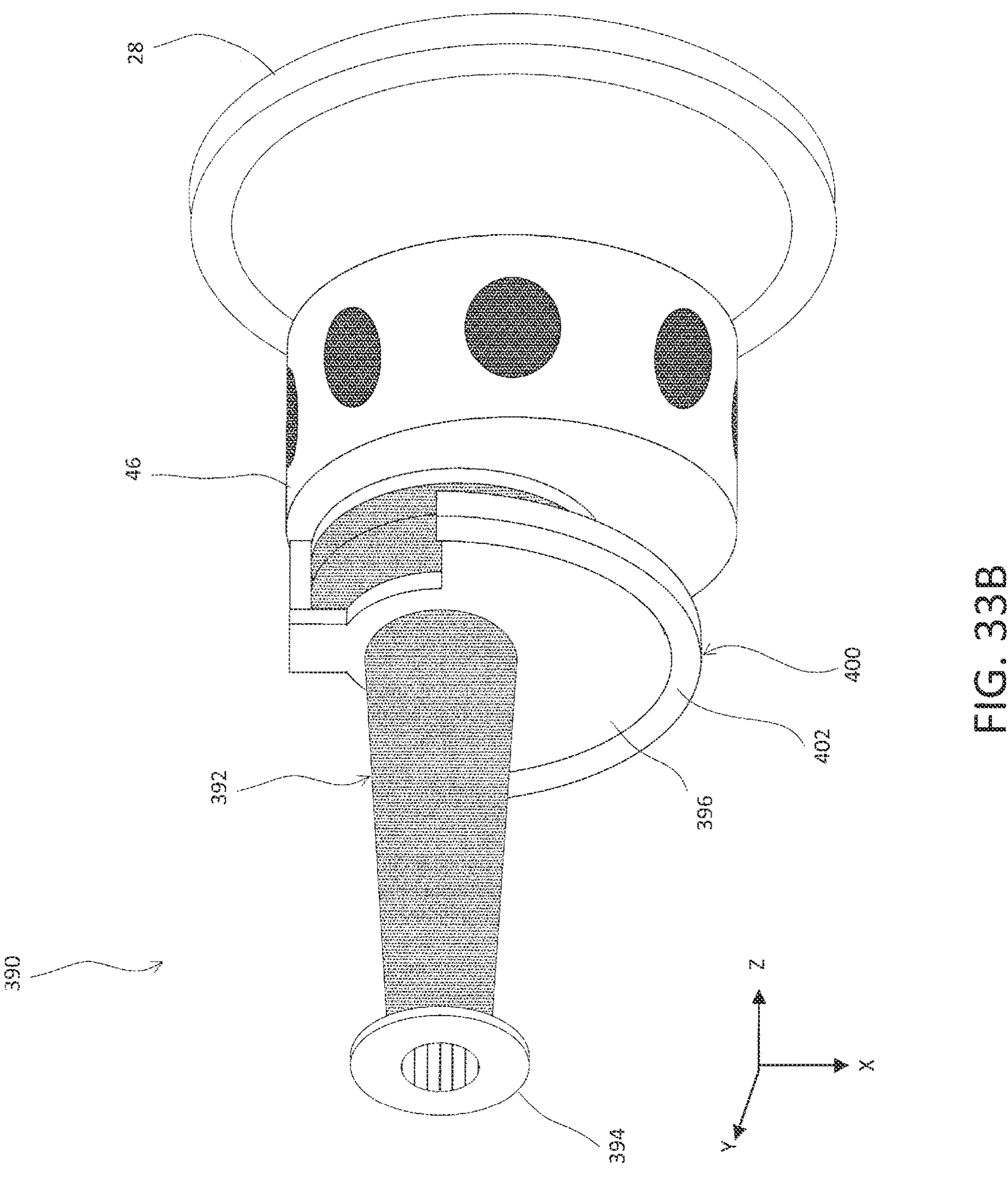
FIG. 33B shows a structure of a modified mode shown in FIGS. 31A and 31B.

FIG. 33A is a perspective view showing a state before the coil 390 for the Zeeman slower is attached to the inside of the vacuum chamber 20. FIG. 33B is a perspective view showing a state after the attachment. A coil 392 of the coil 390 for the Zeeman slower is wound in a manner similar to that of the coil 340 for the Zeeman slower. The configuration including a bobbin and flanges 394, 396, and 398 is also almost the same. However, in the coil 390 for the Zeeman slower, the shape of the flange 396 provided close to the lower end in the beam direction is a semicircular shape that is substantially about the lower half. A portion that supports the flange 396 serves as a substantially U-shaped semicircular ring supporter 400 obtained by halving a circular ring. The semicircular ring supporter 400 is provided with a water-cooling tube 402.

In the mode shown in FIGS. 33A and 33B, the flange 396 has a semicircular shape. The cooling performance in a case where the cooling water circulation is equivalent decreases slightly. On the other hand, in the coil 390 for the Zeeman slower, a space is present above the flange 396. Accordingly, in the vacuum chamber 20, access is facilitated from the optical resonator 46 toward the atomic oven 40. Presence of the space above the semicircular ring supporter 400 facilitates removal of the optical resonator 46. Furthermore, since the distance of the water-cooling tube in the vertical direction is reduced, the disturbance of the flow caused by convection in the water-cooling tube can be easily prevented. Note that the flange 396 shown in FIGS. 33A and 33B can be appropriately provided pores in its surface. In the case of providing the pores, the efficiency of thermal conduction decreases, but reduction in weight can be achieved. Likewise, the flange 352 shown in FIGS. 31A and 31B can be appropriately provided with pores in its surface.

Figure 34:
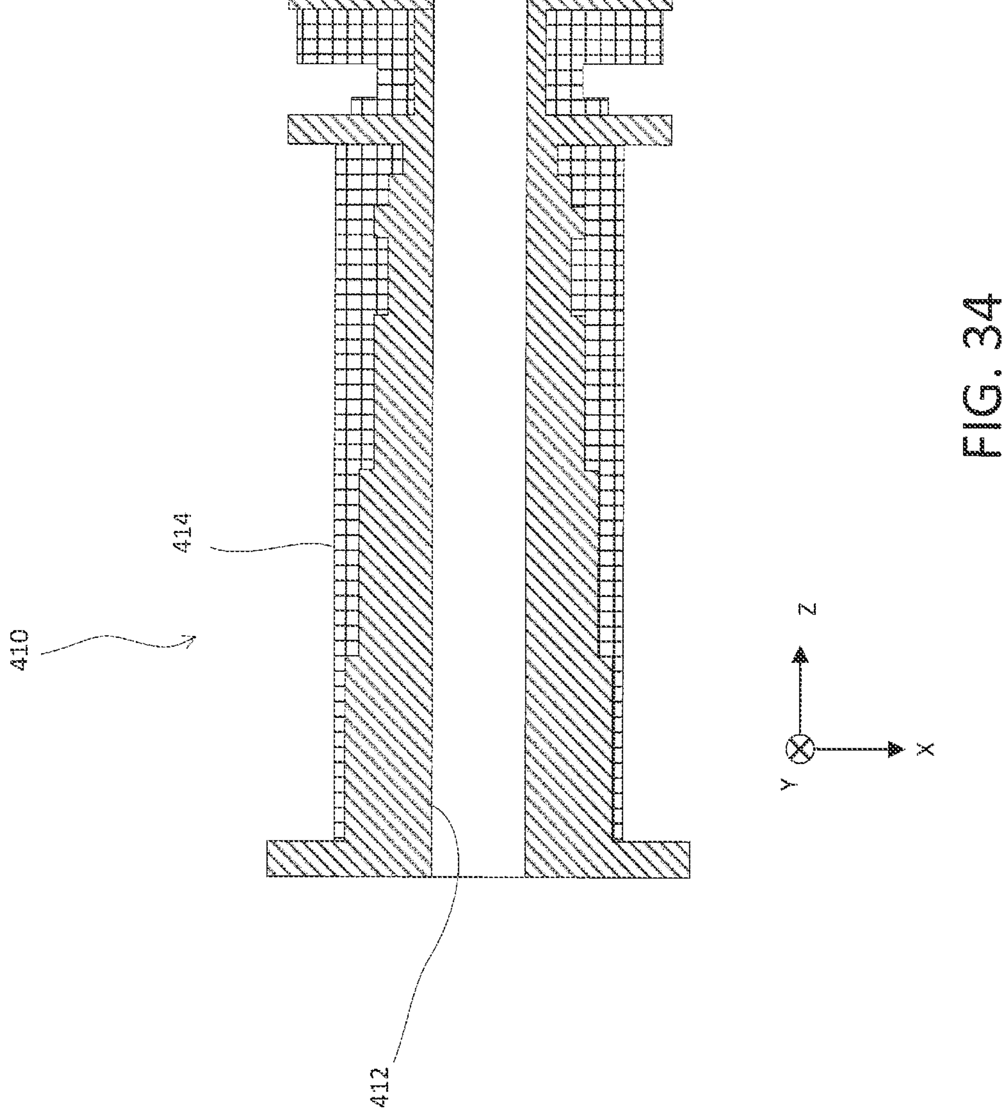
FIG. 34 is a sectional view of a Zeeman coil having a constant coil outer diameter.

FIG. 34 is a sectional view of a coil 410 for an increasing type Zeeman slower according to another embodiment. The coil 410 for the Zeeman slower includes a bobbin 412 having a thickness varying in the beam direction. The cylindrical-shaped bobbin 412 has a constant inner diameter, but an outer diameter that gradually decreases stepwise from the upstream to the downstream in the beam direction. A coil 414 wound around the bobbin 412 has a greater number of turns on the downstream side in the beam axis direction. Accordingly, the outer diameter of the coil 414 is substantially constant in the beam axis direction.

According to the configuration shown in FIG. 34, increase in the outer diameter of the bobbin 412 increases the contact area between the bobbin 412 and the coil 414. Accordingly, the thermal conduction efficiency from the coil 414 to the bobbin 412 improves. A covered conductor wire can be wound using the steps of the bobbin 412, thus facilitating installation of the coil 414.

Note that not necessarily limited to this embodiment, instead of a round wire having a round section, a rectangular flat wire having a rectangular section may be used for the covered conductor wire included in the coil 414, which can further improve the thermal conduction efficiency with the bobbin 412 and the like. As described below, in a case where the periphery of the coil 414 is covered with a thermal conductive cover, the outer diameter of the coil 414 is constant, which facilitates bringing the cover into close contact with the coil 414, and removing heat through the cover.

The example of installing the Zeeman slower in the vacuum chamber 20 has been described so far. The cooling mechanism of removing Joule heat caused by the coil is provided, which allows thermally stable installation of the Zeeman slower in the vacuum chamber 20. Hereinafter, as another example, an example of sealing part or the entirety of the coil with the cover (i.e., encapsulation) is described.

Figure 35A:
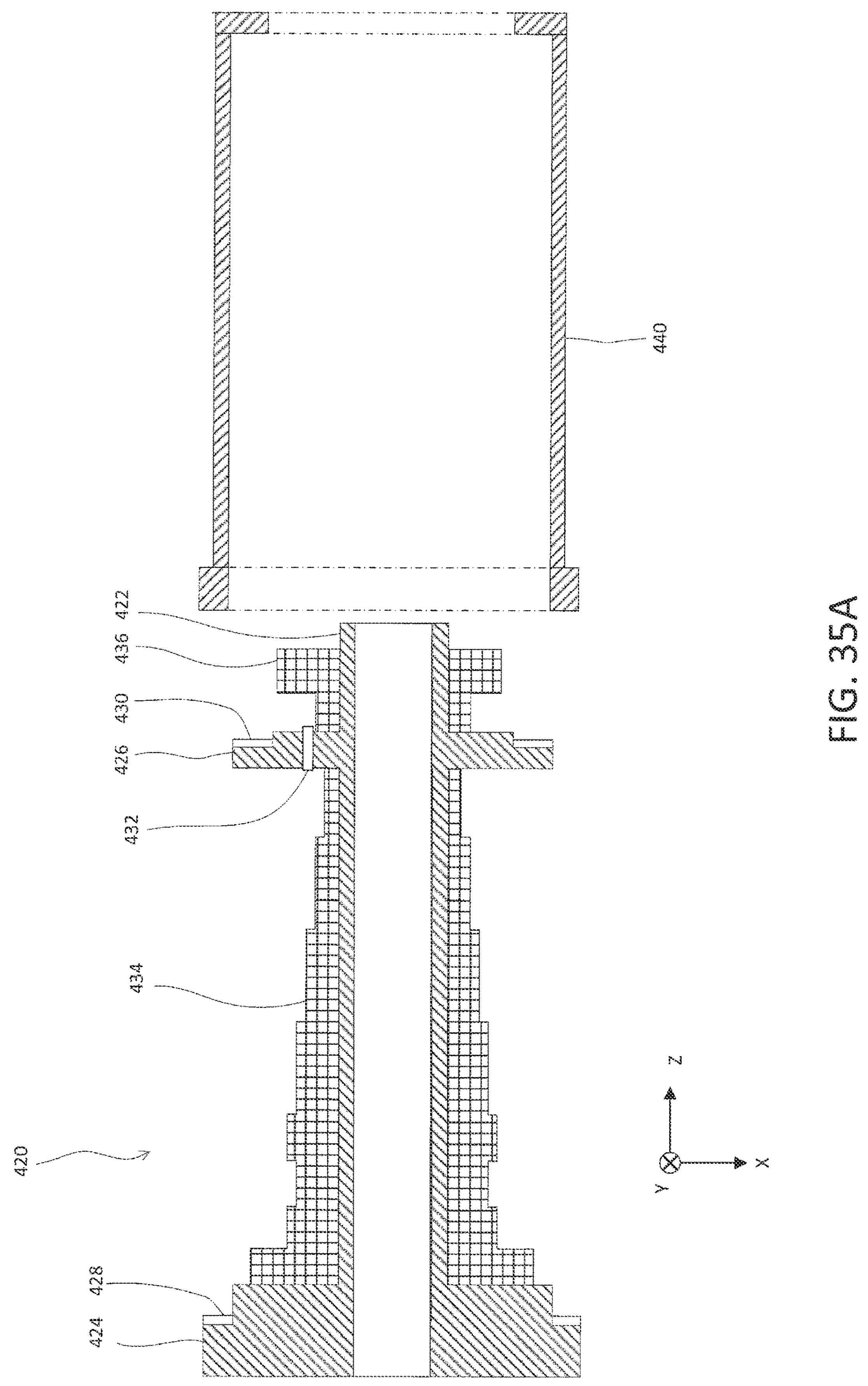
FIG. 35A is a sectional view showing encapsulation of a coil for a Zeeman slower.
Figure 35B:
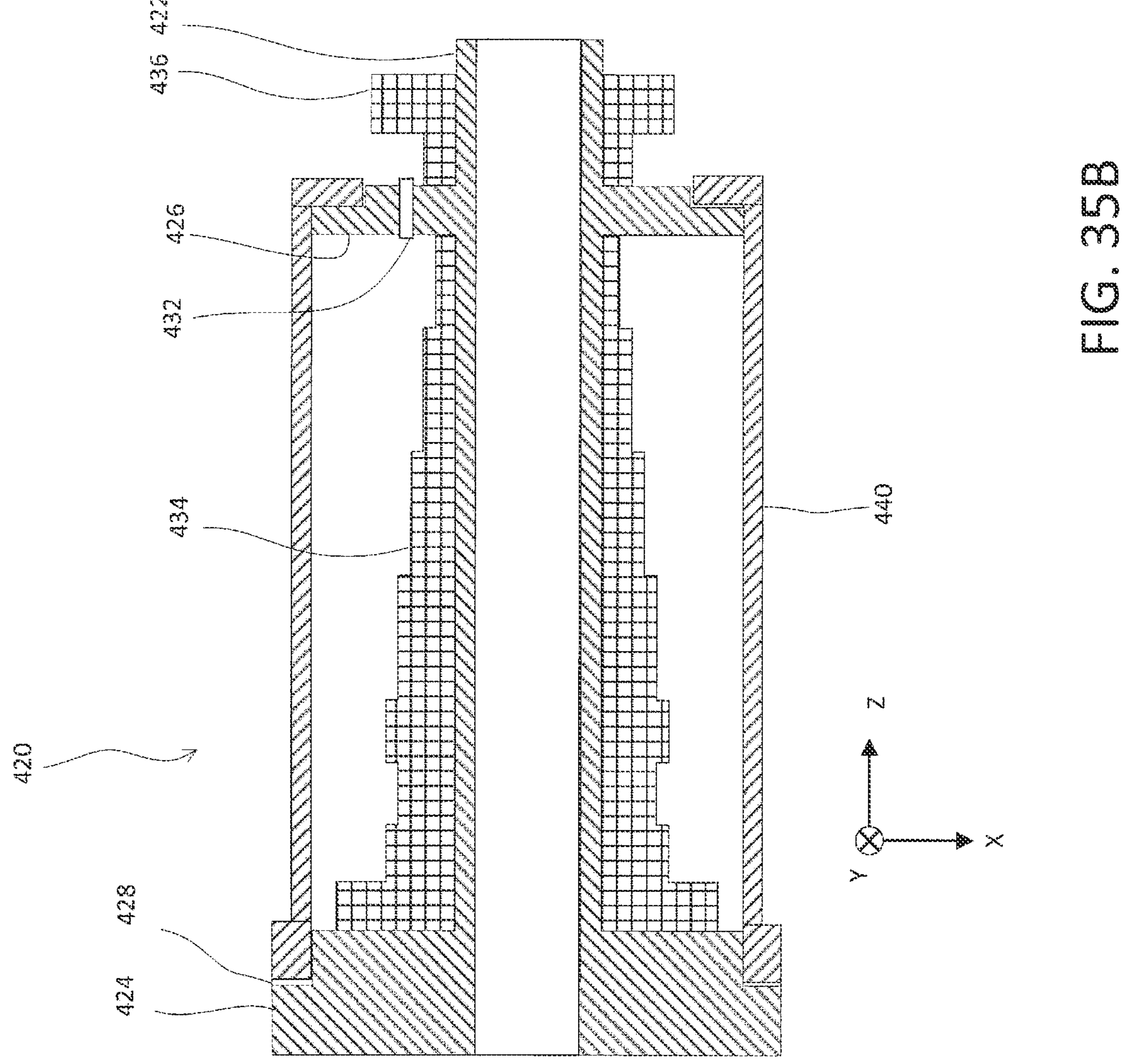
FIG. 35B is a sectional view showing encapsulation of the coil for the Zeeman slower.

FIGS. 35A and 35B are side sectional views showing a coil 420 for a Zeeman slower and a cover 440. FIG. 35A shows a state before the cover 440 is attached to the coil 420 for the Zeeman slower. FIG. 35B shows a state after the attachment. The coil 420 for the Zeeman slower is of the decreasing type where the number of turns of the coil gradually decreases in the beam axis direction.

A bobbin 422 of the coil 420 for the Zeeman slower is provided with a flange 424 at the end of the upstream side of the beam axis, and with a flange 426 also at a middle position on the downstream side. Similar to the example described above, the bobbin 422 and the flanges 424 and 426 are made of copper or the like, which secures high thermal conductivity. The outer peripheries of the flanges 424 and 426 are provided respectively with sealing members 428 and 430 made of indium. The sealing members 428 and 430 are formed to have a ring shape, relatively thin sheet shape, or a ring-shaped thick shape. Indium has a characteristic stably enabling vacuum sealing even with large temperature variation. The flange 426 is provided with a hermetic connector 432 that is a vacuum-resistant connector.

A coil 434 is wound around the bobbin 422 between the flange 424 and the flange 426. A coil 436 is wound on the downstream side of the flange 426. Each of the coils 434 and 436 is formed of a covered conductor wire including copper insulated with a resin. The coil 434 and the coil 436 are electrically connected via the hermetic connector 432.

The cover 440 is formed to have a cylindrical shape. The cover 440 is made of copper, which is the same material as that of the bobbin 422, the flanges 424 and 426, and the coils 434 and 436, and prevents deformation due to thermal expansion.

The cover 440 is installed for coverage from the flange 424 to the flange 426. That is, part of the inner periphery of upstream end of the cover 440 encloses part of the outer periphery of the flange 424, and is sealed with a sealing member 428. Part of the inner periphery of downstream end of the cover 440 encloses part of the outer periphery of the flange 426, and is sealed with a sealing member 430. The cover 440 is formed so as to have a positive tolerance from the length from the flange 424 to the flange 426, and can securely enclose both flanges.

The atmospheric pressure can be freely set in the cover 440 only if the sealing members 428 and 430 can securely achieve shielding. For example, air at the atmospheric pressure may be enclosed, or a roughly pumped vacuum may be used. The roughly pumped vacuum is a state of being rarefied using a turbopump or the like, and is set to about 1 to 0.1 Pa, for example. In the case where the inside of the cover 440 is the roughly pumped vacuum, the pressure difference between the inside and the outside of the cover 440 is small in a state where the vacuum chamber 20 is in a vacuum. Accordingly, the sealing surfaces by the sealing members 428 and 430 can be strongly prevented from being separated from each other.

An inert gas, such as nitrogen or helium, may be enclosed in the cover 440. A gas having low reactivity with a resin used for the coil when the coil 434 is at a high temperature is selected as the inert gas. The pressure of the inert gas is not specifically limited, and may be one atmosphere, or a roughly pumped vacuum. The inside of the cover 440 may be filled with for example, a lightweight resin, such as urethane foam. In this case, the strength of the cover 440 can be improved.

The coil 420 for the Zeeman slower becomes a high temperature due to Joule heat during energization. A coil 434 with a larger number of turns generates more Joule heat than a coil 436 with a smaller number of turns. Accordingly, the coil 434 tends to become a high temperature. When the temperature becomes higher, a minute amount of gas (this gas is called outgas) contained in the resin of the covered conductor wire included in the coil 434 is discharged. However, in the coil 420 for the Zeeman slower, the coil 434 is sealed by the bobbin 422, the flanges 424 and 426, and the cover 440. Accordingly, no outgas leaks into the vacuum chamber 20. This prevents the outgas from causing an error of the clock transition. Consequently, the coil 420 for the Zeeman slower sealed by the cover 440 functions as a vacuum installation coil having high usability in a case of installation in a vacuum.

The cover 440 also serves as a thermal conduction medium between the flange 424 and the flange 426. That is, thermal conduction between the flange 424 and the flange 426 occurs not only through the bobbin 422 but also through the cover 440. Accordingly, there is also an advantageous effect of cooling the coils 434 and 436.

The above description assumes that the cover 440 covers the outer peripheries of the flanges 424 and 426, but are not in contact with the coil 434. However, the cover 440 may be in contact with part or the entirety of the outer peripheral surface of the coil 434. In this case, heat from the coil 434 is directly transferred to the cover 440, which improves the heat radiation efficiency. In particular, in the case where the coil 414 has a constant outer diameter as with the coil 414 shown in FIG. 34, it is easy to achieve close contact with the inner periphery of the cover 440. If it is difficult to form a shape bringing the cover 440 into contact with the outer peripheral surface of the coil 434, a thermal conductive member may be inserted between the cover 440 and the coil 434.

In the embodiment shown in FIGS. 35A and 35B, the coil 434 is not covered with the cover 440. This is because the number of turns of the coil 434 is small, and the necessity of addressing outgas discharge is low. The coil 434 is a portion including the MOT coil included in the MOT device, and the optical resonator 46 and the like are arranged adjacent to this portion. Accordingly, increase in diameter due to coverage of the coil 434 with the cover is prevented. However, if interference with the surrounding devices and components can be avoided, the entire portion including the coil 434 may be covered with the cover and encapsulated.

In the example in FIGS. 35A and 35B, the decreasing type coil 420 for the Zeeman slower is exemplified. However, even in the case of the increasing type, part or the entirety of what includes a portion having the large number of turns can be encapsulated.

Note that the above description assumes that the cover 440 is in close contact with the flanges 424 and 426 using the indium sealing members 428 and 430, and the inside is made hermetic. Alternatively, sealing members made of a material other than indium may be adopted. In the case of using the sealing members, the cover 440 may be detachably attached to the flanges 424 and 426 using fixation screws, for example. Alternatively, for example, the cover 440 and the flanges 424 and 426 may be brought into close contact with each other by a semipermanent sealing method, such as welding or vacuum brazing, and the inside may be made hermetic.

The above description exemplifies the optical lattice clock. However, those skilled in the art can apply each technology of this embodiment to other than the optical lattice clock. Specifically, the technology is also applicable to atomic clocks other than the optical lattice clock, and an atom interferometer that is an interferometer using atoms. Furthermore, this embodiment is also applicable to various types of quantum information processing devices for atoms (including ionized atoms). Here, the quantum information processing devices are devices that perform measurement, sensing, and information processing using the quantum states of atoms and light, and may be, for example, a magnetic field meter, an electric field meter, a quantum computer, a quantum simulator, a quantum repeater, and the like besides an atomic clock and an atom interferometer. The physics package of the quantum information processing device can achieve miniaturization or transportability by using the technology of this embodiment, similar to the physics package of the optical lattice clock. It should be noted that in such devices the clock transition space is not a space for clock measurement but is sometimes dealt with simply as a space for causing clock transition spectroscopy.

In such a device, for example, providing the triaxial magnetic field correction coil according to the embodiment can improve the accuracy of the device. By providing the three axes according to the embodiment in the vacuum chamber, miniaturization, transportability, or improvement in accuracy of the physical package can be achieved. Furthermore, by introducing the magnetic field compensation module, the magnetic field distribution can be controlled with high accuracy. In the physics package using the vacuum chamber, installation of the vacuum installation coil is effective.

In the above description, for facilitating understanding, specific aspects are described. However, these exemplify the embodiments, and may be embodied in various other modes.

Hereinafter, supplements of the embodiments are described.

(Supplement 1)

A magnetic field compensation module, including:

a current device that is provided in a vacuum chamber that encloses a clock transition space in which atoms are arranged, and allows current for the device to flow therethrough and generates a stray magnetic field;

a compensation coil that is provided adjacent to the current device, and allows current for the coil to flow therethrough; and control means for dynamically changing current for the coil that is to flow through the compensation coil, and that compensates the stray magnetic field with respect to the clock transition space.

(Supplement 2)

The magnetic field compensation module according to supplement 1, wherein the current device is a Peltier element that cools an isothermal cryostat reservoir that maintains the clock transition space at a predetermined low temperature, and the control means changes the current for the coil in accordance with the temperature of the isothermal cryostat reservoir, or current for the device that is to flow through the Peltier element.

(Supplement 3)

The magnetic field compensation module according to supplement 1, wherein a magnetic field shield made of a high permeability material is provided around the current device, and the compensation coil compensates the stray magnetic field straying from the magnetic field shield.

(Supplement 4)

The magnetic field compensation module according to supplement 1, wherein the control means includes a distributor wire that distributes the current for the coil from the current for the device, and distributes the current for the coil in accordance with the current for the device.

(Supplement 5)

A physics package system for an optical lattice clock, the system including the magnetic field compensation module according to supplement 1.

(Supplement 6)

A physics package system for an atomic clock, the system including the magnetic field compensation module according to supplement 1.

(Supplement 7)

A physics package system for an atom interferometer, the system including the magnetic field compensation module according to supplement 1.

(Supplement 8)

A physics package system for a quantum information processing device for atoms or ionized atoms, the system including the magnetic field compensation module according to supplement 1.

(Supplement 9)

A physics package system, including:

the magnetic field compensation module according to supplement 1; and at least one atomic laser cooling technology device among a Zeeman slower, a magneto-optical trap, and an optical lattice trap that guide the atoms into the clock transition space.

(Supplement 10)

A physics package, including:

a vacuum chamber; and a Zeeman slower that includes a bobbin that is formed to have a cylindrical shape and allows an atom beam to flow along a beam axis in the cylinder, and a series of coils wound around the bobbin, and forms a magnetic field caused to have a spatial gradient in the cylinder, wherein the bobbin is provided with a flange at which an outer surface of the cylinder is radially enlarged at an intermediate position in a direction of the beam axis, the series of coils are wound around the bobbin beyond the flange, and the Zeeman slower is installed in the vacuum chamber so that the flange is attached directly or indirectly to the vacuum chamber.

(Supplement 11)

The physics package according to supplement 10, wherein the series of coils is of an increasing type where the number of turns is greater on a downstream side than on an upstream side of the atom beam, and the flange is provided on the downstream side of the bobbin.

(Supplement 12)

The physics package according to supplement 11, wherein the vacuum chamber is formed to have a substantially cylindrical shape having a central axis in parallel with the beam axis, and the flange is attached to a cylindrical wall on a downstream side of the atom beam in the vacuum chamber, indirectly using a support member.

(Supplement 13)

The physics package according to supplement 12, wherein the flange is formed to have a substantially circular shape, the support member includes a substantially circular ring-shaped supporter that supports an outer edge of the flange, and the substantially circular ring-shaped supporter is provided with a cooling mechanism that flows a liquid coolant through a tube and cools the flange.

(Supplement 14)

The physics package according to supplement 12, wherein the flange is formed to have a substantially sectoral shape being enlarged along a direction including a vertically downward component, the support member includes a substantially U-shaped supporter that supports an outer edge of the flange, and the substantially U-shaped supporter is provided with a cooling mechanism that flows a liquid coolant through a tube and cools the flange.

(Supplement 15)

The physics package according to supplement 10, wherein the bobbin and the flange are made of a metal, and the physics package is provided with a cooling mechanism that directly or indirectly cools the flange.

(Supplement 16)

The physics package according to supplement 10, further including an opposite coil wound around the beam axis at a position apart on a downstream side of the atom beam from the Zeeman slower, wherein the series of coils and the opposite coil form a MOT magnetic field between the series of coils and the opposite coil.

(Supplement 17)

A physics package for an optical lattice clock, the package including the physics package according to supplement 10.

(Supplement 18)

A physics package for an atomic clock, the package including the physics package according to supplement 10.

(Supplement 19)

A physics package for an atom interferometer, the package including the physics package according to supplement 10.

(Supplement 20)

A physics package for a quantum information processing device for atoms or ionized atoms, the package including the physics package according to supplement 10.

(Supplement 21)

A vacuum installation coil, the coil including: a coil that is installed in a vacuum chamber, is wound around a beam axis in which an atom beam flows, and forms a magnetic field caused to have a spatial gradient; and a sealing member that hermetically encloses part or the entirety of the coil.

(Supplement 22)

The vacuum installation coil according to supplement 21, wherein the sealing member is made of a metal.

(Supplement 23)

The vacuum installation coil according to supplement 21, wherein the sealing member includes: a cylindrical shaped bobbin which is provided on an inner peripheral side of the coil and around which the coil is wound; two flanges that are enlarged outer surfaces of the cylinder of the bobbin, and enclose side surfaces of the coil in a direction of the beam axis; and a cover that encloses an outer peripheral side of the coil between the two flanges.

(Supplement 24)

The vacuum installation coil according to supplement 23, wherein the cover encloses at least part of outer peripheries of the two flanges.

(Supplement 25)

The vacuum installation coil according to supplement 23, wherein the cover is in direct contact with part or the entirety of an outer peripheral side of the coil, or in indirect contact therewith via a thermally conductive member inserted into a space enclosed by the sealing member.

(Supplement 26)

The vacuum installation coil according to supplement 21, wherein the number of turns of the coil varies in a direction of the beam axis, and a range enclosed by the sealing member includes a portion having the maximum number of turns in the coil.

(Supplement 27)

The vacuum installation coil according to supplement 21, wherein a space enclosed by the sealing member is kept more rarefied than an atmosphere.

(Supplement 28)

The vacuum installation coil according to supplement 21, wherein an inert gas is enclosed in a space enclosed by the sealing member.

(Supplement 29)

The vacuum installation coil according to supplement 21, wherein a space enclosed by the sealing member is filled with a foamed resin.

(Supplement 30)

The vacuum installation coil for an optical lattice clock according to supplement 21, wherein the sealing member includes a vacuum-resistant connector, and wherein a portion of the coil hermetically enclosed by the sealing member and a not enclosed portion are electrically connected through the vacuum-resistant connector.

(Supplement 31)

A physics package, including: the vacuum installation coil according to supplement 21; and the vacuum chamber.

(Supplement 32)

The physics package according to supplement 31, wherein the coil is a decreasing type coil having a relatively small number of turns on a downstream side of the atom beam, the physics package includes an opposite coil wound around the beam axis at a position apart on a downstream side of the atom beam from the decreasing type coil, the decreasing type coil and the opposite coil form a gradient magnetic field for a MOT device between the decreasing type coil and the opposite coil, and the sealing member hermetically encloses a portion including a furthest upstream side of the beam axis in the coil, and does not enclose a portion including a furthest downstream side.

(Supplement 33)

The physics package according to supplement 31, wherein the coil is an increasing type coil having a relatively large number of turns on a downstream side of the atom beam, the physics package includes an opposite coil wound around the beam axis at a position apart on a downstream side of the atom beam from the increasing type coil, the increasing type coil and the opposite coil form a gradient magnetic field for a MOT device between the increasing type coil and the opposite coil, and the sealing member hermetically encloses a portion including a furthest downstream side of the beam axis in the coil.

(Supplement 34)

A physics package for an optical lattice clock, the package including the physics package according to supplement 31.

(Supplement 35)

A physics package for an atomic clock, the package including the physics package according to supplement 31.

(Supplement 36)

A physics package for an atom interferometer, the package including the physics package according to supplement 31.

(Supplement 37)

A physics package for a quantum information processing device for atoms or ionized atoms, the package including the physics package according to supplement 31.

(Supplement 38)

A sealing member sealing a coil that is installed in a vacuum chamber, is wound around a beam axis in which an atom beam flows, and forms a magnetic field caused to have a spatial gradient, wherein an area between the sealing member and the coil side is sealed with indium formed to have a ring sheet shape or thick shape, and hermetically encloses part or the entirety of the coil.

REFERENCE SIGNS LIST

10 optical lattice clock, 12 physics package, 14 optical system device, 16 control device, 18 PC, 20 vacuum chamber, 22 main body, 24 cylindrical wall, 26 front circular wall, 28 rear circular wall, 30 protruding portion, 32 cylindrical wall, 34 front circular wall, 38 leg, 40 atomic oven, 42 atom beam, 44 coil for Zeeman slower, **44*a* flange, 46 optical resonator, 48 coil for MOT device, 48*a* flange, 50 capture space, 52 clock transition space, 54 cryostat reservoir, 56 thermal link member, 58 refrigerator, 58*a* Peltier element, 58*b* radiator plate, 58*c* heat-insulating member, 58*d*, 58*e* permalloy magnetic field shield, 60 vacuum pump main body, 62 vacuum pump cartridge, 64, 66 vacuum-resistant optical window for optical lattice, 68 vacuum-resistant optical window for MOT light, 70, 72 vacuum-resistant optical window for MOT light, 74, 76 optical mirror, 80 optical lattice optical beam, 82 Zeeman slower optical beam, 84, 86, 86*a*, 86*b* MOT optical beam, 90 cooler for atomic oven, 92 cooler for Zeeman slower, 94 cooler for MOT device, 96 triaxial magnetic field correction coil, 98 vacuum-resistant electric connector, 102 individual magnetic field compensation coil for refrigerator, 104 individual magnetic field compensation coil for atomic oven, 120 first coil group, 122, 124 coil, 130 second coil group, 132, 134 coil, 136, 138 arrow, 140 first coil group, 142 composite coil, 143, 144 Coil, 145 composite coil, 146, 147 coil, 150 second coil group, 152, 154 coil, 160 first coil group, 162 composite coil, 163, 164 coil, 165 composite coil, 166, 167 coil, 170 second coil group, 172, 174 coil, 180 holder, 182, 184, 186 frame, 190 correction coil, 192 current path, 194 insulator, 196 wiring path, 198 terminal connector, 199 boundary portion, 200, 202, 203, 204, 206, 208 current path, 210 correction coil, 212, 214 current path, 218 physics package, 220 vacuum chamber, 222 main body, 224, 230 triaxial magnetic field correction coil, 240 atom population, 242 correction space, 243 fluorescent observation space, 244 fluorescent light, 246 optical receiver, 250 atom population, 252*a*, 252*b*, 252*c*, 252*d*, 252*e* fluorescent light, 254 CCD camera, 260 temperature sensor, 262 control device, 264 temperature sensor, 266 current path, 268 current path, 270 stray magnetic field, 272 compensation magnetic field, 280 bobbin, 282 coil, 284 Zeeman coil portion, 286 MOT coil portion, 288 upstream flange, 290, 292 downstream flange, 300 bobbin, 302 MOT coil, 304, 306 flange, 312 upper support member, 314 lower support member, 320 Zeeman coil, 322 portion, 330 Zeeman coil, 332 portion, 340 coil for Zeeman slower, 342 coil, 344 Zeeman coil portion, 346 MOT coil portion, 350, 352, 354 flange, 370 circular ring supporter, 372 water-cooling tube, 374, 376 beam, 380 coil for MOT device, 390 coil for Zeeman slower, 392 coil, 394, 396, 398 flange, 400 semicircular ring supporter, 402 water-cooling tube, 410 coil for Zeeman slower, 412 bobbin, 414 coil, 420 coil for Zeeman slower, 422 bobbin, 424, 426 flange, 428, 430 sealing member, 432 hermetic connector, 434, 436 coil, 440** cover.

The invention claimed is:

1. A physics package for an optical lattice clock, the physics package comprising:

a Magneto-Optical Trap (MOT) device that is arranged along a beam axis of an atom beam, and captures an atom population;

an optical lattice formation portion that forms an optical lattice using incident optical lattice light, confines the atom population captured by the MOT device in the optical lattice, and moves the atom population to a clock transition space for prompting clock transition along a movement axis perpendicular to the beam axis; and a vacuum chamber that comprises a cylindrical-shaped or prism-shaped main body that encloses the MOT device and the optical lattice formation portion, wherein a central axis of the vacuum chamber passes through the clock transition space, and is configured parallel with the beam axis, being spaced apart from the beam axis by a finite, non-zero distance, wherein the vacuum chamber comprises a protruding portion that protrudes from the main body along the beam axis, and the physics package further comprises a slower that decelerates the atom population, on an upstream side of the MOT device on the beam axis, and the slower is arranged astride the main body and the protruding portion, and the slower comprises magnetic coils.

2. The physics package for the optical lattice clock according to claim 1, wherein in the MOT device, MOT light is emitted in both directions of each of three axes that comprise the beam axis and two axes that are perpendicular to the beam axis and are different from the movement axis.

3. The physics package for the optical lattice clock according to claim 2, wherein at the slower, deceleration light is emitted upstream along the beam axis, and the main body comprises: a pair of first vacuum-resistant optical windows that allow passage of the MOT light and the deceleration light along the beam axis; and a pair of second vacuum-resistant optical windows that allow passage of the MOT light along the two axes.

4. The physics package for the optical lattice clock according to claim 1, further comprising a vacuum pump cartridge that vacuumizes the vacuum chamber, wherein the vacuum pump cartridge is arranged in the main body so as to be lined up with the slower but is decentered in a direction different from a direction of the slower.

5. The physics package for the optical lattice clock according to claim 1, wherein the cylindrical-shaped or prism-shaped main body is formed to have a quadrilateral prism shape, a hexagonal prism shape, a octagonal prism shape, or a cylindrical shape.

* * * * *